(12) United States Patent
Yamashita et al.

(10) Patent No.: US 6,218,017 B1
(45) Date of Patent: Apr. 17, 2001

(54) LAMINATED STRUCTURE, COVERING STRUCTURE AND POUCH

(75) Inventors: Rikiya Yamashita; Hiroshi Matsuzaki; Takuya Yamazaki, all of Shinjuku-ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 08/945,236

(22) PCT Filed: Feb. 10, 1997

(86) PCT No.: PCT/JP97/00349

§ 371 Date: Sep. 30, 1997

§ 102(e) Date: Sep. 30, 1997

(87) PCT Pub. No.: WO97/28963

PCT Pub. Date: Aug. 14, 1997

(30) Foreign Application Priority Data

Feb. 9, 1996 (JP) .................................................. 8-046907

(51) Int. Cl.[7] ...................................................... B32B 27/00

(52) U.S. Cl. ........................ 428/424.2; 428/458; 428/461; 428/480; 428/483; 428/500

(58) Field of Search .................................. 428/424.2, 458, 428/461, 480, 483, 500

(56) References Cited

U.S. PATENT DOCUMENTS 4,156,751 * 5/1979 Yenni, Jr. et al. .................... 428/212

FOREIGN PATENT DOCUMENTS 53-88953   8/1978 (JP) .
04311464 * 11/1992 (JP) .

* cited by examiner

*Primary Examiner*—Helen L. Pezzuto

(57) ABSTRACT

A laminated structure (1) has a heat sealant layer (2), an antistatic layer (3) of a bisammonium organic sulfur semiconductor formed on one surface of the heat sealant layer (2). An oriented resin layer (14) is formed on the other surface of the heat sealant layer (2). The laminated structure (1) is adhered to a container with a side thereof on the side of the antistatic layer (3) to the container.

53 Claims, 11 Drawing Sheets

LAMINATED STRUCTURE, COVERING STRUCTURE AND POUCH

TECHNICAL FIELD

The present invention relates to laminated structures, covering structures formed by processing the laminated structures, and pouches formed by processing the laminated structures. More particularly, the present invention relates to antistatic laminated structures, covering structures, and pouches for use as synthetic resin containers for containing semiconductor devices, IC devices, apparatus employing those devices, liquid crystal display parts, liquid crystal devices, medical articles including syringes and medical supplies, automotive parts and the like.

BACKGROUND ART

Various parts, solid or liquid foods have been contained in synthetic resin containers and sealed therein with covers closing the openings of the synthetic resin containers, and sealed in pouches for distribution and storage.

For example, there has been used an embossed carrier tape provided with a plurality of blisters formed by embossing, and sealing electronic parts in the blisters by heat-sealing a cover tape to the carrier tape so as to cover the blisters. Generally, a carrier tape for forming such an embossed carrier tape is formed of a material easy to mold in a sheet, such as a polyvinyl chloride, a polystyrene, a polyester, a polycarbonate or the like. The cover tape is a multilayer tape consisting of a biaxially oriented film and a heat sealant layer formed on one of the surfaces of the biaxially oriented film. The cover tape must be peeled from the carrier tape to take out electronic parts from the blisters of the embossed carrier tape when using the electronic parts in an electronic part mounting process.

There is a possibility that the electronic parts are deteriorated or damaged by static electricity generated by friction between the electronic parts contained in the embossed carrier tape, and the blisters or the cover tape, and static electricity generated when peeling off the cover tape. Therefore, the carrier tape and the cover tape needs means for preventing the electronic parts being deteriorated or damaged.

Conductive carbon particles, conductive powder of a metal oxide or the like or metal particles are dispersed in the carrier tape or the carrier tape is coated with such a conductive material as a means for preventing the generation of static electricity in the carrier tape. The heat sealant layer, which comes into direct contact with the electronic parts, is formed of a material containing an antistatic agent, such as a surface active agent, conductive powder of a metal oxide, conductive carbon particles or metal particles, or the heat sealant layer is coated with such a conductive material. A material containing a fine powder of conductive metal oxide, such as tin oxide or zinc oxide, is relatively transparent and is often used for forming the heat sealant layer.

However, the cover tape must be bonded to the carrier tape by heat-sealing with a predetermined bonding strength in order to prevent the separation of the cover tape from the embossed carrier tape during transportation and storage, and the resultant falling off of the electronic parts from the embossed carrier tape. If the heat-bonding strength is excessively high and the range of variation of the heat-bonding strength (the difference between a maximum and a minimum adhesive strength of the cover tape and the carrier tape, which will be referred to as "zip-up") is excessively wide, the carrier tape vibrates and ejects the electronic parts from the blisters of the carrier tape in an electronic part mounting process. Accordingly, it is desired that the cover tape is bonded to the carrier tape with a sufficient adhesive strength and the zip-up in the adhesive strength is small when taking out the electronic parts from the blisters. However, the zip-up of a conventional cover tape provided with a heat sealant layer containing conductive particles or the like cannot be reduced.

Although a cover tape provided with a heat sealant layer containing conductive powder of metal oxide has a relatively high degree of transparency, it is difficult to disperse the conductive powder when forming the heat sealant layer, and an advanced dispersing technique is required for forming the heat sealant layer in a transparency that enables the visual inspection of the electronic parts, which increases manufacturing costs.

If a surface active agent is applied to the cover tape, the surface condition of the heat sealant layer changes, and the sealing performance of the heat sealant layer becomes unstable causing faulty sealing. Since the static eliminating effect is greatly dependent on the temperature and the moisture of the storage environment, stable antistatic effect cannot be expected.

DISCLOSURE OF THE INVENTION

The present invention has been made in view of those problems and it is therefore an object of the present invention to provide a laminated structure having an excellent antistatic characteristic, a cover tape having excellent properties to be attached to and peeled from a synthetic resin container and excellent electrostatic characteristics, and a pouch having a high adhesive property and excellent electrostatic characteristics.

With the foregoing object in view, according to a first aspect of the present invention, a laminated structure comprises a heat sealant layer, and an antistatic layer formed on one surface of the heat sealant layer. The antistatic layer contains, as a principal component, a bisammonium organic sulfur semiconductor.

A covering structure in accordance with the present invention is formed by processing a laminated structure obtained by forming oriented resin layers on the surface of the heat sealant layer provided with the antistatic layer of the foregoing laminated structure, and the other surface of the heat sealant layer of the same laminated structure, respectively. The surface of the heat sealant layer provided with the antistatic layer is bonded to a synthetic resin container by heat-sealing.

A pouch in accordance with the present invention is formed by processing the laminated structure obtained by forming oriented resin layers on the surface of the heat sealant layer provided with the antistatic layer of the foregoing laminated structure, and the other surface of the heat sealant layer of the same laminated structure, respectively. The surface of the heat sealant layer provided with the antistatic layer forms the inner surface of the pouch.

The antistatic layer formed on one surface of the heat sealant layer of the laminated structure is formed of a material containing a bisammonium organic sulfur semiconductor as a principal component. Since the bisammonium organic sulfur semiconductor has a satisfactory antistatic property and the antistatic effect of the bisammonium organic sulfur semiconductor is independent of humidity, the laminated structure has an antistatic characteristic. Since the bisammonium organic sulfur semiconductor is transparent and colorless, and does not affect the heat-sealing property of the heat sealant layer, the covering structure formed by processing the laminated structure obtained by forming oriented resin layers on the surface of the heat sealant layer provided with the antistatic layer of the foregoing laminated structure, and the other surface of the heat sealant layer of the same laminated structure, respectively, has excellent electrostatic characteristics and good ability to make the contents visible. When the surface of the heat sealant layer provided with the antistatic layer of the covering structure is bonded to a synthetic resin container by heat-sealing, the oriented resin layer and the heat sealant layer can be separated from each other or the heat sealant layer is subject to cohesive failure. Therefore, the covering structure can stably and surely be peeled off regardless of heat-sealing strength. The pouch formed by processing the laminated structure obtained by forming the oriented resin layers on the surface of the heat sealant layer provided with the antistatic layer of the foregoing laminated structure, and the other surface of the heat sealant layer of the same laminated structure, respectively, has excellent electrostatic characteristics and a good ability to make the contents visible.

According to a second aspect of the present invention, a laminated structure comprises a heat-resistant base layer, an adhesive layer formed on the heat-resistant base layer, an intermediate layer formed on the adhesive layer, and a heat sealant layer formed on the intermediate layer. The laminated structure has an initial impact strength P as measured by a loop stiffness test method in the range of 5 g to 20 g, and a stiffness f not higher than the initial impact strength P and meeting expressions: $f=-at+b$, where a and b are constants; $0 \leq a \leq 0.1$, and t ($t \leq 3$ min) is time elapsed after the start of measurement of stiffness f.

In the laminated structure of the present invention the adhesive layer is a layer of a two-part adhesive, in which the mixing ratio between a resin and an accelerator is 100:10 to 100:70.

The laminated structure of the present invention is provided with an antistatic layer formed on a surface of the heat sealant layer opposite a surface of the same on which the intermediate layer is formed, and the antistatic layer is formed of a material containing a bisammonium organic sulfur semiconductor as a principal component.

In the laminated structure of the present invention, the heat-resistant base layer is a laminated layer consisting of two or more layers.

In the laminated structure of the present invention, at least one of the component layers is formed of a material containing 1 to 300 parts by weight of inorganic particles per 100 parts by weight of a resin, or at least one of the component layers is formed of a material containing 1 to 300 parts by weight of fine organic particles or spherical organic beads of at least one of an acrylic resin, a polyolefin resin, polystyrene resin and a polyester resin per 100 parts by weight of a resin.

The covering structure of the present invention is formed by processing the foregoing laminated structure, and the heat sealant layer or the antistatic layer is bonded to a synthetic resin container by heat-sealing.

The laminated structure of the present invention has an initial impact strength P in the range of 5 g to 20 g, and a stiffness f changing at a low rate as expressed by Expression (1). Therefore, the laminated structure has a high stiffness, and the covering structure formed by processing the laminated structure and bonded to a synthetic resin container by heat-sealing can be peeled from the synthetic resin container by causing the separation of the intermediate layer and the heat sealant layer from each other or the internal breakage of the heat sealant layer. Thus, the covering structure has a small zip-up, i.e., the difference between a maximum and a minimum adhesive strength of the covering structure and the synthetic resin container which are bonded together by heat-sealing, and a stable peeling property.

It is considered that the zip-up is produced by either of the two following mechanisms.

① The covering structure and the synthetic resin container are stretched differently when a tensile force is applied thereto by a peeling action.

While the covering structure is being peeled from the synthetic resin container at a fixed peeling rate, the covering structure or the synthetic resin container is stretched in a direction in which the covering structure is pulled for peeling. Even if the covering structure bonded to the synthetic resin container has a fixed adhesive strength, it is possible that the mode of elongation of the covering structure is affected by the construction of the covering structure and the shape of the synthetic resin container, and portions of the covering structure are elongated at different elongations, respectively, when the covering structure is peeled from the synthetic resin container. When a portion of the covering structure is peeled at a small elongation subsequently to the peeling of a portion of the same at a large elongation, peeling force decreases due to the relaxation of the elongated portion. When a portion of the covering structure is peeled at a large elongation subsequently to the peeling of a portion of the same at a small elongation, peeling force increases due to the further extension of the elongated portion. If such phenomena occur successively, the peeling force increases and decreases repeatedly, and becomes unstable and, consequently, the zip-up increases.

② Peeling force acting in the peeling direction is not fixed.

If the covering structure has not evenly been bonded to the synthetic resin container by heat-sealing due to the influence of mechanical accuracy and the environment on heat-sealing conditions including temperature, pressure and time or due to inferior accuracy of the covering structure and the synthetic resin container, the peeling force is variable and the zip-up increases. A residual stress is induced in the covering structure during a heat-sealing process by the thermal expansion and thermal contraction of the component layers of the covering structure, and the residual stress is relieved while the covering structure is being peeled off. However, force necessary for relieving the residual stress affects the peeling force and causes the peeling force to vary, so that the zip-up increases.

③ Behavior of the covering structure varies during a peeling operation.

When peeling the covering structure from the synthetic resin container at a fixed peeling rate in a direction at a fixed angle to the synthetic resin container, a portion of the covering structure near a separation starting position where the covering structure separates from the synthetic resin container is curved in a curve of a radius of curvature. In some cases, the size of the curved portion of the covering structure is caused to change by contact between the covering structure and the synthetic resin container at the separation starting position even if the peeling force is constant. In such a case, a force to lift up the covering structure from the synthetic resin container in a direction perpendicular to the covering structure acts on a portion of the covering structure in contact with the synthetic resin container at the separation starting position. Consequently, the curved shape is enlarged, and an effective peeling force decreases because the peeling force is decomposed into a force to lift up the covering structure and a pulling force. If the covering structure and the synthetic resin container are not in contact with each other, any lifting force does not act on the covering structure; therefore, the curved shape is small and all the peeling force acts effectively. If these cases occur successively, the peeling force increases and decreases repeatedly, i.e., the peeling force fluctuates, and the zip-up increases. Contact between the carrier tape and the covering structure at the separation starting position occurs in a portion of the carrier tape between the adjacent blisters.

It is effective in eliminating the zip-up producing mechanism ① to fix the elongations of the covering structure and the synthetic resin container, particularly, the elongation of the covering structure. If the covering structure has a small thickness, the tensile strength of the covering structure is relatively low and hence it is difficult to fix the elongation of the covering structure. Therefore, the peeling force can be stabilized by absorbing the fluctuation of the peeling force by the variation of the elongation, i.e., by the effective use of the vibration absorbing springy behavior of the covering structure. The zip-up producing mechanism ③ can be eliminated by the stabilization of the peeling force by reducing the change of the curved shape that occurs when the covering structure comes into contact with the synthetic resin container and a lifting force acts on the covering structure, i.e., (1) by enlarging the curved shape and (2) by absorbing the change of the curved shape by a springy behavior in response to the lifting force. The enhancement of the stiffness of the covering structure is effective in eliminating those zip-up producing mechanisms. Since the laminated structure (covering structure) of the present invention has a high stiffness as mentioned above, the zip-up can be reduced.

The zip-up producing mechanism ② can be eliminated by the capability of the covering structure as bonded to the synthetic resin container by heat-sealing, of being delaminated between the intermediate layer and the heat sealant layer or of being delaminated by the internal breakage of the heat sealant layer due to cohesive failure.

According to a third aspect of the present invention, a cover tape capable of being bonded to a carrier tape by heat-sealing is formed by sequentially laminating a composite base sheet formed by bonding together two or more oriented films with an adhesive layer, an intermediate layer, a heat sealant layer, and an antistatic layer containing a bisammonium organic sulfur semiconductor as a principal component in that order.

The adhesive layer for bonding together the oriented films is a layer of a polyester resin, a polyether resin, a urethane resin, an ethylene-vinyl acetate copolymer, an acrylic resin, an epoxy resin or a modified resin produced by modifying any one of those resins.

According to a fourth aspect of the present invention, a cover tape capable of being bonded to a carrier tape by heat-sealing is formed by sequentially laminating a biaxially oriented film, an intermediate layer bonded to the biaxially oriented film with an adhesive layer, a heat sealant layer and an antistatic layer containing a bisammonium organic sulfur semiconductor for eliminating static electricity generated in the cover tape in that order.

The adhesive layer bonding together the biaxially oriented film and the intermediate layer is a polyester resin, a polyether resin, a polyether resin, a urethane resin, an ethylene-vinyl acetate copolymer, an acrylic resin, an epoxy resin or a resin obtained by hardening a modified resin produced by modifying any one of those resins with an isocyanate or an amine. The mixing ratio between the principal component and the hardening agent is in the range of 100:10 to 100:70, and the thickness of the adhesive layer is in the range of 5 to 80 $\mu$m.

In this cover tape, the thickness of the biaxially oriented film is in the range of 12 to 50 $\mu$m, and that of the intermediate layer is in the range of 10 to 100 $\mu$m.

The cover tape has an initial impact strength as measured by a loop stiffness test method in the range of 4 to 50 g, and the stiffness f (g) of the cover tape meets an expression: f=−at+b, where a and b are constants, t is time (variable), $0.001 \leq a \leq 0.5$ and $4 \leq b \leq 50$.

The difference between a maximum and a minimum adhesive strength of the cove tape and the carrier tape which are bonded together by heat-sealing, i.e., the zip-up, is 30 g or below.

BEST MODE FOR CARRYING OUT THE INVENTION

First Embodiment

A first embodiment of the present invention will be described hereinafter with reference to the accompanying drawings.

Figure 1:
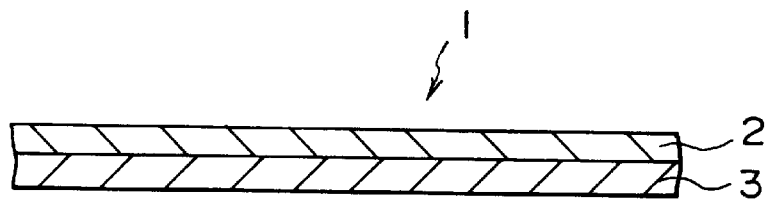
FIG. 1 is a typical sectional view of a laminated structure in a first embodiment according to the present invention.

FIG. 1 shows a laminated structure 1 according to the present invention in a typical sectional view. The laminated structure 1 comprises a heat sealant layer 2 and an antistatic layer 3 formed on one of the surfaces of the heat sealant layer 2.

Figure 2:
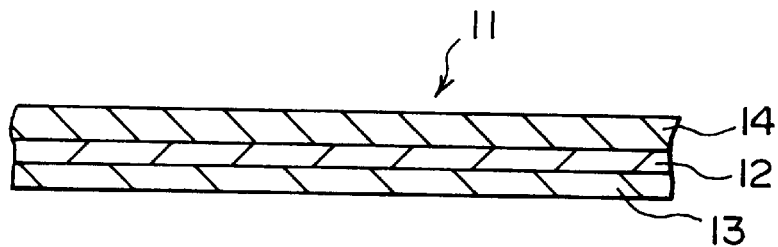
FIG. 2 is a typical sectional view of a laminated structure in a modification of the laminated structure of FIG. 1.

FIG. 2 shows a laminated structure 11 according to the present invention in a typical sectional view. The laminated structure 11 comprises a heat sealant layer 12, an antistatic layer 13 formed on one of the surfaces of the heat sealant layer 12, and a oriented resin layer 14 formed on the other surface of the heat sealant layer 12.

Figure 3:
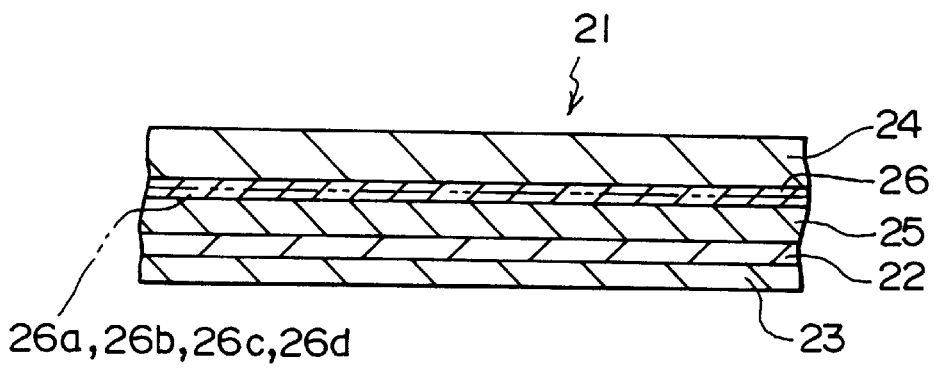
FIG. 3 is a typical sectional view of a laminated structure in a modification of the laminated structure of FIG. 1.

FIG. 3 shows a laminated structure 21 according to the present invention in a typical sectional view. The laminated structure 21 comprises a heat sealant layer 22, an antistatic layer 23 formed on one of the surfaces of the heat sealant layer 22, an intermediate layer 25 formed on the other surface of the heat sealant layer 22, an adhesive layer formed on the surface of the intermediate layer 25 and a oriented resin layer 24 formed on the adhesive layer 26.

The laminated structures 11 and. 21 are used for forming a covering structure according to the present invention or a pouch according to the present invention, which will be described later.

The heat sealant layers 2, 12 and 22 of the laminated structures of the present invention may be formed of a hot-melt adhesive, such as an ethylene-vinyl acetate-acrylate copolymer, an olefin resin, an elastomer (a styrene-butadiene-styrene block copolymer, a styrene-isobutylene-styrene block copolymer or a styrene-ethylene-butylene-styrene block copolymer), a polyamide resin, a polyester resin, a polyester copolymer or a polyurethane resin, one of thermoplastic resins and thermoplastic elastomers tabulated in Tables 1-1 to 1-3, or a combination of some of the thermoplastic resins and thermoplastic elastomers tabulated in Tables 1-1 to 1-3.

TABLE 1-1

Table 1-1 Thermoplastic Resins

| | |
|---|---|
| Low-, medium-, high-density polyethylene | Polyolefin group |
| Isotactic polyethylene | |
| Ethylene-propylene copolymer | |
| Polybutene-1 | |
| Ethylene-butene-1 copolymer | |
| Propylene-butene-1 copolymer | |
| Ethylene-propylene-diene copolymer | |
| Ethylene propylene-butene-1 copolymer | |
| Ethylene-vinyl acetate copolymer | |
| Ionic crosslinked olefin copolymer (ionomer) | |
| Polymethylpentene | |
| Polyvinyl alcohol | |
| Ultra-high-molecular-weight polyethylene | |
| High-impact polystyrene | Styrene group |
| Polystyrene | |
| Styrene-butadiene copolymer | |
| Styrene-isoprene copolymer | |
| Acrylonitrile-butadiene-styrene (ABS) resin | |
| Acrylonitrile styrene (AS) resin | |
| Polyethylene terephthalate | Polyester group |
| Polytetramethylene terephthalate | |
| Polyethylene naphthalate | |
| Polybutylene terephthalate | |
| Polybutylene naphthalate | |
| Polyvinyl chloride | Chlor-containing resins |
| Polyvinylidene chloride | |
| Propylene vinyl chloride copolymer | |
| Chlorinated vinyl chloride | |
| Tetrafluoroethylene | Fluorinated resins |
| Trifluoroethylene | |
| Polyvinylidene fluoride | |
| Polyvinyl fluoride | |
| Nylon 6 | Polyamide group |
| Nylon 6,6 | |
| Nylon 6/6,6 copolymer | |
| Meta-xylilene adipamide | |
| Nylon 6,11 | |
| Nylon 11 | |
| Nylon 12 | |
| Nylon 13 | |
| Polyamidimide | Polyimide group |
| Polyether imide | |

TABLE 1-2

Thermoplastic Resins

| | |
|---|---|
| Ethylene-ethyl acrylate copolymer | Ethylene copolymer |
| Ethylene-acrylate copolymer | |
| Ethylene-methacrylate copolymer | |
| Ethylene-methyl methacrylate copolymer | |
| Ethylene-methyl acrylate copolymer | |
| Polyacrylonitrile | Gas barrier resins |
| Ethylene-vinyl alcohol copolymer saponificate | |
| Polyacrylic acid | Hygroscopic resins |
| Polyacrylamide | |
| Polyvinyl pyrrolidone | |
| Polyvinyl methyl ether | |
| Vinyl alcohol acrylate copolymer | |
| Ethylene-acrylate copolymer | Adhesive resins |
| Ionic crosslinked olefin copolymer | |
| Maleic anhydride graft polyethylene | |
| Maleic anhydride graft polypropylene | |
| Acrylic acid graft polyolefin | |
| Ethylene-vinyl acetate copolymer | |
| Copolymerized polyester | |
| Copolymerized polyamide | |
| Polyacetal | Engineering plastics |
| Polyether sulphon (Sulphon) | |
| Polyphenylene sulfide (Sulfide) | |
| Polyphenylene oxide | |
| Polyether-ether ketone | |

TABLE 1-2-continued

Thermoplastic Resins

Alamide
Liquid crystal polymer
Polycarbonate
Polymethyl methacrylate
Polymethyl methacrylate-styrene carbonate
Polymethyl methacrylate
Polyarylate
Polyurethane

TABLE 1-2-continued

Thermoplastic Resins

Foamed, crosslinked and hydrogenated materials and elastomer consisting of some of foregoing resins.
Cellulose           Natural polymer group
Ethyl cellulose
Cellulose acetate
Cellulose propionate
Cellulose nitrate

TABLE 1-3(1)

Table 1-3(1) Thermoplastic Elastomers

| Hard segment | Soft segment | Structure |
|---|---|---|
| Styrene group | | |
| Polystyrene (S) | Polybutadiene (B) SBS | A |
|  | Polyisoprene (I) SIS | B |
|  | Polyethylene-polybutylene (EB) SEBS | |
|  | Polyethylene-propylene (EP) SEPS | C |
|  | (SEBS: SBS hydrogenation, SEPS: SIS hydrogenation) | |
| Vinyl chloride group | | |
| Polyvinyl chloride | Polyvinyl chloride | D |
|  | Nitrile rubber (NBR) alloy | |
|  | Urethane copolymer or alloy | |
|  | Polyester alloy | |
| Olefin group | | |
| Polyethylene | Ethylene-propylene copolymer | D |
| Polypropylene | Butyl rubber | |
|  | Ethylene-vinyl acetate copolymer (EVA) | |
|  | Ethylene-ethyl acrylate copolymer (EEA) | |
|  | Ethylene-glycidyl methacrylate copolymer (EGMA) | |
|  | Nitrile rubber (NBR) | |
|  | Acrylic rubber (AR) | |
| Polyester group | | |
| Polyester)Polybutylene terephthalate) | Aliphatic polyether | C |
|  | Condensate of polytetramethylene glycol and tere phthalic acid (PIMEGT) | |
|  | Aliphatic polyester | |
|  | Block copolymer of polycaprola ctone | |
| Polyamide group | | |
| Polyamide | Polyether | C |
| Polyamide 6 | Polyethylene glycol (PEG) | |
| Polyamide 66 | Polypropylene glycol (PPG) | |
| Polyamide 610 | Polytetramethylene glycol (0TMG) | |
| Polyamide 612 | Polyester | |
| Polyamide 11 | | |
| Polyamide 12 | | |
| Polyurethane group | | |
| Polyurethane | Polycarbonate polyol | C |
|  | Ether polyol | |
|  | Caprolactone polyester | |
|  | Adipate polyester | |
|  | Carbonate group | |

TABLE 1-3(2)

Table 1-3(2) Thermoplastic Elastomers

| Hard segment | Soft segment | Structure |
|---|---|---|
| Others | | |
| Syndio-1,2-polybutadiene | Atactic-1,2 polybutadiene | C |
| Polyethylene ionic cluster (Ionomer) | 11 Isobutene-isoprene copolymer resin | E |
| | Amorphous polyethylene | F |
| Trans-polyisoprene | Amorphous polyisoprene | C |
| Fluorine plastics | Fluoride rubber | A,E |
| Polyethylene | Natural rubber | D |
| Polypropylene | Natural rubber | D |

Structural model
A: Triblock copolymer
B: Star polymer
C: Multiblock polymer
D: Resin/rubber blend partial crosslinking
E: Graft copolymer
F: Ionic crosslinked The heat sealant layers 2, 12 and 22 may be formed of one of the following pressure sensitive adhesives or a combination of some of those pressure sensitive adhesives.

Pressure Sensitive Adhesives

Rubbers

Natural rubber, styrene-butadiene adhesives, polyisobutylene adhesives and isoprene adhesives Acrylic Resins Silicone Resins Emulsions Acrylic emulsions, natural rubber latex, styrene-butadiene latex Hot-Melt Resins Styrene-isoprene block copolymers, ethylene-butadiene block copolymers, styrene-ethylene-butylene block copolymers, and ethylene-vinyl acetate thermoplastic elastomers Water-soluble Polymers Polyvinyl alcohol polymers, polyacrylamide polymers, polyvinyl methyl ether polymers, polymers containing polyacrylic acid, dextrin, polyvinyl pyrrolidones Preferably, the heat sealant layers 2, 12 and 22 are formed of at least one of thermoplastic resins, such as a polyurethane resin, a polyester resin, a polyvinyl-vinyl acetate copolymer, an acrylic resin and an ethylene-vinyl acetate copolymer. Possible combinations of two or more thermoplastic resins are, for example, a mixture of a polyurethane resin and a vinyl chloride-vinyl acetate copolymer (preferable mixing ratio: 9:1 to 4:6), a mixture of a polyester resin and a vinyl chloride-vinyl acetate copolymer (preferable mixing ratio: 1:1 to 9.5:0.5) and a mixture of an acrylic resin and a vinyl chloride-vinyl acetate copolymer (preferable mixing ratio: 1:1 to 9.5:0.5). If the intermediate layer 25 is formed of a linear saturated polyester resin having a glass transition point of 40° C. or above, which will be described later, it is preferable to use a mixture of a polyurethane resin and a vinyl chloride-vinyl acetate copolymer.

The heat sealant layers 2, 12 and 22 need to have a high thermal bonding strength and a small zip-up. It is preferable to form the heat sealant layers 2, 12 and 22 of a material containing 1 to 200 parts by weight of inorganic fine particles, organic particles or organic spherical beads shown below per 100 parts by weight of a thermoplastic resin. If the content of the particles or the spherical beads is less than 1 part by weight per 100 parts by weight of the resin, the effect of the particles or the spherical beads is insufficient. If the content of the particles or the spherical beads is greater than 200 parts by weight, the transparency of the laminated structure is unsatisfactory. The primary particle size of the inorganic particles, the organic particles and the organic spherical beads is in the range of 0.001 to 200 μm, preferably, in the range of 0.01 to 10 μm. The addition of the inorganic particles, the organic particles or the organic spherical beads to the heat sealant layer reduces the expansion and contraction caused by heat and pressure during a heat-sealing process, so that a residual stress in the thermoplastic resin forming the heat sealant layer is reduced. The strength (shearing strength and tensile elongation) of the film forming the heat sealant layer is lower than that of a film of the thermoplastic resin, and hence the thermal bonding strength is high and the zip-up is small.

The inorganic particles may be any one of $SiO_2$, $Al_2O_3$, $Fe_2O_3$, $ZnO$, $SnO_2$, $CeO_2$, $NiO$, $PbO$, $S_2Cl_2$, $SnCl_2$, $ZnCl_2$, $FeCl_2$, $CaCO_3$, $MgCO_3$, $B_2O_3$, hydrous silicic anhydride, hydrous calcium silicate, hydrous aluminum silicate, aluminum silicate, magnesium silicate, calcium silicate, barium sulfate, lead sulfate, strontium sulfate and aluminum hydroxide, or two or more of those substances. The organic particles and the organic spherical beads may be any one of an acrylic resin, a polyolefin resin, a polystyrene resin and a polyester resin, or two or more of those resins.

The thickness of the heat sealant layers 2, 12 and 22 is in the range of 0.1 to 60 μm, more preferably, in the range of 0.5 to 30 μm. It is difficult to form the heat sealant layer in a thickness less than 0.1 μm. If the thickness of the heat sealant layer is greater than 60 μm, the laminated structure is excessively thick, excessively firm and difficult to handle, increases the amount of heat necessary for heat-sealing a covering structure and a pouch formed by processing the laminated structure, makes high-speed heat-sealing impossible, and reduces productivity.

The heat sealant layers 12 and 22 may be formed by bonding a film to the oriented resin layer or by coating the oriented resin layer with a film of the molten material or a solution prepared by dissolving the material in a solvent.

The antistatic layers 3, 13 and 23 of the laminated structures of the present invention are formed of a material containing a bisammonium organic sulfur semiconductor as a principal component. A material for forming the antistatic layers 3, 13 and 23 is prepared by kneading a mixture of a bisammonium organic sulfur semiconductor and a thermoplastic resin or a thermoplastic elastomer included in the materials tabulated in Tables 1-1 to 1-3 as a binder, by dispersing a bisammonium organic sulfur semiconductor in a molten thermoplastic resin, or by dissolving a bisammonium organic sulfur semiconductor in a solution (water/ isopropyl alcohol), and the antistatic layers 3, 13 and 23 are formed by an extrusion coating process, a melt extrusion coating process, a calender coating process, a roll coating process or a spraying process. In the present invention, the thickness of the antistatic layers is in the range of 0.01 to 30 $\mu$m, more preferably, in the range of 0.05 to 2 $\mu$m.

The bisammonium organic sulfur semiconductor employed in the present invention is a combined substance expressed by a general structural formula:

FORMULA

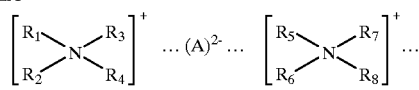

where $R_1$, $R_2$, $R_3$, $R_4$, $R_5$, $R_6$, $R_7$ and $R_8$ are hydrocarbon groups of carbon numbers in the range of 1 to 22, hydroxy-substituted hydrocarbon groups, hydrocarbon groups of carbon numbers in the range of 3 to 30 having two or less amide bonds and/or ester bonds in the group, hydrocarbon groups of carbon numbers in the range of 2 to 30 including an ether oxygen in the middle, 0-hydrocarbon group-substituted 3-oxy-2-hydroxypropyl groups of carbon numbers in the range of 4 to 25, terminal hydroxyl group-substituted polyoxyhydrocarbon groups of carbon numbers in the range of 2 to 122, polyoxyhydrocarbon groups of carbon numbers in the range of 3 to 122, polyoxyhydrocarbon groups of carbon numbers in the range of 4 to 122 combined with terminal hydrocarbon groups by carbonyl groups as combining groups, or residues forming a morpholine ring, a substituted or nonsubstituted pyridine ring of a carbon number in the range of 5 to 8 or a c-hydrocarbon-substituted imidazoline ring of a carbon number in the range of 4 to 24 with a central nitrogen atom and another N-substituted group in an atomic group. $(A)^{2-}$ is $SO_3^{--}$ or $SO_4^{--}$, and at least one of $R_1$, $R_2$, $R^3$, $R_4$, $R^5$, $R_6$, $R_7$ and $R_8$ is a hydrocarbon group of a carbon number of 6 or above or a combination of such hydrocarbon groups.

More specifically, the combined substance may be any one of the following combined substances 1 to 29.

Combined substances 1 to 29 combined substance 1
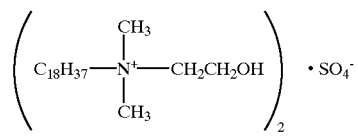

combined substance 2
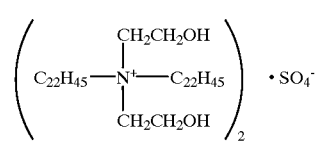

combined substance 3
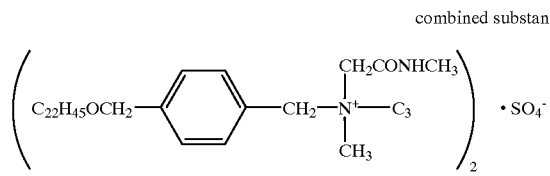

combined substance 4
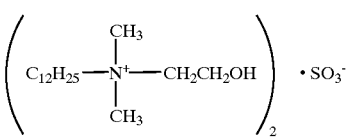

combined substance 5
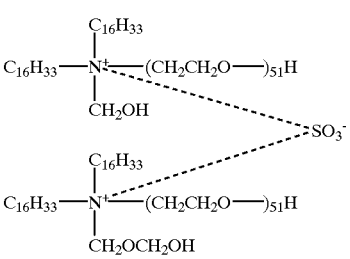

combined substance 6
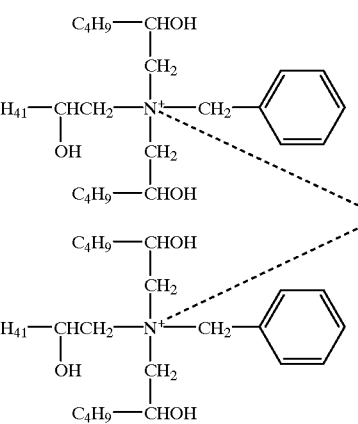

combined substance 7
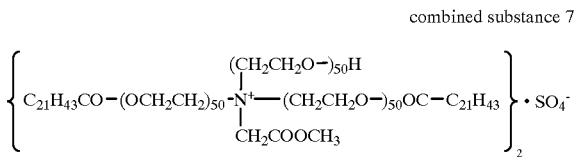

combined substance 8
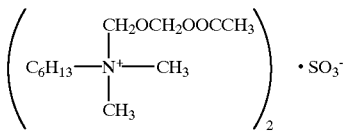

combined substance 9
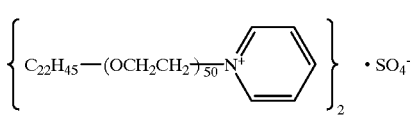

combined substance 10
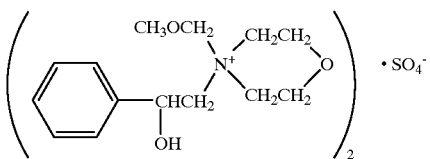

-continued
combined substance 11
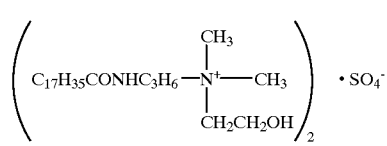
combined substance 12
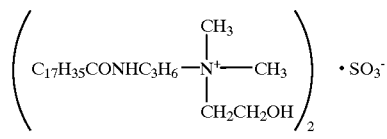
combined substance 13
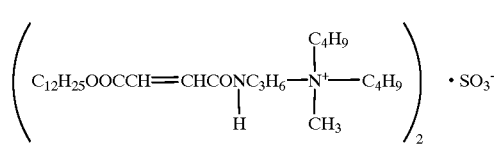
combined substance 14
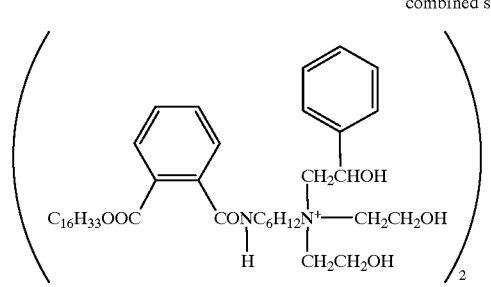
combined substance 15
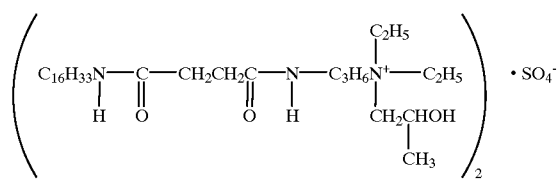
combined substance 16
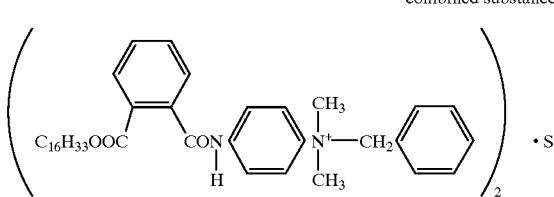
combined substance 17
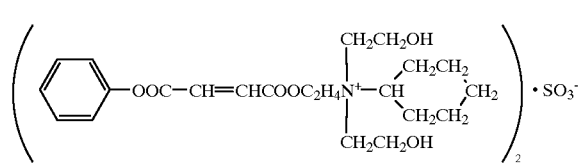
-continued
combined substance 18
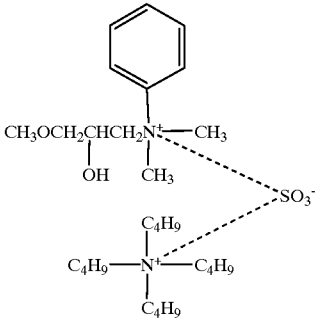
combined substance 19
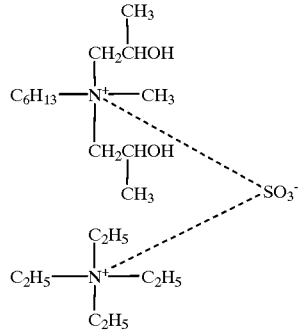
combined substance 20
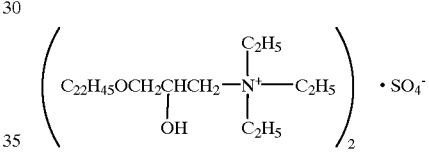
combined substance 21
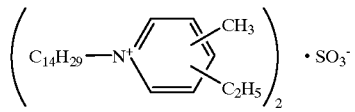
combined substance 22
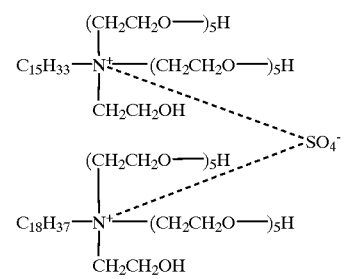
combined substance 23
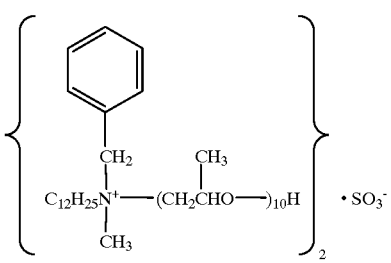

-continued

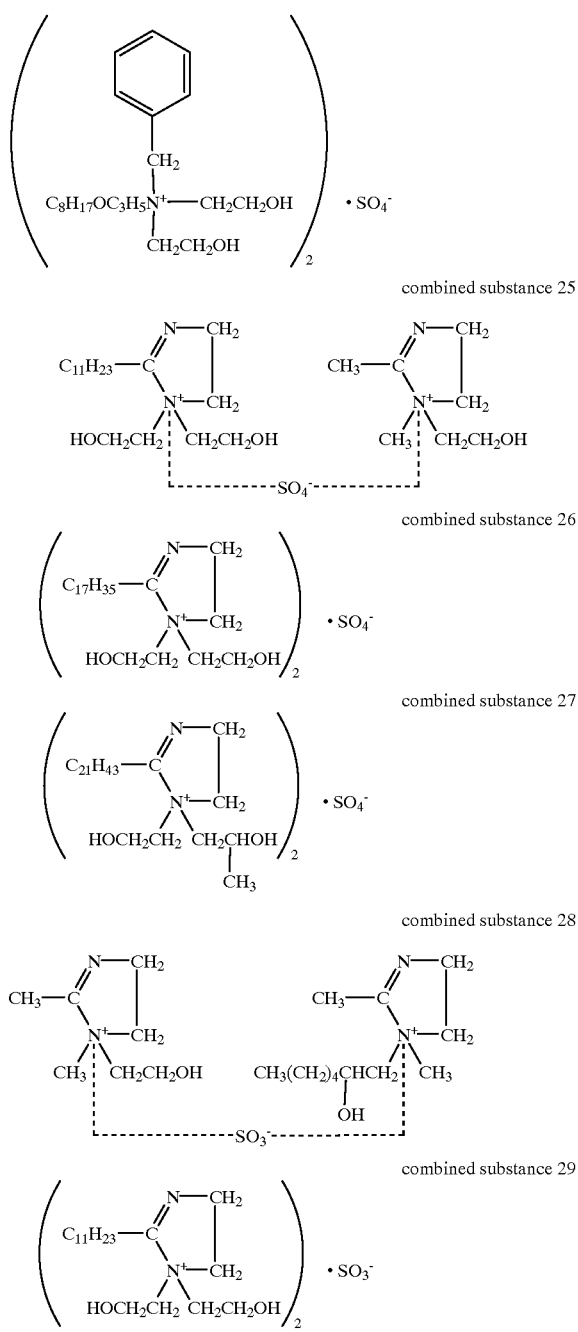

Those antistatic layers have excellent electrostatic characteristics including a surface resistivity in the range of $10^5$ to $10^{12}$ $\Omega/\square$ at 22° C. and 40% RH, and a static decay time of 2 sec or below necessary for reducing a charge of 5000 V by 99% at 23±5° C. and 12±3% RH. Antistatic layers having surface resistivities exceeding $10^{12}$ $\Omega/\square$ scarcely have an antistatic effect and hardly are able to protect electronic parts from electrostatic breakdowns. Antistatic layers having surface resistivities less than $10^5$ $\Omega/\square$ may possibly allow electricity to flow from outside through the cover into electronic parts, causing the electrical breakdown of the electronic parts. Antistatic layers having a static decay time, i.e., an index of the speed of dissipation of static charge, exceeding 2 sec scarcely have a static decaying effect and are hardly able to protect electronic parts from electrostatic breakdown. Surface resistivity and static decay time can be measured by measuring methods specified in MIL-B-81705C of USA.

The antistatic layers may contain additives, such as a dispersion stabilizer and a blocking inhibitor, if necessary.

The oriented resin layers 14 and 24 of the laminated structures (covering structures and pouches) according to the present invention may be uniaxially oriented or biaxially oriented films of one of polyester resins, such as polyethylene terephthalate (PET) and polyethylene naphthalate (PEN), polyolefin resins, such as propylene, polyamides, such as nylon, polycarbonates, polyimides (PIs), polyether sulfon (PES), polyether ether ketone (PEEK), polyether imide (PEI), polyphenylene sulfide (PPS), polyarylate (PA), polyester ether (PEE), polyamidimide (PAI), all aromatic polyamide resins (APA resins), polyparabanic acid resin (PPA), polyoxadiazole (POD), polyhydantoin (PHY) and such. The oriented resin layer of such a material provides the laminated structure (covering structure, the pouch) with a heat-resistant property. The thickness of the oriented resin layer may be determined in compliance with the use of the oriented resin layer. Usually, the thickness of the oriented resin layer is in the range of about 6 to about 100 μm. In the laminated structure 21 shown in FIG. 3, the surface of the oriented resin layer 24 on which the adhesive layer 26 is formed may be finished by a surface treatment, such as a corona discharge treatment, a plasma treatment or a sandblasting treatment, to improve the adhesion between the oriented resin layer 24 and the adhesive layer 26, if necessary. The same surface of the oriented resin layer 24 may be processed by an antistatic treatment.

The adhesive layer 26 may be a layer of a low-density polyethylene resin, an ethylene-α•olefin copolymer of a density in the range of 0.915 to 0.940 g/cm³, a polyethylene-vinyl acetate copolymer, an ionomer, a polypropylene resin, an ethylene-methacrylic acid copolymer, an ethylene-acrylic acid copolymer or a denatured substance, such as a polyolefin resin, polyethylene imine resin, a polybutadiene resin, an organic titanium compound, an isocyanate resin or a urethane resin, obtained by denaturing any one of the foregoing substances. Preferably, the thickness of the adhesive layer 26 is in the range of about 0.2 to about 60 μm. The adhesive layer 26 can be formed by spreading or extruding an adhesive over the oriented resin film. The intermediate layer 25 may be laminated to the adhesive layer 26 by a dry lamination process or an extrusion lamination process.

The intermediate layer 25 may be of either a single-layer structure or a multilayer structure. The intermediate layer 25 may be formed of one of the plurality of thermoplastic resins tabulated in Table 1 or a combinations of two or more of the plurality of thermoplastic resins tabulated in Table 1.

A preferable single-layer structure as the intermediate layer 25 may be formed of at least three kinds of resins including at least an ethylene-α•olefin copolymer and a styrene-butadiene block copolymer among ethylene-α•olefin copolymer of a density in the range of 0.915 to 0.940 g/cm³, a styrene-butadiene block copolymer of 50 to 90% by weight of styrene and 50 to 10% by weight of butadiene, a hydrogenated substance obtained by hydrogenating a styrene-butadiene block copolymer of 10 to 50% by weight of styrene and 90 to 50% by weight of butadiene, and a high-impact polystyrene.

The ethylene-α•olefin copolymer for forming the intermediate layer 25 is a copolymer of ethylene, and, for example, butene, pentene, hexene, heptene, octene, 4-methylpenteneel or the like. If the density of the ethylene- α•olefin copolymer is less than 0.915 g/cm³ or greater than 0.940 g/cm³, the film forming capability of a combination of the ethylene-α•olefin copolymer and a styrene-butadiene block copolymer is unsatisfactory and the intermediate layer 25 cannot satisfactorily be formed.

A film of a styrene-butadiene block copolymer for forming the intermediate layer 25 has an excessive tackiness and is difficult to handle if the styrene content of the styrene-butadiene block copolymer is less than 50% by weight, and the adhesion of the film with the heat sealant layer 22 at a low temperature is not satisfactory if the styrene content of the styrene-butadiene block copolymer is greater than 90% by weight.

The mixing ratio between the ethylene-α•olefin copolymer and the styrene-butadiene block copolymer in the film forming the intermediate layer 25 affect greatly the adhesive strength between a synthetic resin container and the laminated structure (covering structure) 21 heat-sealed to the synthetic resin container, and the transparency of the covering structure 21. The mixing ratio between the ethylene-α•olefin copolymer and the styrene-butadiene block copolymer of the material for forming the intermediate layer 25 according to the present invention is 10 to 90% by weight of an ethylene-α•olefin copolymer to 90 to 10% by weight of a styrene-butadiene block copolymer. The film forming ability of the material for forming the intermediate layer 25 is low and the transparency of the same material is not satisfactory if the ethylene-α•olefin copolymer content is less than 10% by weight and the styrene-butadiene block copolymer content is greater than 90% by weight. The adhesion of the intermediate layer 25 with the heat sealant layer 22 is insufficient and the adhesive strength between the laminated structure (covering structure) 21 and the synthetic resin container is lower than an appropriate adhesive strength if the ethylene-α•olefin copolymer content is greater than 90% by weight and the styrene-butadiene block copolymer content is less than 10% by weight.

When forming the intermediate layer 25 of four kinds of resins including a hydrogenated styrene-butadiene copolymer and a high-impact polystyrene resin, it is preferable to add 0 to 30 parts by weight of hydrogenated styrene-butadiene block copolymer containing 10 to 50% by weight of styrene and 90 to 50% by weight of-butadiene, and 0 to 50 parts by weight of a high-impact polystyrene resin to 100 parts by weight of a resin composition containing 10 to 90% by weight of the ethylene-α•olefin copolymer and 90 to 10% by weight of the styrene-butadiene block copolymer.

A hydrogenated styrene-butadiene block copolymer content greater than 30 parts by weight is undesirable because the blocking resistance of a film formed of the resin composition having a hydrogenated styrene-butadiene block copolymer content greater than 30 parts by weight is insufficient. If an additive added to the styrene-butadiene block copolymer for hydrogenation does not act properly, the styrene-butadiene block copolymer has a large butadiene content and is liable to be oxidized. If the intermediate layer 25 is formed of such a material, a gel is liable to form.

If an anhydride is added as an additive to the film forming material, it is difficult to form a film in a satisfactory accuracy.

It is not desirable that the high-impact polystyrene content of the film forming material is 50 parts by weight because the transparency of the intermediate layer 25 is unsatisfactory if the intermediate layer 25 is formed of a film forming material of a high-impact polystyrene content exceeding 50 parts by weight.

The intermediate layer may be formed of a resin composition of three kinds of resins, such as a resin composition containing 100 parts by weight of a resin composition containing 10 to 90% by weight of an ethylene-α•olefin copolymer and 90 to 10% by weight of a styrene-butadiene block copolymer, and 0 to 30 parts by weight of a hydrogenated styrene-butadiene block copolymer. It is also possible to form the intermediate layer 25 of a resin composition containing 100 parts by weight of a resin composition containing 10 to 90% by weight of an ethylene-α•olefin copolymer and 90 to 10% by weight of a styrene-butadiene block copolymer, and 0 to 50 parts by weight of a high-impact polystyrene.

It is further possible to form the intermediate layer 25 of a single-layer construction of a resin composition containing 10 to 90 parts by weight of an ethylene-α•olefin copolymer of a density in the range of 0.915 to 0.940 g/cm³, and 90 to 10 parts by weight of styrene-butadiene block copolymer containing 50 to 90% by weight of styrene and 50 to 10% by weight of butadiene.

The tackiness of the film forming the intermediate layer 25 increases and blocking is liable to occur if the styrene content of the styrene-butadiene block copolymer is less than 50% by weight. The adhesion of the intermediate layer 25 with the heat sealant layer 22 is insufficient if the styrene content of the styrene-butadiene block copolymer exceeds 90% by weight. The mixing ratio between the ethylene-α•olefin copolymer and the styrene-butadiene block copolymer in the film forming the intermediate layer 25 affect greatly the adhesive strength between a synthetic resin container and the laminated structure (covering structure) 21 heat-sealed to the synthetic resin container, and the transparency of the intermediate layer 25. If the ethylene-α•olefin copolymer content is less than 10% by weight and the styrene-butadiene block copolymer content is greater than 90% by weight, it is difficult to form a film for the intermediate layer 25 and the transparency of the covering structure is not satisfactory. If the ethylene-α•olefin copolymer content is greater than 90% by weight and the styrene-butadiene block copolymer content is less than 10% by weight, the adhesion of the intermediate layer 25 with the heat sealant layer 22 is excessively low and the adhesive strength between the laminated structure (covering structure) 21 and the synthetic resin container is lower than an appropriate adhesive strength.

According to the present invention, the intermediate layer 25 of a single-layer construction may be formed of a resin composition containing 10 to 90 parts by weight of an ethylene-α•olefin copolymer of a density in the range of 0.915 to 0.940 g/cm³, and 90 to 10 parts by weight of a hydrogenated styrene-butadiene block copolymer containing 10 to 50% by weight of styrene and 90 to 50% by weight of butadiene.

If the density of the ethylene-α•olefin copolymer is less than 0.915 g/cm³ or greater than 0.940 g/cm³, the film forming ability of the resin composition of the ethylene-α•olefin copolymer and the hydrogenated styrene-butadiene block copolymer for forming the intermediate layer 25 is not satisfactory. If the styrene content of the hydrogenated styrene-butadiene block copolymer is less than 10% by weight, films formed of the resin composition has an excessively high tackiness, are liable to block and are difficult to handle. If the styrene content of the hydrogenated styrene-butadiene block copolymer is greater than 50% by weight, the adhesive strength between the intermediate layer 25 and the heat sealant layer 22 at a low temperature is insufficient. A hydrogenated material makes the intermediate layer 25 flexible, is compatible with the ethylene-α•olefin copolymer and contributes to the enhancement of the transparency of the intermediate layer 25. The mixing ratio between the ethylene-α•olefin copolymer and the styrene-butadiene block copolymer in the film forming the intermediate layer 25 affect greatly the adhesive strength between a synthetic resin container and the laminated structure (covering structure) 21 heat-sealed to the synthetic resin container, and the transparency of the intermediate layer 25. If the ethylene-α•olefin copolymer content is less than 10% by weight and the hydrogenated styrene-butadiene block copolymer content is greater than 90% by weight, the film forming ability of the resin composition for forming the intermediate layer 25 and the transparency of the covering structure 21 are unsatisfactory. If the ethylene-α•olefin copolymer content is greater than 90% by weight and the hydrogenated styrene-butadiene block copolymer content is less than 10% by weight, the adhesion of the intermediate layer 25 with the heat sealant layer 22 is excessively low, and the adhesive strength between the laminated structure (covering structure) 21 and the synthetic resin container is lower than an appropriate adhesive strength.

The intermediate layer 25 of a single-layer construction may be formed of a linear saturated polyester resin having a glass transition point of 40° C. or above.

Possible linear saturated polyester resins having a glass transition point of 40° C. or above are polymers each produced by the copolycondensation of an alcohol, such as ethylene glycol, propylene glycol, 1,4-butanediol or 1,4-cyclohexane dimethanol, and a fatty dicarboxylic acid, such as adipic acid or sebacic acid, or an aromatic dicarboxylic acid, such as terephthalic acid, isophthalic acid or diphenyl-carboxylic acid. More specifically, possible linear saturated polyester resins are polymers produced by the copolycondensation of ethylene glycol and terephthalic acid, ethylene glycol, isophthalic acid and terephthalic acid, 1,4-cyclohexane dimethanol, ethylene glycol and terephthalic acid, and propylene glycol, isophthalic acid and terephthalic acid. A linear saturated polyester resin having a glass transition point of 40° C. is preferred because the temperature of an environment in which the laminated structure (covering structure) 21 will be used is 40° C. or below.

Desirably, the thickness of the intermediate layer 25 of a single-layer construction is in the range of about 3 to about 100 µm. It is difficult to form the intermediate layer 25 in a thickness below 3 µm, and it is difficult to heat-seal the laminated structure (covering structure) 21 satisfactorily to a synthetic resin container.

Figure 4:
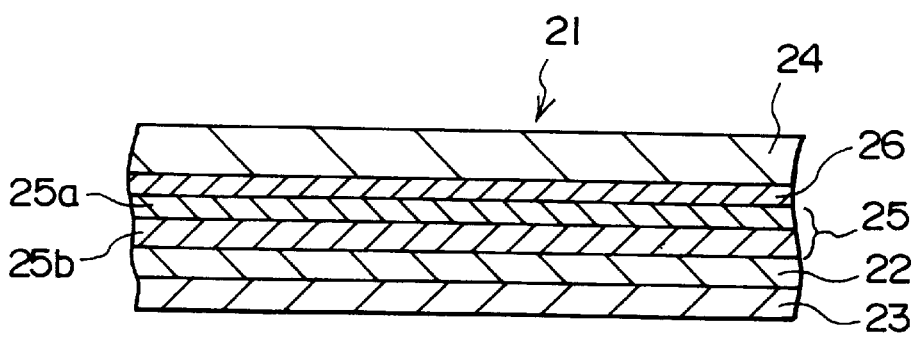
FIG. 4 is a typical sectional view of a laminated structure in a modification of the laminated structure of FIG. 1.

The intermediate layer 25 of a multilayer construction will be described. As shown in FIG. 4, the intermediate layer 25 of a two-layer construction consists of a first resin layer 25a and a second resin layer 25b.

The first resin layer 25a may be formed of an ethylene-α•olefin copolymer of a density in the range of 0.915 to 0.940 g/cm³, or a composition or a resin different from that forming the second resin layer 25b.

The second resin layer 25b may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 10 to 50% by weight of styrene and 90 to 50% by weight of butadiene, and 0 to 30 parts by weight of hydrogenated styrene-butadiene block copolymer. The second resin layer 25b may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, and 0 to 50 parts by weight of a high-impact polystyrene. The second resin layer 25b may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, 0 to 30 parts by weight of a hydrogenated styrene-butadiene block copolymer of 10 to 50% by weight of styrene and 90 to 50% by weight of butadiene, and 0 to 50 parts by weight of a high-impact polystyrene.

The respective thicknesses of the first resin layer 25a and the second resin layer 25b may be in the range of about 2 to about 60 µm.

Figure 5:
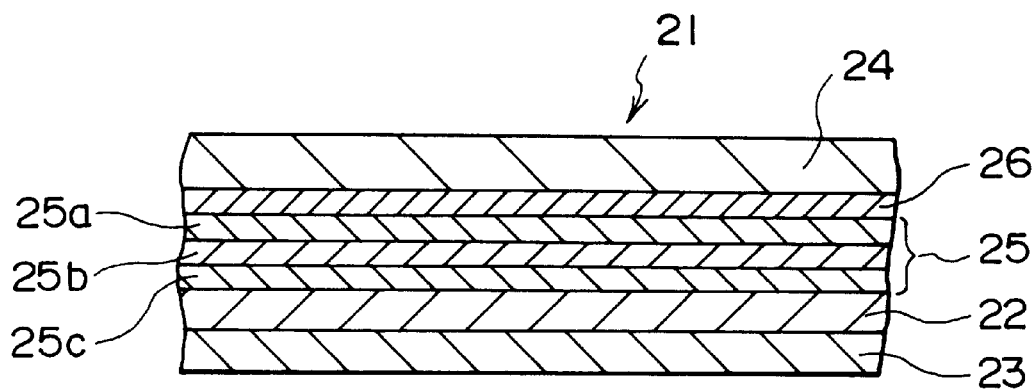
FIG. 5 is a typical sectional view of a laminated structure in a modification of the laminated structure of FIG. 1.

As shown in FIG. 5, the intermediate layer 25 of a three-layer construction consists of a first resin layer 25a, a second resin layer 25b and a third resin layer 25c in contact with the heat sealant layer 22.

The first resin layer 25a may be formed of an ethylene-α•olefin copolymer of a density in the range of 0.915 to 0.940 g/cm³. The second resin layer 25b and the third resin layer 25c are formed of resin compositions of different composition, respectively. The second resin layer 25b may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, 0 to 30 parts by weight of a hydrogenated styrene-butadiene block copolymer of 10 to 50% by weight of styrene and 90 to 50% by weight of butadiene, and 0 to 50 parts by weight of a high-impact polystyrene.

The third resin layer 25c may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, and 0 to 30 parts by weight of a hydrogenated styrene-butadiene block copolymer of 10 to 50% by weight of styrene and 90 to 50% by weight of butadiene. The third resin layer 25c may be formed of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, 0 to 30 parts by weight of a hydrogenated styrene-butadiene block copolymer of 10 to 50% by weight of styrene and 90 to 50% by weight of butadiene, and 0 to 50 parts by weight of a high-impact polystyrene. It is also possible to form the third resin layer 25c of a resin composition of 100 parts by weight of a resin composition containing 10 to 90% by weight of an ethylene-α•olefin copolymer of a density in the range of 0.915 to 0.940 g/cm³ and 90 to 10% by weight of styrene-butadiene block copolymer of 50 to 90% by weight of styrene and 50 to 10% by weight of butadiene, 0 to 30 parts by weight of a hydrogenated styrene-butadiene block copolymer of 10 to 50% by weight of styrene and 90 to 50% by weight of butadiene, and 0 to 50 parts by weight of a high-impact polystyrene.

The respective thicknesses of the first resin layer 25a, the second resin layer 25b and the third resin layer 25c may be in the range of 3 to 20 µm. The multilayer intermediate layer 25 may be formed by a dry lamination process or an extrusion lamination process.

It is desirable that a covering structure formed by processing the foregoing laminated structure of the present invention, for use in combination with a carrier tape has the following peeling property. It is desirable, when peeling off the laminated structure (covering structure) 21 heat-sealed to a synthetic resin container, that the intermediate layer 25 and the heat sealant layer 22 are separated from each other by delamination or the heat sealant layer 22 breaks internally due to cohesive failure. The peel strength of the laminated structure is lower than the adhesive strength between the heat sealant layer 22 and the antistatic layer 23 or the weld strength between the antistatic layer 23 and the synthetic resin container. Preferably, the peel strength is in the range of 100 to 1200 g/15 mm. If the peel strength is less than 100 g/15 mm, it is possible that the intermediate layer 25 separates from the heat sealant layer 22 during transportation, and the parts contained in the synthetic resin container fall off. If the peel strength is higher than 1200 g/15 mm, it is possible that the synthetic resin container vibrates and the parts contained in the synthetic resin container are shook out of the synthetic resin container when the laminated structure (covering structure) 21 is peeled from the synthetic resin container. Desirably, zip-up is 50 g/2 mm or below. If zip-up is.greater than 50 g/2 mm, it is possible that the synthetic resin container vibrates and the parts contained in the synthetic resin container pop out of the synthetic resin container when the covering structure is peeled from the synthetic resin container.

The foregoing peel strength is measured by a peel test in which the laminated structure is peeled off in a 180°-peeling mode at a peeling rate of 300 mm/min in an atmosphere of 23° C. and 40% RH. Zip-up is the difference between a maximum and a minimum peel strength among peel strengths of 2 mm wide strips formed by heat-sealing a 15 mm wide multilayer structure to a synthetic resin container and slitting the laminated structure. The peel strength of the 2 mm wide strips is measured by peeling off the 2 mm wide strips in a 180°-peeling mode at a peeling rate of 300 mm/min in an atmosphere of 23° C. and 40% RH.

A delamination peeling mode using delamination between the intermediate layer 25 and the heat sealant layer 22 or a cohesive failure peeling mode using the internal breakage of the sealant layer 22 due to cohesive failure can optionally be selected by controlling heat-sealing conditions. The delamination peeling mode can be selected if the laminated structure is heat-sealed to the synthetic resin container by using heavy heat-sealing conditions, i.e., a high heating temperature, a long heating time and a high pressure. The cohesive failure peeling mode can be selected if the laminated structure is heat-sealed to the synthetic resin container by using light heat-sealing conditions. When the delamination peeling mode is desired, the heating temperature is in the range of 130 to 200° C., the heating time is in the range of 0.3 to 2.0 sec, and the pressure is in the range of 0.7 to 3.0 kgf/cm$^2$. When the cohesive failure peeling is desired, the heating temperature is in the range of 90 to 150° C., the heating time is in the range of 0.1 to 0.5 sec, and the pressure is in the range of 0.3 to 1.2 kgf/cm$^2$.

The laminated structure (covering structure) 21 can be heat-sealed to the synthetic resin container by a sufficiently high adhesive strength between the heat sealant layer 22 and the synthetic resin container, and the same can surely be peeled off from the synthetic resin container with a small zip-up.

A pouch can be formed by processing the laminated structure of the present invention by a known pouch forming method so that the antistatic layer of the laminated structure forms the innermost layer of the pouch. A tear notch is formed in the pouch. When opening the pouch, the pouch is torn from the tear notch. The laminated structure for forming the pouch is not subject to restrictions on peel strength which apply to the laminated structure for forming the covering structure. The oriented resin layer 24 of the laminated structure for forming the pouch may be formed by a uniaxially oriented resin film. The pouch formed from such a laminated structure can easily be torn along the direction of orientation of the uniaxially oriented resin film.

The peeling action of a covering structure 21 formed by processing the laminated structure as shown in FIG. 3 will be described with reference to FIGS. 6 to 9.

Figure 6:
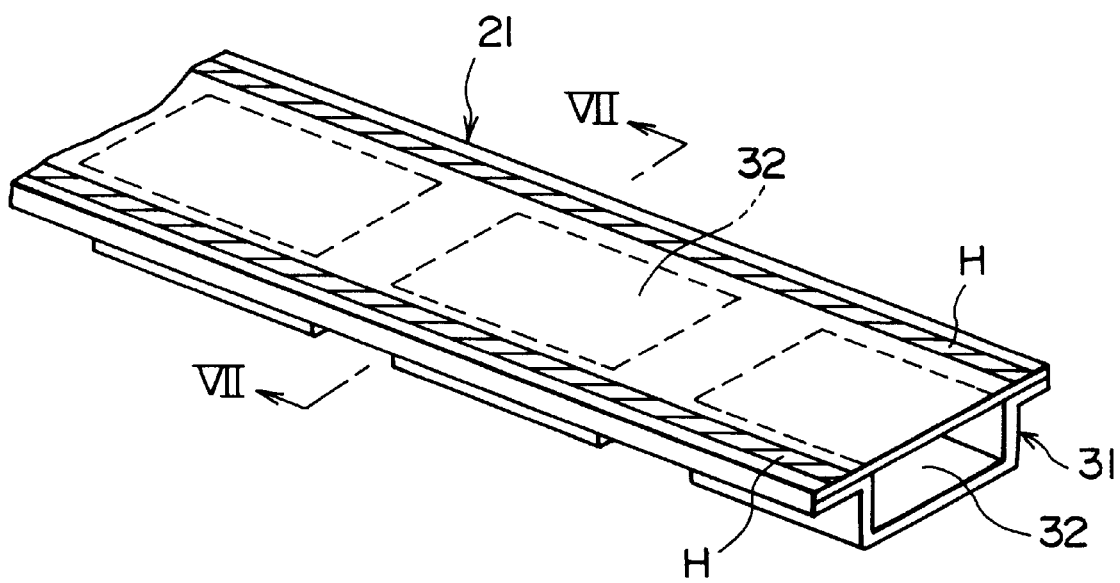
FIG. 6 is a perspective view of a covering structure according to the present invention as welded to a carrier tape.
Figure 7:
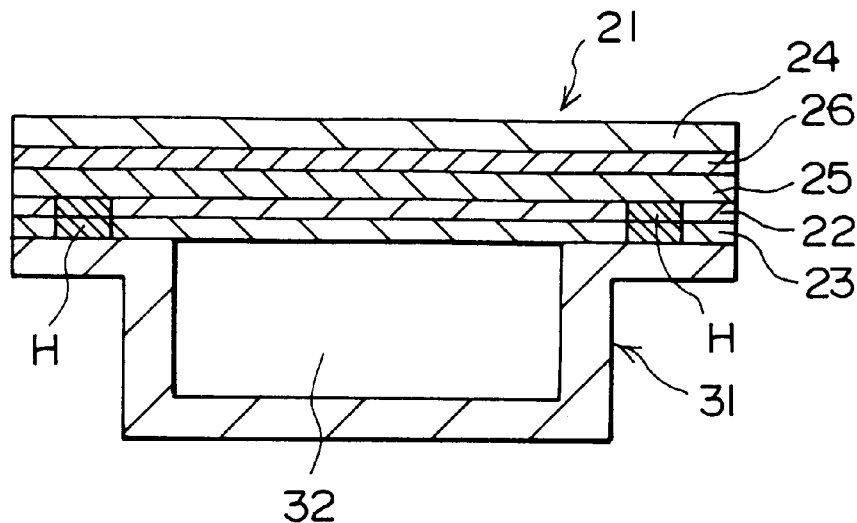
FIG. 7 is a sectional view taken on line VII—VII in FIG. 6.
Figure 8:
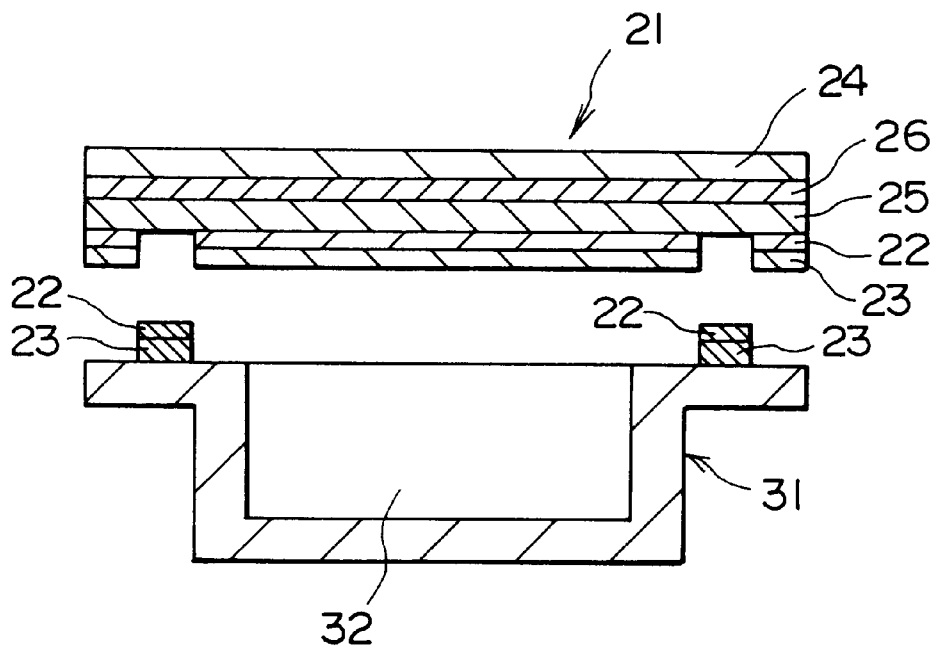
FIG. 8 is a sectional view similar to FIG. 7, showing the covering structure separated from the carrier tape.
Figure 9:
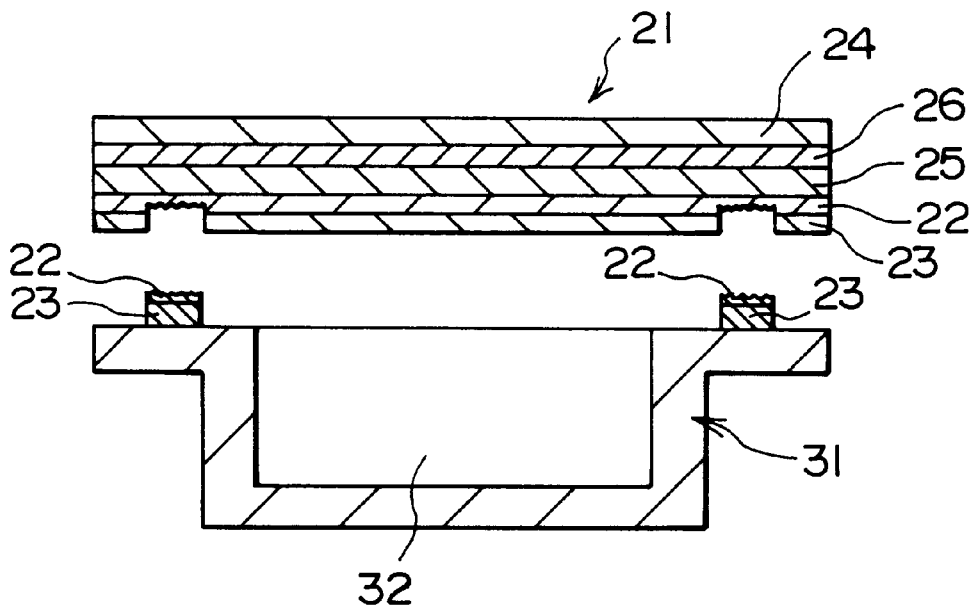
FIG. 9 is a sectional view similar to FIG. 7, showing the covering structure separated from the carrier tape.

Referring to FIGS. 6 and 7, the covering structure 21 as shown in FIG. 3 is heat-sealed to, for example, a carrier tape 31 provided with blisters 32, to form strip-shaped heat-sealed portions H, i.e., shaped portions, of a predetermined width on the opposite sides of the blisters 32. In the covering structure 21, the adhesive strength between the intermediate layer 25 and the heat sealant layer 22 is in the range of 100 to 1200 g/15 mm, which is lower than the adhesive strength between the heat sealant layer 22 and the antistatic layer 23 or the weld strength between the antistatic layer 23 and the carrier tape 31. When peeling the covering structure 21 from the carrier tape 31, portions of the heat sealant layer 22 and the antistatic layer 23 forming the heat-sealed portions H remain welded to the carrier tape 31 and the intermediate layer 25 is delaminated from the heat sealant layer 22 as shown in FIG. 8, so that the covering structure 21 is peeled from the carrier tape 31, leaving the portions of the heat sealant layer 22 and the antistatic layer 23 corresponding to the heat-sealed portions H on the carrier tape 31. In another case, the portions of the heat sealant layer 22 corresponding to the heat-sealed portions H break internally due to cohesive failure, and the covering structure 21 is peeled from the carrier tape 31, leaving part of the portions of the heat sealant layer 22 and the portions of the antistatic layer 23 corresponding to the heat-sealed portions H on the carrier tape. 31 as shown in FIG. 9. Thus, the covering structure 21 of the present invention has contradictory characteristics which make the covering structure to be heat-sealed to the carrier tape 31 with a high weld strength and to be easily peeled from the carrier tape 31.

Figure 10:
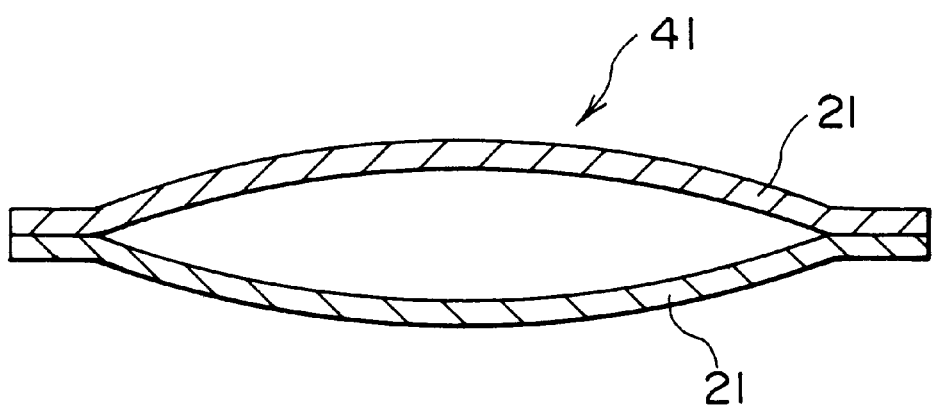
FIG. 10 is a typical sectional view of a pouch according to the present invention.
Figure 11:
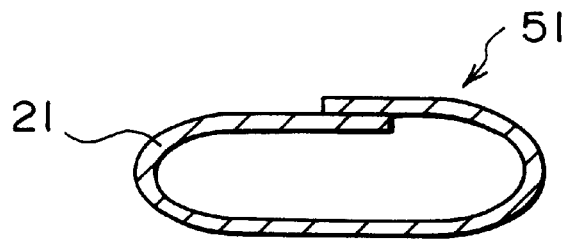
FIG. 11 is a typical sectional view of another pouch according to the present invention.

FIGS. 10 and 11 show pouches in accordance with the present invention in typical sectional views, respectively. A pouch 41 shown in FIG. 10 is formed, for example, by putting together two laminated structures 21 similar to that shown in FIG. 3 with the antistatic layers thereof facing each other, and joining together the laminated structures 21 by bonding together the peripheral portions of the laminated structures 21 by heat-sealing or crimping. One of the two laminated structures may be a laminated structure of a construction in accordance with the present invention different from that of the laminated structure 21 shown in FIG. 3 or may be a resin film other than laminated structures in accordance with the present invention. A pouch 51 shown in FIG. 11 is formed, for example, by rolling a laminated structure 21 similar to that shown in FIG. 3 in a cylindrical shape with the antistatic layer forming the innermost layer of the cylindrical shape, and bonding together the overlapping opposite end portions of the laminated structure 21 by heat-sealing or crimping. A tear notch is formed in the pouch. When opening the pouch, the pouch is torn from the tear notch. The laminated structure for forming the pouch is not subject to restrictions on peel strength which apply to the foregoing laminated structure. The oriented resin layer of the laminated structure may be formed by a uniaxially oriented resin film. The pouch formed from such a laminated structure can easily be torn along the direction of orientation of the uniaxially oriented resin film. The pouch may be opened by tearing the laminated structures or by peeling the two laminated structures from each other. When opening the pouch by peeling the laminated structures from each other, the laminated structures may be separated from each other along the interface between the bonded laminated structures.

Figure 12:
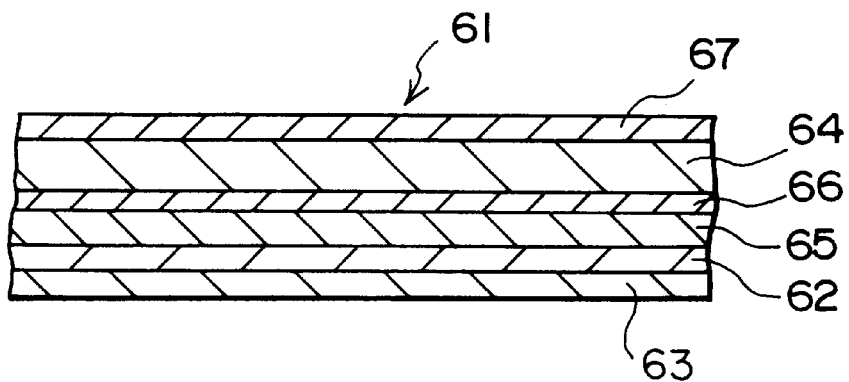
FIG. 12 is a typical sectional view of a laminated structure in a modification of the laminated structure of FIG. 1.
Figure 13:
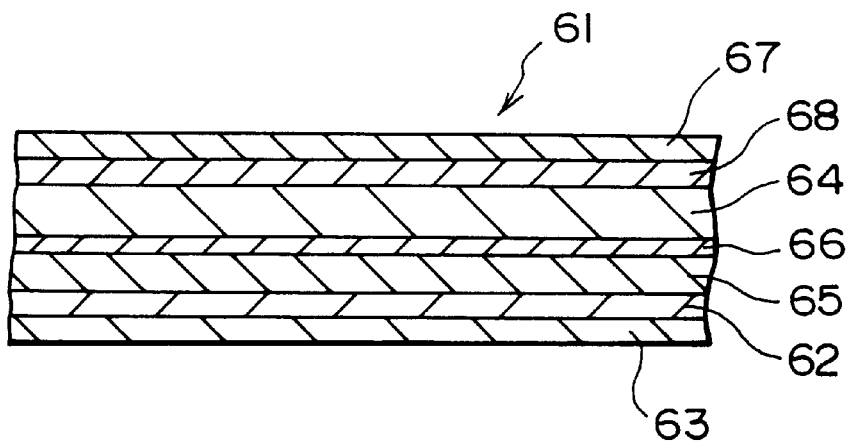
FIG. 13 is a typical sectional view of a laminated structure in a modification of the laminated structure of FIG. 1.

The multilayer structure of the present invention may be provided with an antireflection film, or an antireflection film and an antistatic layer on the oriented resin layer. FIGS. 12 and 13 show such laminated structures in further embodiments according to the present invention. Referring to FIG. 12, a laminated structure 61 comprises an oriented resin layer 64, an adhesive layer 66 formed on one of the surfaces of the oriented resin layer 64, an intermediate layer 65 laminated to the oriented resin layer 64 with the adhesive layer 66, a heat sealant layer 62 laminated to the intermediate layer 65, an antistatic layer 63 laminated to the heat sealant layer 62, and an antireflection film 67 laminated to the other surface of the oriented resin layer 64. A laminated structure 61 shown in FIG. 13 is similar to that shown in FIG. 12, except that the former is provided with an antistatic layer 68 sandwiched between an oriented resin layer 64 and an antireflection film 67.

The antirefletion film 67 suppresses the irregular reflection of light by the laminated structure and the reflection of an image of a light source on the laminated structure, and facilitates the visual recognition of the interior of a container. The antireflection film 67 may be formed by spreading an ink prepared by dispersing one or more than one of calcium fluoride, sodium fluoride, lithium fluoride, magnesium fluoride, lanthanum fluoride, neodymium fluoride, cerium fluoride, silicon dioxide, aluminum oxide, magnesium oxide, thorium oxide, lanthanum oxide, silicon monoxide, yttrium oxide, zirconium oxide, titanium oxide, cerium oxide, zinc oxide, bismuth oxide and cadmium oxide in a thermoplastic resin. The thermoplastic resin may be any one of polyester resins, polyurethane resins, acrylic resins, vinyl chloride-vinyl acetate copolymers, polyvinyl acetate resins, phenolic resins, xylene resins, urea resins, melanin resins, ketone resins, coumaron-indene resins, petroleum resins, terpene resins, cyclopolymeric rubbers, chlorinated rubbers, alkyd resins, polyamide resins, polyvinyl alcohol resins, polyvinyl butyral resins, chlorinated polypropylene resins, styrene resins, epoxy resins and cellulose derivatives. Methods for forming the antireflection film 67 by spreading an ink are an air-doctor-coating method, a blade-coating method, a knife-coating method, a rod-coating method, a roll-coating method, a gravure coating method, a screen-coating method, a kiss-roll-coating method, a bead-coating method, a slot-orifice-coating method and a spray coating method. Suitable method for directly forming the antireflection film 67 are a vacuum evaporation methods, a sputtering method and the like. The antireflection film 67 may be of either a single-layer construction or a multilayer construction. A desirable thickness of the antireflection film 67 is in the range of 0.01 to 0.5 $\mu$m.

The laminated structure 61 is provided with the antistatic layer 68 to prevent the attraction of dust to the surface thereof by static electricity. Antistatic agent contained in the antistatic layer 68 is a conductive metal oxide powder, such as lead oxide powder, indium oxide powder or zinc oxide powder, of a particle size in the range of 0.01 to 1 $\mu$m, conductive carbon, a surface active agent or a bisammonium organic sulfur semiconductor. More specifically, the antistatic layer 68 may contain any one of the following antistatic agents.

(1) Particles of conductive carbon including those of kitchen black, acetylene black and furnace black, having a particle size in the range of 20 to 150 $\mu$m and a surface area of 60 m$^2$/g or above (2) Particles of metal oxides including lead oxide, indium oxide and zinc oxide, particles of metal sulfides or conductive substances obtained by making metal sulfates conductive by doping or the like, having a particle size in the range of 0.01 to 1 $\mu$m (3) Particles of metals including copper, iron, aluminum, nickel and gold, having a particle size in the range of 0.01 to 10 $\mu$m or fine powders containing a fibrous metal as a principal component (4) Anionic, cationic, nonionic and amphoteric surface active agents Suitable anionic surface active agents are sulfated oils, soaps, sulfated ester oils, sulfated amide oils, olefin sulfates, fatty alcohol sulfates, alkylsulfates, fatty acid ethyl sulfonates, alkyl sulfonates, alkylbenzene sulfonate, a mixture of naphthalene sulfonic acid and formalin, succinic ester sulfonate and phosphates.

Suitable cathionic surface active agents are primary amines, tertiary amines, quaternary ammonium compounds and pyridine derivatives.

Suitable nonionic surface active agents are partial fatty acid esters of polyhydric alcohols, ethylene oxide adducts of fatty alcohols, ethylene oxide adducts of fatty acids, ethylene oxide adducts of fatty amines or fatty acid amides, ethylene adducts of alkylphenols, ethylene oxide adducts of alkylnaphthol and ethylene oxide adducts of partial fatty acid esters of polyhydric alcohols.

Suitable amphoteric surface active agents are carboxylic acid derivatives and imidazoline derivatives.

(5) Fatty acid derivatives, partial hydrolysates of four-functional-group silicon, bisammonium organic sulfur semiconductors.

The antistatic layer 68 may be formed by spreading any one of the foregoing antistatic agents over the oriented resin layer 64. The antistatic layer 68 may be formed by applying an ink prepared by dispersing the antistatic agent in a thermoplastic resin suitable for forming the antireflection film 67. Preferably, the thickness of the antistatic layer 68 is in the range of 0.2 to 20 $\mu$m.

The surface resistivity of the antistatic layer 68 in an atmosphere of 22° C. and 90% RH is in the range of $10^5$ to $10^{12}$ Ω, and a static decay time of 2 sec or below necessary for reducing a charge of 5000 V by 99% at 23±5° C. and 12±3% RH. The antistatic layer 68 provides an excellent antistatic effect.

The oriented resin layer 64, the adhesive layer 66, the intermediate layer 65, the heat sealant layer 62 and the antistatic layer 63 of the laminated structure 61 of FIG. 13 are the same as those of the laminated structure 61 of FIG. 12, respectively, and hence the description thereof will be omitted.

If a covering structure and a pouch formed by processing the laminated structure of the present invention need gas shielding for shutting out steam and gases, such as oxygen gas, carbon dioxide gas and nitrogen gas, and electric shielding for avoiding external electrical influence on the contents to protect the contents, the covering structure may be provided, in addition to the intermediate layer, with two or more additional layers meeting desired purposes between the oriented resin layer and the heat sealant layer.

A laminated structure as an example of such laminated structure is provided with an inorganic layer 26a of a metal foil or an evaporated inorganic film, and an adhesive layer 26 between the oriented resin layer 24 and the heat sealant layer 22 as shown in FIG. 3. The metal foil may be an aluminum foil or a stainless steel foil. The evaporated inorganic film may be an evaporated metal film, such as an aluminum film or a nickel film, or an evaporated inorganic film, such as a silicon dioxide film.

The laminated structure may be provided with an intermediate layer 25, a moisture absorbing layer 26b and an adhesive layer 26 between the oriented resin layer 24 and the heat sealant layer 22. The moisture absorbing layer 26b is a layer of a material containing a moisture absorbent or a highly-absorbent resin as a principal component. The following moisture absorbents and highly-absorbent resins may be used individually or in combination.

① Moisture Absorbents

Inorganic Salts

Sodium chloride, calcium chloride, zinc chloride, ammonium chloride, ammonium sulfate, sodium sulfate, magnesium sulfate, disodium hydrogenphosphate, sodium diphosphate, sodium pyrophosphate, calcium pyrophosphate, calcium carbonate and sodium nitrate Organic Compounds Glucose, fruit sugar, cane sugar, gelatin, denatured casein, denatured starch, tragacanth gum, polyvinyl alcohol, carboxymethyl cellulose and sodium alginate ② Highly-absorbent Resins Starch-soda acrylate graft copolymers, hydrolysates of starch-acrylonitrile copolymers, starch-polymethacrylate copolymers, hydrolysates of starch-poly(methyl methacrylates) and starch-graft copolymers of those salts.

Crosslinked synthetic resins including partially crosslinked polymers of polyacrylates, polyisobutylene-maleic anhydride copolymers and hydrolysates of methyl methacrylate-vinyl acetate copolymers Denatured polyethylene oxides These highly-absorbent resins are water-insoluble and capable of holding an amount of water ten to a thousand times their own weight. These highly-absorbent resins are available on the market in the following trade names.

③ Commercial Highly-absorbent Resins

SUMICAGEL, Sumitomo Kagaku Kogyo K.K.

AQUAPLANE, Meisei Kagaku Kogyo K.K.

AQUAKEEP, Seitetsu Kagaku Kogyo K.K.

KI GEL, Kurare Isoprene Chemical Co.

SUMWET, Sanyo Kasei Kogyo K.K.

PLEAPUL, Shyowa Denko K.K.

SGP ABSORBENT POLYMER, Henkel Co.

The laminated structure of the present invention may be provided with an intermediate layer 25, an oxygen absorbing layer 26c or a moisture absorbing layer 26c, and an adhesive layer 26 between the oriented resin layer 24 and the heat sealant layer 22. The oxygen absorbing layer is formed of a material containing one of or a combination of the following substances as a principal component.

Reducing Metal Powders: Reducing iron, reducing zinc, reducing tin

Metal Oxides: Ferrous oxide, triiron tetroxide

Reducing Metal Compounds: Iron carbide, ferrosilicon, iron carbonyl and iron hydroxide When necessary, these substances may be used in combination with an assistant, such as an alkali metal, hydroxide of an alkaline earth metal, a carbonate, a sulfite, a thiosulfate, a phosphate, a phosphate, an organic acid salt, a halogenide, activated carbon, activated alumina, activated clay or a phenol High-molecular Compounds Having Polyhydric Phenol Ascorbic Acid and Its Compounds The laminated structure of the present invention may be provided with an intermediate layer 25, a magnetic layer 26b or a gas-shielding resin layer 26b, and an adhesive layer 26 between the oriented resin layer 24 and the heat sealant layer 22. The gas-shielding resin layer 26b may be formed of a saponified ethylene-vinyl alcohol copolymer, a methaxylene azipamide or a polyacrylonitrile.

A moisture absorbing layer, an oxygen absorbing layer, an elastic layer, a gas-shielding resin layer, a metal foil layer and an inorganic layer may be used in combination, when necessary. Table 3 shows suitable thermoplastic elastomers (TPEs) for forming the elastic layer.

The synthetic resin container to be used in combination with the foregoing covering structure of the present invention are resin containers formed of polyvinyl chloride (PVC), polystyrene (PS), polyester resins ((A-PET, PEN, PET-G, PCTA), polypropylene (PP), polycarbonate (PC), polyacrylonitrile (PAN) and acrylonitrile-butadiene-styrene copolymers (ABS), and synthetic resin containers of those materials, containing or coated with conductive carbon particles, metal particles, particles of a metal oxide, such as tin oxide, zinc oxide or titanium oxide, processed to make the same conductive, an organic silicon compound, a surface active agent, a bisammonium organic sulfur semiconductor or an ultraviolet-setting or electron-beam-setting antistatic agent. The synthetic resin containers may be formed by processing a composite plastic sheet formed by laminating a PS resin or an ABS resin sheet containing carbon black to one of or both the surfaces of a PS resin sheet or an ABS resin sheet by coextrusion. The synthetic resin container may be formed by processing a plastic film having surfaces in which a conductive polymer is formed.

A container capable of shutting out steam and gases may be provided with an inorganic layer, a gas-shielding resin layer, a moisture absorbing layer, an oxygen absorbing layer and a metal layer or may be formed of glass or a metal.

Examples of the covering structure in accordance with the present invention will be described hereinafter.

EXAMPLE 1

The following biaxially oriented resin films were prepared.

Biaxially Oriented Films

PET: Biaxially oriented polyethylene terephthalate film

"ESUPETTO 6140", 12 $\mu$m thick, Treated by a corona discharge treatment, commercially available from Toyo-bo K.K.

OPP: Biaxially oriented polypropylene film

"OPU-1", 12 $\mu$m thick, Treated by a corona discharge treatment, commercially available from Tokyo Serofan-shi K.K.

ONy: Biaxially oriented nylon film

"HARDEN FILM-NS, N7150", 12 $\mu$m thick, Treated by a corona discharge treatment, commercially available from Toyo-bo K.K.

Adhesive

Polyethylene imine solution

VIP-100II, commercially available from Nippon Shokubai Kagaku K.K.

A low density polyethylene (LDPE), a linear low density polyethylene (L•LDPE), a styrene-butadiene block copolymer (S•B copolymer) containing 70 to 90% by weight of styrene and 30 to 10% by weight of butadiene, a hydrogenated styrene-butadiene block copolymer (S•B copolymer) containing 20 to 50% by weight of styrene and 80 to 50% by weight of butadiene, a high-impact polystyrene (HIPS), a linear saturated polyester (saturated polyester), and a silicon dioxide-coated film ($SiO_2$ evaporated film) and the following materials for forming the intermediate layer were prepared.

L•LDPE: "ULTZEX 3550A". Density: 0.925 g/cm³, commercially available from Mitsui Sekiyu Kagaku Kogyo K.K.

S•B copolymer: "ASAFLEX 810", commercially available from Asahi Kasei Kogyo K.K.

Hydrogenated S•B copolymer: "TAFUTEKKU H1D41", commercially available from Asahi Kasei Kogyo K.K.

HIPS: "SUTAIRON 475D", commercially available from Asahi Kasei Kogyo K.K.

Saturated polyester: "KS-O11C", 30 µm thick, glass transition point: 50° C., commercially available from Tosero Kagaku K.K.

LDPE: "MIRASON 16-P", commercially available from Mitsui Sekiyu Kagaku Kogyo K.K.

Saponified ethylene-vinyl alcohol copolymer: "EVAL EP-H101" (ethylene copolymerization ratio: 38 mol %), Oxygen Permeability: 2.0 cc·20 µ/m²~24 hr·atm Aluminum foil: "1N30", 7 µm thick, commercially available from San Aruminyumu Kogyo K.K.

$SiO_2$ evaporated film: "TECBARRIER S", commercially available from Mitubisi Kasei K.K. (Polyvinyl alcohol base, moisture permeability: 0.2 g/m² 24 hr, Oxygen permeability: 0.1 cc/m²·24 hr·atm)

Styrene-isoprene block copolymer elastomer: :HSR SIS", commercially available from Nippon Gosei Gomu K.K.

A linear low density polyethylene film (L•LDPE), a low density polyethylene film (LDPE), polypropylene film (PP), polyurethane-vinyl chloride/vinyl acetate copolymer (polyurethane), an adhesive resin film (EVA), an acrylic adhesive (adhesive), an ion-crosslinked olefin copolymer film (ionomer), an acrylic resin film (polyacrylate), vinyl chloride-vinyl acetate copolymer (vinyl chloride-acetate), chlorinated polypropylene film (polypropylene) and the following materials were prepared for forming the heat sealant layer.

L•LDPE: "T.U.X FCD", 30 µm thick, commercially available from Tokyo Serofan-shi K.K.

PP: "TOSERO CP GH", 30 µm thick, commercially available from Tosero Kagaku K.K.

LDPE: "V-1", 30 µm thick, commercially available from Tamapori K.K.

Polyester I: "SEIKADAIN 556-NS", 2 µm thick, commercially available from Dainichi Seika Kogyo K.K.

Polyurethane: "P-4 MEDIUM", 2 µm thick, (Urethane/vinyl chloride-acetate=2.0/7.5), commercially available from Za Inkutekku K.K.

Polyester II: "SEIKADAIN 556-NC" 2 µm thick, (Polyester/nitrocellulose =75/25), commercially available from Dainichi Seika Kogyo K.K.

Hot-melt adhesive: "HS-1", 10 µm thick, (ethylene-vinyl acetate-acrylate), commercially available from Za Inkutekku K.K.

EVA: "CMPS V-201", 20 µm thick, commercially available from Mitsui Du Pont Chemical Co.

Ionomer: "HIGHMIRAN 1652"20 µm thick, commercially available from Mitsui Du Pont Chemical Co.

Acrylate: "DIKKUSHIIRU A-250D", 5 µm thick, commercially available from Dai Nippon Inki Kagaku Kogyo K.K.

Ethylene-vinyl acetate resin: "Q066PP", commercially available from Toyo Inki Kogyo K.K.

Polystyrene resin: "PS-10 MEDIUM", 5 µm thick, commercially available from Dainichi Seika Kogyo K.K.

Vinyl chloride-acetate: "VAGH", commercially available from Union Carbide K.K.

Polypropylene: "SUPAKURON 813A" 5 µm thick, commercially available from Nippon Seishi K.K.

The following bisammonium organic sulfur semiconductor (bisammonium conductor) and an antistatic surface active agent were prepared for forming the antistatic layer.

Bisammonium conductor: "HIBORON SC", commercially available from Boron Intanashonal K.K.

Antistatic surface active agent: "STATISAIDO", commercially available from Takihara Sangyo K.K.

These materials were used in combinations tabulated in Table 1-4 to fabricate laminated structures of five types of layer constructions (Samples 1 to 16, and Comparative samples 1 to 3). Two kinds of heat sealant layers formed of a material containing 100 parts by weight of silica ($SiO_2$) particles of 0.5 µm in particle size and 100 parts by weight of a resin, and a material containing 100 parts by weight of alumina ($AlO_3$) particles of 0.02 µm in particle size and 100 parts by weight of a resin.

Layer Construction ①
Oriented resin layer/adhesive layer/heat sealant layer/antistatic layer Layer Construction ②
Oriented resin layer/adhesive layer/intermediate layer/heat sealant layer/antistatic layer Layer Construction ③
Oriented resin layer/adhesive layer/intermediate layer/adhesive layer/heat sealant layer/antistatic layer Layer Construction ④
Oriented resin layer/adhesive layer/intermediate layer/heat sealant layer Method of Constructing Laminated Structure with Intermediate Layer An adhesive is spread over an oriented resin film, and a 30 µm thick intermediate layer is laminated to the oriented resin film by a dry lamination process or a extrusion lamination process. Then, (1) a heat sealant layer of a film is formed by a dry lamination process or (2) a heat sealant layer of a solution or a heat sealant layer of a hot melt adhesive is formed by a coating process. Then, a water/IPA solution of a bisammonium organic sulfur semiconductor is applied to the heat sealant layer by a gravure reverse process in a coating weight of 0.1 g/m² to form a 0.05 µm thick antistatic layer.

TABLE 1-4

| Laminated structure | Construction | Oriented resin film | Intermediate layer | Heat sealant layer | Antistatic layer |
|---|---|---|---|---|---|
| Sample 1 | ① | PET | — | L.LDPE* | Provided |
| Sample 2 | ① | OPP | — | PP* | Provided |
| Sample 3 | ① | ONy | — | LDPE* | Provided |
| Sample 4 | ② | PET | 40% L.LDPE, 60% S.B copolymer | Polyester I | Provided |

TABLE 1-4-continued

| Laminated structure | Construction | Oriented resin film | Intermediate layer | Heat sealant layer | Antistatic layer |
|---|---|---|---|---|---|
| Sample 5 | ② | PET | 40% L.LDPE, 50% S.B copolymer, 10% hydrogenated S.B copolymer | Polyester I | Provided |
| Sample 6 | ② | PET | 40% L.LDPE, 40% S.B copolymer, 10% Hydrogenated S.B copolymer, 10% HIPS | Polyester II | Provided |
| Sample 7 | ② | PET | 40% L.LDPE, 60% Hydrogenated S.B copolymer | Polyester II | Provided |
| Sample 8 | ② | PET | Saturated polyester | Polyurethane | Provided |
| Sample 9 | ② | PET | 40% L.LDPE, 60% S.B copolymer | Hot-melt adhesive (EVA) | Provided |
| Sample 10 | ② | PET | LDPE | EVA group | Provided |
| Sample 11 | ② | PET | LDPE | Ionomer | Provided |
| Sample 12 | ③ | PET | Ethylene-vinyl alcohol copolymer Soap | EVA group* | Provided |
| Sample 13 | ③ | PET | Aluminum foil | EVA group* | Provided |
| Sample 14 | ③ | PET | Evaporated silicon dioxide layer Polyvinyl alcohol | LDEP* | Provided |
| Sample 15 | ③ | PET | Styrene-isoprene block copolymer Elastomer | LDEP* | Provided |
| Sample 16 | ② | PET | 40% L.LDPE, 60% S.B copolymer | Polyester II | Provided** |
| Comp. sample 1 | ④ | PET | 40% L.LDPE, 60% S.B copolymer | Polyester I | Not provided |
| Comp. sample 2 | ④ | PET | 40% L.LDPE, 60% S.B copolymer | Polyester I with dispersed carbon | Not provided |
| Comp. sample 3 | ④ | PET | 40% L.LDPE, 60% S.B copolymer | Polyester I | Antistatic surface active agent |

*: Laminated film Layers of EVA group and ionomer are formed by extrusion and those of others are formed by coating.
**: Mixture of 60% of bisammonium conductor and 40% of polyester II The haze, total light transmissivity, surface resistivity and static decay time of laminated structures in Samples 1 to 16 and Comparative samples 1 to 3 were measured under the following conditions.

Covering structures were formed by processing the laminated structures in Samples 4 to 10, and the covering structures were heat-sealed to PVC carrier tapes formed by processing a conductive polyvinyl chloride resin sheet ("XEG47" commercially available from Taihei Kagaku K.K.). The covering structures were heat-sealed to the PVC carrier tapes with a heat-sealing bar by a heat-sealing mode 1 (150° C., 0.5 sec, 3.0 kgf/cm$^2$) and a heat-sealing mode 2 (130° C., 0.2 sec, 1.0 kgf/cm$^2$), and adhesive strength were measured by peel tests under the following measuring conditions. Laminated structures in Samples 1 to 3 and 11 to 16 were heat-sealed with a heat-sealing bar by the heat-sealing mode 1 to the flanges of 50 mm diameter, 50 mm high cylindrical cups formed by processing a sheet of a resin of a 50:50 mixture of the polypropylene and the LDPE, and adhesive strength was measured by peel tests under the following conditions.

Conditions for Measuring Haze and Total Light Transmissivity
"Color computer SM-5SC" (Sug Shikenki K.K.)
Conditions for Measuring Surface Resistivity
"HAIRESTA IP" (Mitsubishi Yuka K.K.), 22° C., 40% RH
Conditions for Measuring Charge Attenuating Time
"STATIC DECAY METER-406C" (ETS (Electro-Tech Systems) Inc.), 23±5° C., 12±3% RH, 99% decay from 5000 V. Measurement was carried out by a method specified in MIL-B-81705C.
Conditions for Measuring Adhesive Strength
"Tenhiron Banno Shikenki HTH-100" (Toyo Baldwin K.K.), 23° C., 40% RH, peel rate: 300 mm/min, 180°-peeling mode Measured results and modes of peeling of the laminated structures are tabulated in Table 1-5

TABLE 1-5

| Laminated structure | Haziness (%) | Light transmissivity (%) | Surface resistivity (Ω) | Static decay time (sec) | Heat sealant layer containing silica | | | Heat sealant layer containing alumina | | |
|---|---|---|---|---|---|---|---|---|---|---|
| | | | | | Peel strength (g/15 mm) | Peeling mode Condition 1 | Peeling mode Condition 2 | Peel strength (g/15 mm) | Peeling mode Condition 1 | Peeling mode Condition 2 |
| Sample 1 | 30 | 80 | $10^7$ | 0.1 | 1200 | Cohesive failure | — | 1100 | Cohesive failure | — |
| Sample 2 | 35 | 78 | $10^7$ | 0.1 | 1500 | Cohesive failure | — | 1300 | Cohesive failure | — |
| Sample 3 | 30 | 82 | $10^7$ | 0.1 | 1200 | Cohesive failure | — | 1100 | Cohesive failure | — |
| Sample 4 | 25 | 85 | $10^7$ | 0.1 | 600 | Delamination | Cohesive failure | 500 | Delamination | Cohesive failure |
| Sample 5 | 26 | 84 | $10^7$ | 0.1 | 650 | Delamination | Cohesive failure | 350 | Delamination | Cohesive failure |
| Sample 6 | 28 | 80 | $10^7$ | 0.1 | 650 | Delamination | Cohesive failure | 600 | Delamination | Cohesive failure |
| Sample 7 | 25 | 85 | $10^7$ | 0.1 | 600 | Delamination | Cohesive failure | 500 | Delamination | Cohesive failure |
| Sample 8 | 15 | 85 | $10^7$ | 0.1 | 500 | Delamination | Cohesive failure | 500 | Delamination | Cohesive failure |
| Sample 9 | 34 | 78 | $10^7$ | 0.1 | 400 | Delamination | Cohesive failure | 300 | Delamination | Cohesive failure |
| Sample 10 | 10 | 90 | $10^7$ | 0.1 | 600 | Cohesive failure | Cohesive failure | 500 | Cohesive failure | Cohesive failure |
| Sample 11 | 12 | 88 | $10^7$ | 0.1 | 1500 | Cohesive failure | — | 1300 | Cohesive failure | — |
| Sample 12 | 15 | 85 | $10^7$ | 0.1 | 600 | Cohesive failure | — | 500 | Cohesive failure | — |
| Sample 13 | — | — | $10^7$ | 0.1 | 600 | Cohesive failure | — | 500 | Cohesive failure | — |
| Sample 14 | 10 | 92 | $10^7$ | 0.1 | 1500 | Cohesive failure | — | 1300 | Cohesive failure | — |
| Sample 15 | 10 | 90 | $10^7$ | 0.1 | 1500 | Cohesive failure | — | 1300 | Cohesive failure | — |

TABLE 1-5-continued

| Laminated structure | Haziness (%) | Light transmissivity (%) | Surface resistivity ($\Omega$) | Static decay time (sec) | Heat sealant layer containing silica | | | Heat sealant layer containing alumina | | |
|---|---|---|---|---|---|---|---|---|---|---|
| | | | | | Peel strength (g/15 mm) | Peeling mode Condition 1 | Peeling mode Condition 2 | Peel strength (g/15 mm) | Peeling mode Condition 1 | Peeling mode Condition 2 |
| Sample 16 | 25 | 85 | $10^7$ | 0.1 | 600 | Delamination | — | 500 | Delamination | — |
| Comp. sample 1 | 27 | 85 | $10^{13} \leq$ | 0.1 | 600 | Delamination | Cohesive failure | 500 | Delamination | Cohesive failure |
| Comp. sample 2 | 78 | 20 | $10^6$ | 0.1 | 300 | Cohesive failure | Separation | 200 | Cohesive failure | Separation |
| Comp. sample 3 | 25 | 90 | $10^{13} \leq$ | 0.1 | 600 | Delamination | Cohesive failure | 500 | Delamination | Cohesive failure |

Peeling modes***
Cohesive failure: Internal breakage of the heat sealant layer
Delamination: Separation of the heat sealant layer and the intermediate layer
Separation: Separation of the heat sealant layer from the container As is obvious from Table 1-5, Comparative samples 1 and 3 are unsatisfactory in electrical conductivity, and Comparative sample 2 is unsatisfactory in transparency.

SECOND EXAMPLE

Similarly to the samples of the first example, laminated structures in Samples 1 to 16 and Comparative samples 1 to 6 each having a multilayer construction of PET layer/ adhesive layer/intermediate layer/heat sealant layer/ bisammonium organic sulfur semiconductor layer by using combinations of materials shown in Table 1-6. Each of the materials for forming the heat sealant layer was prepared by mixing 120 parts by weight of silica ($SiO_2$) particles of 0.01 $\mu$m particle size and 100 parts by weight of the resin.

TABLE 1-6

| Laminated structure | Intermediate layer | | | | Heat sealant layer | Antistatic layer |
|---|---|---|---|---|---|---|
| | L.LDPE | S.B copolymer | Hydrogenated S.B copolymer | HIPS | | |
| Sample 1 | 12 | 88 | — | — | Polyester I | Provided |
| Sample 2 | 12 | 80 | 8 | — | Polyester I | Provided |
| Sample 3 | 12 | 80 | — | 8 | Polyester I | Provided |
| Sample 4 | 40 | 60 | — | — | Polyester I | Provided |
| Sample 5 | 40 | 50 | 5 | 5 | Polyester I | Provided |
| Sample 6 | 40 | 42 | 28 | — | Polyester I | Provided |
| Sample 7 | 40 | 42 | — | 28 | Polyester I | Provided |
| Sample 8 | 40 | 10 | 25 | 25 | Polyester I | Provided |
| Sample 9 | 88 | 12 | — | — | Polyester I | Provided |
| Sample 10 | 88 | — | 12 | — | Polyester I | Provided |
| Sample 11 | 40 | 60 | — | — | Acrylic resin | Provided |
| Sample 12 | 40 | 60 | — | — | Ethylen vinyl acetate group | Provided |
| Sample 13 | 40 | 60 | — | — | Acrylic-vinyl acetate group | Provided |
| Sample 14 | 40 | 60 | — | — | Polyester-vinyl acetate group | Provided |
| Sample 15 | 40 | 60 | — | — | Polyestyrene group | Provided |
| Sample 16 | 40 | 60 | — | — | Polypropylen group | Provided |
| Comp. sample 1 | 5 | 95 | — | — | Polyester I | Provided |
| Comp. sample 2 | 95 | 5 | — | — | Polyester I | Provided |
| Comp. sample 3 | 40 | 25 | 35 | — | Polyester I | Provided |
| Comp. sample 4 | 40 | 5 | — | 55 | Polyester I | Provided |
| Comp. sample 5 | 40 | 60 | — | — | Polyester I | Not provided |
| Comp. sample 6 | 40 | 60 | — | — | Polyester I | * |

*Antistatic layer: Layer of an antistatic surface active agent

The haze, total light transmissivity, surface resistivity and static decay time of laminated structures in Samples 1 to 16 and Comparative samples 1 to 6 were measured under the same conditions as those applied to the measurement of the laminated structures in the first example. Covering structures formed by processing the laminated structures were heat-sealed to PVC carrier tapes as shown in FIG. 6 to measure the adhesive strength.

Measured results and peeling modes of peeling of the laminated structures are tabulated in Table 1-7.

TABLE 1-7

| Laminated structure | Haziness (%) | Light transmissivity (%) | Surface resistivity (Ω) | Static decay time (sec) | Peel strength (g/15 mm) | Peeling mode Condition 1 | Peeling mode Condition 2 |
|---|---|---|---|---|---|---|---|
| Sample 1 | 25 | 90 | $10^7$ | 0.01 | 1200 | Delamination | Cohesive failure |
| Sample 2 | 29 | 85 | $10^7$ | 0.01 | 1150 | Delamination | Cohesive failure |
| Sample 3 | 29 | 84 | $10^7$ | 0.01 | 1150 | Delamination | Cohesive failure |
| Sample 4 | 25 | 92 | $10^7$ | 0.01 | 650 | Delamination | Cohesive failure |
| Sample 5 | 35 | 80 | $10^7$ | 0.01 | 800 | Delamination | Cohesive failure |
| Sample 6 | 36 | 75 | $10^7$ | 0.01 | 800 | Delamination | Cohesive failure |
| Sample 7 | 39 | 70 | $10^7$ | 0.01 | 800 | Delamination | Cohesive failure |
| Sample 8 | 45 | 65 | $10^7$ | 0.01 | 820 | Delamination | Cohesive failure |
| Sample 9 | 12 | 92 | $10^7$ | 0.01 | 1100 | Delamination | Cohesive failure |
| Sample 10 | 15 | 92 | $10^7$ | 0.01 | 1100 | Delamination | Cohesive failure |
| Sample 11 | 25 | 92 | $10^7$ | 0.01 | 750 | Delamination | Cohesive failure |
| Sample 12 | 29 | 90 | $10^7$ | 0.01 | 450 | Delamination | Cohesive failure |
| Sample 13 | 20 | 92 | $10^7$ | 0.01 | 500 | Delamination | Cohesive failure |
| Sample 14 | 18 | 92 | $10^7$ | 0.01 | 550 | Delamination | Cohesive failure |
| Sample 15 | 19 | 90 | $10^7$ | 0.01 | 700 | Delamination | Cohesive failure |
| Sample 16 | 25 | 85 | $10^7$ | 0.01 | 700 | Delamination | Cohesive failure |
| Comp. sample 1 | 18 | 90 | $10^7$ | 0.01 | 1250 | Delamination | Cohesive failure |
| Comp. sample 2 | 18 | 90 | $10^7$ | 0.01 | 80 | Separation | Separation |
| Comp. sample 3 | 27 | 85 | $10^7$ | 0.01 | 700 | Delamination | Cohesive failure |
| Comp. sample 4 | 55 | 60 | $10^7$ | 0.01 | 700 | Delamination | Cohesive failure |
| Comp. sample 5 | 55 | 92 | $10^{13} \leq$ | $2.0 \leq$ ( ) | 600 | Delamination | Cohesive failure |
| Comp. sample 6 | 25 | 92 | $10^{13} \leq$ | 10 | 600 | Delamination | Cohesive failure |

Peeling modes***
Cohesive failure: Internal breakage of the heat sealant layer
Delamination: Separation of the heat sealant layer and the intermediate layer
Separation: Separation of the heat sealant layer from the container As is obvious from Table 1-7, the adhesive strength between Comparative sample 1 and the PVC carrier tape is excessively high, and the film forming property of Comparative sample 1 is unsatisfactory.

The adhesive strength of between Comparative sample 2 and the PVC carrier tape is excessively low, blocking occurred in the intermediate layer of Comparative sample 3. Comparative sample 4 is inferior in transparency, and Comparative samples 5 and 6 are unsatisfactory in conductivity.

THIRD EXAMPLE

Similarly to Sample 4 of the second embodiment, Samples were fabricated by sequentially forming an intermediate layer, a heat sealant layer and an antistatic layer on one surface of a PET film.

The following three antistatic agents were used.
Antistatic agent A:
"NYUEREGAN A" (cathionic agent) (Nippon Yushi K.K.)
Antistatic agent B:
"ELCOM P3501" (Shokubai Kasei Kogyo K.K.)
Antistatic agent C:
"R321" (tin-doped UV setting type) (Sumitomo Semento K.K.)

Composition of Antireflection Coating Material

| Magnesium fluoride: | 30 parts by weight |
|---|---|
| Polyester resin: ("BAIRON" commercially available from Toyo-bo K.K., glass transition point: 50° C.) | 20 parts by weight |
| Solvent: (toluene/methylketone = 1/1) | 50 parts by weight |

The antistatic agent was applied to the other surface of the PET film by a gravure reverse process to form a 0.5 μm thick antistatic layer, and then the antireflection coating material was applied to the antistatic layer by a gravure reverse process to form a 0.1 μm thick antireflection film. Thus, laminated structures in Samples 1 to 4 were fabricated.

The surface resistivity and static decay time of Samples 1 to 4 were measured by the same method as those applied to measuring the characteristics of the samples of the first example. Measured results are tabulated in Table 1-8.

TABLE 1-8

| Covering structure | antistatic agent | Antireflection film | Surface resistivity (Ω) | Static decay time (sec) | Reflection from the surface |
|---|---|---|---|---|---|
| Sample 1 | A | Provided | $10^9$ | 0.1 | No reflection |
| Sample 2 | B | Provided | $10^9$ | 0.1 | No reflection |
| Sample 3 | C | Provided | $10^8$ | 0.1 | No reflection |
| Sample 4 | C | Not provided | $10^8$ | 0.1 | No reflection |

As is obvious from Table 1-8, the antistatic performance of Samples 1 to 4 provided with the antistatic layer was satisfactory. The antireflection films of Samples 1 to 3 prevented surface reflection, irregular reflection and the reflection of a light source on the laminated structures.

FOURTH EXAMPLE

Similarly to the samples of the first example, laminated structures in Samples 1 to 16 and Comparative samples 1 and 2 each having a multilayer construction of biaxially oriented PET layer/adhesive layer/intermediate layer/heat sealant layer/bisammonium organic sulfur semiconductor layer. The composition of the resin for forming intermediate layers was 40% L•LDPE and 60% S•B copolymer.

Similarly to the samples of the first example, the laminated structures thus fabricated were heat-sealed to PVC carriers with a heat-sealing bar under heat-sealing conditions of 150° C., 0.5 Sec and 3.p kgf/cm². The laminated structures heat-sealed to the PVC carrier tapes were subjected to peel tests to measure its adhesive strength and to determine zip-up.

TABLE 1-9

| | Heat sealant layer | Additive Substance | Particle size | Content (*) | Zip-up (g/2 mm) |
|---|---|---|---|---|---|
| Sample 1 | Urethane-vinyl chloride/acetate (40%:60%) | Silica | 0.01 μm | 100 | 15 |
| Sample 2 | Urethane-vinyl chloride/acetate (40%:60%) | $Al_2O_3$ | 0.02 μm | 100 | 20 |
| Sample 3 | Urethane-vinyl chloride/acetate (40%:60%) | Barium sulfide | 0.1 μm | 100 | 20 |
| Sample 4 | Urethane-vinyl chloride/acetate (40%:60%) | Acrylate beads | 10 μm | 100 | 35 |
| Sample 5 | Urethane-vinyl chloride/acetate (40%:60%) | Polyetlylen particles | 1 μm | 100 | 30 |
| Sample 6 | Urethane-vinyl chloride/acetate (40%:60%) | Polyester beads | 20 μm | 100 | 40 |
| Sample 7 | Urethane-vinyl chloride/acetate (40%:60%) | Polyester beads | 5 μm | 100 | 30 |
| Sample 8 | Urethane-vinyl chloride/acetate (40%:60%) | Silica | 0.01 μm | 1 | 50 |
| Sample 9 | Urethane-vinyl chloride/acetate (40%:60%) | Silica | 0.01 μm | 200 | 10 |
| Sample 10 | Vinyl chloride/acetate | Silica | 0.01 μm | 100 | 20 |
| Sample 11 | Polyester I | Silica | 0.01 μm | 100 | 15 |
| Sample 12 | Polyacrylate | Silica | 0.01 μm | 100 | 10 |
| Sample 13 | Polystyrene | Silica | 0.01 μm | 100 | 20 |
| Sample 14 | Polypropylene | Silica | 0.01 μm | 100 | 40 |
| Sample 15 | Ethylene-vinyl acetate | Silica | 0.01 μm | 100 | 10 |
| Sample 16 | Polyacrylate-vinyl chloride/acetate (40%:60%) | Silica | 0.01 μm | 100 | 30 |
| Comp. sample 1 | Urethane-vinyl chloride/acetate (40%:60%) | Silica | 0.01 μm | 0.5 | 60 |
| Comp. sample 2 | Urethane-vinyl chloride/acetate (40%:60%) | Silica | 0.01 μm | 220 | 5 |

(*) Parts by weight per 100 parts by weight of resin

As shown in Table 1-9, zip-ups for Samples 1 to 16 were as small as 50 g/2 mm or below. The zip-up for Comparative sample 1 was greater than 50 g/2 mm. Although the zip-up for Comparative sample 2 is small, the transparency of Comparative sample 2 was unsatisfactory.

As is apparent form the foregoing description, according to the present invention, the antistatic layer of the antistatic material containing the bisammonium organic sulfur semiconductor as a principal component is formed on one surface of the heat sealant layer to provide the laminated structure with a satisfactory antistatic property which is not affected by moisture, and the oriented resin layer is formed on the other surface of the heat sealant layer. The covering structure and the pouch formed by processing the laminated structure of the present invention have an excellent antistatic characteristic and are capable of preventing the qualitative deterioration and the breakage of the contents by static electricity. When peeling the covering structure from a synthetic resin container, the laminated structure is delaminated between the oriented resin layer and the heat sealant layer or the heat sealant layer is broken internally due to cohesive failure. Thus, the high adhesion of the heat sealant layer can be maintained, and the covering structure can properly be peeled off from the synthetic resin container. Therefore, conditions for heat-sealing the covering structure to the synthetic resin container can easily be determined. Since the antistatic layer is transparent, the visibility of the contents of the synthetic resin container and the pouch is satisfactory.

Second Embodiment

A second embodiment of the present invention will be described hereinafter with reference to the accompanying drawings.

Figure 14:
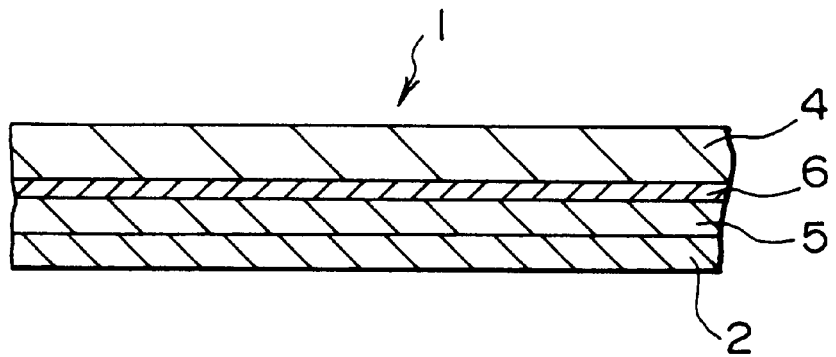
FIG. 14 is a typical sectional view of a laminated structure in a second embodiment according to the present invention.
Figure 15:
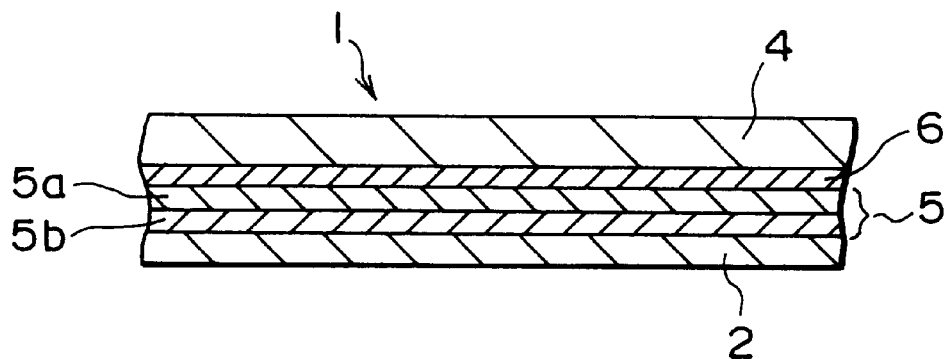
FIG. 15 is a typical sectional view of a laminated structure in a modification of the laminated structure of FIG. 14.

FIG. 14 is a typical sectional view of an example of a laminated structure (covering structure) of the present invention. Referring to FIG. 14, a laminated structure 1 of the present invention is fabricated by sequentially stacking a heat-resistant base layer 4, an adhesive layer 6, an intermediate layer 5 and a heat sealant layer 2 in that order.

The laminated structure (covering structure) of the present invention has an initial impact strength P as measured by a loop stiffness test method in the range of 5 g to 20 g, and a stiffness f not higher than the initial impact strength P and meeting expressions: $f=-at+b$ and $0 \leq a \leq 0.1$, where a and b are constants, and t ($t \leq 3$ min) is time elapsed after the start of measurement of stiffness f.

In the loop stiffness test method, a 25 mm wide sample is looped in a loop length of 62 mm under a tension of 20 g, the sample is pushed in at a pushing speed of 3.5 mm/sec by a distance of 5 mm. The diameter of the surface of a pushing jig in contact with the sample is 25.4 mm.

The initial impact strength P represents the resilience of the loop-shaped laminated structure (covering structure) against an external force applied to the laminated structure. The stiffness f represents the restoring force of a pushed loop-shaped laminated structure (covering structure) and is equal to or lower than the initial impact strength P. A laminated structure having a high initial impact strength P and a high stiffness f is highly firm. If the stiffness f is higher than the initial impact strength P, the laminated structure (covering structure) is excessively firm, is difficult to bend and difficult to peel off.

The stiffness f varies in proportion to time t elapsed after the start of measurement as expressed by the foregoing expression. If the proportional constant a is 0.1 or above, the stiffness f decreases sharply with time t, which signifies that the laminated structure (covering structure) has a low restoring force and unable to restore its original shape when depressed by an external force. Such a laminated structure (covering structure) is infirm and the zip-up will exceeds a standard upper limit zip-up of 50 g/2 mm even if 5 g≦P≦20 g.

A laminated structure (covering structure) having an initial impact strength P below 5 g has a low resilience against an external force and is infirm. Therefore, the zip-up exceeds the upper limit of 50 g/2 mm. A laminated structure (covering structure) having an initial impact strength P exceeding 20 g has an excessively high rigidity, is difficult to bend and difficult to peel from a synthetic resin container. In some cases, a laminated structure (covering structure) having an initial impact strength P exceeding 20 g is excessively thick, difficult to heat-seal at a low temperature.

The component layers of the laminated structure (covering structure) 1 of the present invention will be described hereinafter.

(1) Heat-resistant Base Layer 4

The heat-resistant base layer 4 may be a uniaxially oriented or biaxially oriented film of a polyester resin, such as polyethylene terephthalate (PET) or polyethylene naphthalate (PEN), a polyolefin resin, such as polypropylene, a polyamide resin, such as nylon, a polycarbonate, a polyimide (PI), polyphenylene sulfide (PPS), polyarylate (PA), polyester ether (PEE), polyether ether ketone (PEEK), polyether imide (PEI), polyphenylene sulfide (PPS), polyamidimide (PAI), any one of all aromatic polyamides (APA), polyparabanic acid resin (PPA), polyoxadiazole (POD), polyhydantoin (PHY) or such. The heat-resistant base layer provides the laminated structure (covering structure) with a heat-resistant property. The thickness of the heat-resistant layer may be determined in compliance with the use of the laminated structure. For example, the thickness of the heat-resistant base layer is in the range of about 12 to about 50 $\mu$m.

In the laminated structure 1 shown in FIG. 14, the surface of the heat-resistant base layer 4 on which the adhesive layer 6 is formed may be finished by a surface treatment, such as a corona discharge treatment, a plasma treatment or a sandblasting treatment, to improve the adhesion between the heat-resistant base layer 4 and the adhesive layer 6, if necessary. The same surface of the heat-resistant base layer 4 may be processed by an antistatic treatment, if necessary.

(2) Adhesive Layer 6

The adhesive layer 6 may be a layer of a low-density polyethylene resin, an ethylene-α·olefin copolymer of a density in the range of 0.915 to 0.940 g/cm³, a polyethylene-vinyl acetate copolymer, an ionomer, polypropylene, an ethylene-methacrylic acid copolymer, an ethylene-acrylic acid copolymer or a denatured substance, such as a polyolefin resin, polyethylene imine resin, a polybutadiene resin, an organic titanium compound, an isocyanate resin, a polyester urethane resin or a polyether urethane resin, obtained by denaturing any one of the foregoing substances.

Preferably, the adhesive layer 6 is formed of a two-part adhesive, which is capable of enhancing the stiffness of the laminated structure 1, has heat-resistant adhesion, is easy to manufacture and to process and capable of hardening the resin at a low temperature in the range of 30 to 40° C.

Suitable materials as the resin, i.e., the main part, of the two-part adhesive are a polyesterpolyol synthesized from a diol, such as ethylene glycol, diethylene glycol, dipropylene glycol, 1,4-butanediol, 1,6-hexanediol or neopentyl glycol, and a dibasic acid, such as adipic acid, azelaic acid, sebacic acid, isophthalic acid or terephthalic acid, denatured polyester polyol, a polyether polyol, such as polyethylene glycol, diethylene glycol, polyoxypolypropylene glycol or polytetramethylene ether glycol, denatured polyether polyol, and a low molecular weight polyol, such as ethylene glycol, diethylene glycol, dipropylene glycol, 1,4-butane diol, 1,6-hexane diol, neopentyl glycol or trimethylolpropane.

Suitable materials as the accelerator of the two-part adhesive are a urethane prepolymer produced by mixing an isocyanate monomer, such as tolylenediisocyanate, diphenylmethane diisocyanate, hexamethylene diisocyanate, isoholin diisocyanate, tris(isocyanate phenyl) or methane-tris(isocyanate phenyl) thiophosphate, and trimethylol propane, and denatured isocyanates such as hexamethylene diisocyanate and diisocyanate trimer.

When forming the adhesive layer 6 with the two-part adhesive supplied in such a resin and such an accelerator, it is preferable that the resin-to-accelerator mixing ratio is greater than the ordinary resin-to-accelerator mixing ratio to form an adhesive layer capable of enhancing the stiffness of the laminated structure 1. More concretely, a desirable resin-to-accelerator mixing ratio is in the range of 100:10 to 100:70. If the resin-to-accelerator mixing ratio is large, the crosslinking density of the adhesive layer 3 increases and, consequently, an adhesive layer having a high rigidity and a large Young's modulus is formed to enhance the stiffness of the laminated structure. If the resin-to-accelerator ratio is increased beyond the upper limit of the foregoing range of resin-to-accelerator ratio, there is a tendency that the crosslinking density becomes excessively large, the cohesion of the adhesive layer increases and the adhesion of the adhesive layer decreases.

A desirable thickness of the adhesive layer 6 is in the range of 5 to 80 $\mu$m. The adhesive layer 3 may be formed on a film forming the heat-resistant base layer by coating or extrusion, and the intermediate layer 4 may be laminated to the adhesive layer 3 by dry lamination or extrusion lamination.

The adhesive layer 6 may contain 1 to 300 parts by weight of particles, such as inorganic particles, organic particles or organic spherical beads, per 100 parts by weight of a thermoplastic resin to secure a high stiffness and to reduce zip-up. The effect of the particles is insufficient if the particle content of the adhesive layer 6 is less than 1 part by weight per 100 parts by weight of the thermoplastic resin. The adhesive layer 6 is unable to secure desirable transparency, which will be described later, if the particle content is greater than 300 parts by weight per 100 parts by weight of the thermoplastic resin. The material and the particle size of the inorganic pargicles, the organic particle or the organic spherical beads are similar to those of the inorganic pargicles, the organic particle or the organic spherical beads to be contained in the intermediate layer 4, which will be described later.

(3) Intermediate Layer 5

The intermediate layer 5 of the laminated structure 1 of the present invention may be of either a single-layer construction or a multilayer construction, and may be similar to the intermediate layer of the laminated structure in the first embodiment.

Preferably, the intermediate layer 5 contains 1 to 300 parts by weight of particles, such as inorganic particles, organic particles or organic spherical beads per 100 parts by weight of a thermoplastic resin to secure stiffness. The effect of the particles is insufficient if the particle content of the intermediate layer 5 is less than 1 part by weight per 100 parts by weight of the thermoplastic resin. The intermediate layer 5 is unable to secure desirable transparency if the particle content is greater than 300 parts by weight per 100 parts by weight of the thermoplastic resin. The primary particle size of the inorganic particles, the organic particles or the organic spherical beads is in the range of about 0.001 to about 200 μm, preferably, in the range of about 0.01 to about 10 μm. The inorganic particles, the organic particles or the organic spherical beads contained in the heat sealant layer reduces the expansion and contraction of the thermoplastic resin caused by heat and pressure applied thereto during heat-sealing, and reduces residual stress remaining in the thermoplastic resin forming the heat sealant layer. The strength (particularly, shearing strength and tensile elongation) of the heat sealant layer containing the particles is lower than that of a heat sealant layer formed only of the thermoplastic resin, and it is expected that the heat sealant layer, when heat-sealed, has a low adhesion and reduces zip-up.

The inorganic particles may be one or more of $SiO_2$, $Al_2O_3$, $TiO_2$, $Fe_2O_3$, ZnO, $SnO_2$, $CeO_2$, NiO, PbO, $S_2Cl_2$, $SnCl_2$, $ZnCl_2$, $FeCl_2$, $CaCO_3$, $MgCO_3$, $B_2O_3$, hydrous silicic anhydrate, hydrous calcium silicate, hydrous aluminum silicate, aluminum silicate, magnesium silicate, calcium silicate, barium sulfate, lead sulfate, strontium sulfate and aluminum hydroxide. The organic particles and the organic beads may be one or more than one of acrylic resins, polyolefin resins, polystyrene resins and polyester resins.

(4) Heat Sealant layer 2

The heat sealant layer 2 of the laminated structure (covering structure) 1 of the present invention may be the same one as that of the first embodiment.

The rigidity, the Young's modulus and the stiffness of the heat sealant layer 2 can be enhanced by adding a hardener capable of being used for forming the adhesive layer 6 to a thermoplastic resin forming the heat sealant layer 2. A desirable hardener content of the thermoplastic resin is in the range of 0.5 to 30% by weight. The addition of such a hardener to the heat sealant layer 2 improves the heat resistance of the heat sealant layer 2 and provides the heat sealant layer 2 with an antiblocking property.

The thickness of the heat sealant layer 2 is in the range of 0.1 to 60 μm, preferably, in the range of 0.5 to 30 μm. It is difficult to form the heat sealant layer 2 in a thickness less than 0.1 μm. If the thickness of the heat sealant layer 2 is greater than 60 μm, the laminated structure is excessively thick, excessively firm and difficult to handle, increases the amount of heat necessary for heat-sealing a covering structure formed by processing the laminated structure, makes high-speed heat-sealing impossible, and reduces productivity.

The heat sealant layer 2 may be a film attached to the intermediate layer 5 or may be formed by applying a molten material or a solution prepared by dissolving a material in a solvent to the intermediate layer 5.

Figure 16:
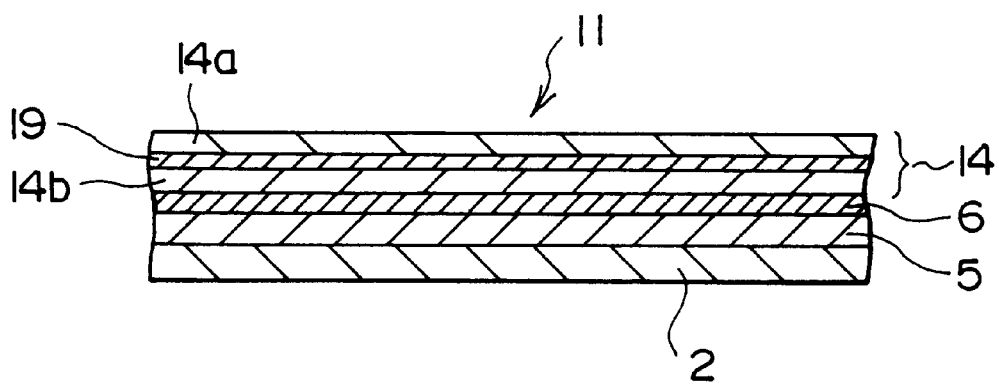
FIG. 16 is a typical sectional view of a laminated structure in a modification of the laminated structure of FIG. 14.

FIG. 16 is a typical sectional view of a laminated structure in a modification of the laminated structure of FIG. 14. Referring to FIG. 16, a laminated structure 11 is fabricated by sequentially stacking a multilayer heat-resistant base layer 14, an adhesive layer 16, an intermediate layer 5 and a heat sealant layer 2 in that order. In this laminated structure (covering structure) 11, the multilayer heat-resistant base layer 14 is constructed by laminating a first heat-resistant layer 14a, a second heat-resistant layer 14b and an additional adhesive layer 19. This multilayer structure of heat-resistant resin layers provides the laminated structure (covering structure) 11 with a high stiffness. The heat-resistant base layer 14 may be a multilayer film formed by laminating two or more resin films similar to the resin film forming the heat-resistant base layer 4 of the foregoing laminated structure (covering structure) 1 with an adhesive or a multilayer film formed by coextrusion. The component layers of the heat-resistant base layer 14 may be the same resin films or different resin films. A desirable thickness of each component layer of the multilayer heat-resistant base layer 14 is in the range of about 3 to about 35 μm, and the thickness of the multilayer heat-resistant base layer 14 may be in the range of about 12 to about 50 μm. The additional adhesive layer 19 for laminating the films to construct the multilayer film may be the same adhesive as that forming the adhesive layer 6 of the foregoing laminated structure (covering structure) 1.

The adhesive layer 6, the intermediate layer 5 and the heat sealant layer 2 of the laminated structure (covering structure) 11 can be formed by the same methods as those of forming the adhesive layer 6, the intermediate layer 5 and the heat sealant layer 2 of the laminated structure (covering structure) 1, and hence the description thereof will be omitted.

An antistatic property may be given to the laminated structure and the covering structure of the present invention by any one of the following methods.

A method ① which forms the heat sealant layer of a material containing an antistatic agent, such as a metal oxide having electric conductivity, carbon or a surface active agent, a method ② which coats a surface of the heat sealant layer opposite the surface the same contiguous with the intermediate layer with an antistatic layer of a metal oxide having electric conductivity, carbon or a surface active agent and a method ③ which adds an antistatic agent, such as a metal oxide having electric conductivity, carbon or a surface active agent, to at least one of the heat-resistant base layer, the adhesive layer and the intermediate layer.

Possible antistatic agents are conductive powders of a particle size in the range of 0.01 to 1 μm of metal oxides, such as lead oxide, indium oxide and zinc oxide, having electric conductivity, conductive carbon, surface active agents and bisammonium organic sulfur semiconductors.

More specifically, the following antistatic agents may be used.

(1) Conductive carbon including ketchen black, acetylene black and furnace black, having a particle size in the range of 20 to 150 μm and a surface area of 60 $m^2$/g or above (2) Conductive powders of metal oxides including lead oxide, indium oxide and zinc oxide, metal sulfides or conductive substances obtained by making metal sulfates conductive by doping or the like, having a particle size in the range of 0.01 to 1 μm (3) Particles of metals including copper, iron, aluminum, nickel and gold, having a particle size in the range of 0.01 to 10 μm or fine powders containing a fibrous metal as a principal component (4) Anionic, cationic, nonionic and amphoteric surface active agents Suitable anionic surface active agents are sulfated oils, soaps, sulfated ester oils, sulfated amide oils, olefin sulfates, fatty alcohol sulfates, alkylsulfates, fatty acid ethyl sulfonates, alkyl sulfonates, alkylbenzene sulfonates, a mixture of naphthalene sulfonic acid and formalin, succinic ester sulfonate and phosphates.

Suitable cationic surface active agents are primary amines, tertiary amines, quaternary ammonium compounds and pyridine derivatives.

Suitable nonionic surface active agents are partial fatty acid esters of polyhydric alcohols, ethylene oxide adducts of fatty alcohols, ethylene oxide adducts of fatty acids, ethylene oxide adducts of fatty amines or fatty acid amides, ethylene adducts of alkylphenols, ethylene oxide adducts of alkylnaphthol and ethylene oxide adducts of partial fatty acid esters of polyhydric alcohols.

Suitable amphoteric surface active agents are carboxylic acid derivatives and imidazoline derivatives.

(5) Fatty acid derivatives, partial hydrolysates of four-functional-group silicon, bisammonium organic sulfur semiconductors.

When forming the heat sealant layer containing an antistatic agent by the method ①, a preferable antistatic agent content is in the range of 1 to 300 parts by weight per 100 parts by weight of a thermoplastic resin. A preferable antistatic agent content is in the range of 1 to 300 parts by weight per 100 parts by weight of a thermoplastic resin also when adding an antistatic agent to at least the heat-resistant base layer, the adhesive layer or the intermediate layer by the method ③. A preferable thickness of an antistatic layer formed by applying an antistatic agent to a surface of the heat sealant layer opposite the surface the same contiguous with the intermediate layer by the method ② is in the range of about 0.2 to about 20 μm.

In the laminated structure (covering structure) thus provided with an antistatic property, it is preferable that the surface on the side of the heat sealant layer has a surface resistivity of $10^{12}$ Ω/□ or below at 22° C. and 90% RH, and the static decay time necessary for reducing a charge of 5000 V by 99% at 23±5° C. and 12±3% RH is 2 sec or below.

The laminated structure (covering structure) of the present invention will be described in further detail in connection with concrete examples thereof.

(1) Materials

① Heat-resistant Base Layer

The following films were prepared for forming the heat-resistant base layer.

Resin Films

PET: Biaxially oriented polyethylene terephthalate films, "ESUPETTO", Thickness (μm) 3, 6, 12, 16, 25, 31 Commercially available from Toyo-bo K.K.

ON: Biaxially oriented nylon film
"BONIRU BN-W", Thickness: 10 μm, Commercially available from K.K. Kojin PC: Polycarbonate film
"MAKUROHORU N Type", Thickness: 20 μm, commercially available from Baieru K.K.

② Adhesive Layer

Two adhesives were prepared for forming the adhesive layer.

Adhesives

Two-part Adhesive

Resins: Ester resin, Ether resin, acrylic resin, epoxy resin, polyimide resin

Hardener: Diphenylmethane diisocyanate

Adhesive resin

Maleic anhydride graft polyethylene ionomer ("HAIMIRAN", commercially available from Mitsui•Du Pont Chemical K.K.)

③ Intermediate Layer

The following resins and films were prepared for forming the intermediate layer.

Resins and Films for Intermediate layer

Intermediate Layer I

A resin was prepared by mixing 30% by weight of linear low-density polyethylene (L•LDPE), and 70% by weight of styrene-butadiene copolymer (S•B copolymer) containing 70 to 90% by weight of styrene and 30 to 10% by weight of butadiene, and the resin was subject to an inflation molding process to form a 30 μm thick film.

L•LDPE: "URUTOZEKUSU 3550A", Density: 0.935 g/cm$^3$, commercially available from Mitsui Sekiyu Kagaku Kogyo K.K.

S•B copolymer: "ASAFUREKKUSE 810", commercially available from Asahi Kasei Kogyo K.K.

Intermediate Layer II

Ionomer: "HAIMIRAN AM-7902-1", 30 μm thick, commercially available from Mitsui•Du Pont Chemical K.K.

Intermediate Layer III

Ethylene-vinyl acetate copolymer: "NUC-3808", 30 μm thick, commercially available from Nippon Yunika K.K.

Intermediate Layer IV

Saturated polyester resin: Saturated PET, 30 μm thick, commercially available from Toyo-bo K.K.

④ Heat Sealant Layer

Coating liquids of the following compositions were prepared for forming the heat sealant layer.

Coating Liquids for Forming Heat Sealant Layer

Coating Liquid A

Vinyl chloride-vinyl acetate copolymer (50 parts by weight)

"BINIRAITO VAGH", commercially available from Union Carbide Co.

Conductive powder (50 parts by weight)

"Conductive powder T-1, 0.05 μm particle size, commercially available from Mitsubishi Materiaru K.K.

Coating Liquid B

Urethane resin: (20 parts by weight)

"NIPPORAN 5120", commercially available from Nippon Poriuretan KOGYO K.K.

Vinyl chloride-vinyl acetate copolymer (80 parts by weight)

"BINIRAITO VAGH", commercially available from Union Carbide Co.

⑤ Antistatic Agent

Two types of antistatic agents were used.

Bisammonium organic sulfur semiconductor, commercially available from K.K. Boron Intanashonaru Antistatic surface active agent "EREKUTOROSUTORIPPA", commercially available from K.K. Kao ⑥ Particles Inorganic particles and organic particles were used.

Inorganic particles

Alumina: Mean particle size: 0.01 μm

Silica: Mean particle size: 5.0 μm

Conductive tin oxide: Mean particle size: 0.02 μm

Organic particles

Acrylic resin beads: Mean particle size: 10 μm

Polyester resin beads: Mean particle size: 20 μm (2) Fabrication of Laminated Structure (Covering Structure)

Covering structures provided with a multilayer heat-resistant base layer (Samples 1 to 10, Table 4), covering structures respectively provided with adhesive layers of different resin-hardener mixing ratios (Samples 11 to 22, Table 5) and covering structures containing particles at least in an adhesive layer, an intermediate layer or a heat sealant layer (Samples 23 to 49, Table 6) were fabricated by the following procedures.

① Multilayer Heat-resistant Base Layer (Samples 1 to 10)

When forming a multilayer heat-resistant base layer, the two-part adhesive (resin/hardener=9/1) was spread in a 2 mm thick adhesive layer by a gravure reverse process, and the component layers were laminated by a dry lamination process. The resin of the two-component adhesive forming the adhesive layer was the same as that of adhesive layers shown in Table 4.

② Formation of Adhesive Layer and Intermediate Layer (All samples)

1) The two-part adhesive prepared by mixing the resin and the hardener was spread in a dry thickness in the range of 5 to 10 μm over the heat-resistant base layer by a gravure reverse process, and then the intermediate layer I was laminated to the heat-resistant base layer by a dry lamination process to construct a laminated structure of heat-resistant base layer/adhesive layer/intermediate layer I.

2) The intermediate layer I and the heat-resistant layer were bonded together with a 15 μm thick adhesive layer of the adhesive resin by a thermal extrusion lamination process to construct a laminated structure of heat-resistant base layer/adhesive layer/intermediate layer I.

3) The same adhesive as that used for forming the multilayer heat-resistant layer was spread in a dry thickness in the range of 5 to 10 μm over the heat-resistant layer by a gravure reverse process, the intermediate layer I was bonded to the heat-resistant layer by the adhesive layer by a dry lamination process to construct a laminated structure of heat-resistant layer/adhesive layer/intermediate layer I.

4) When laminating the intermediate layer II (III, IV) to the heat-resistant layer, the adhesive was spread in a dry thickness in the range of 5 to 10 μm over the heat-resistant base layer by a gravure reverse process, and then the intermediate layer II of 30 μm in thickness was formed over the adhesive layer by a thermal extrusion lamination process to construct a laminated structure of heat-resistant base layer/adhesive layer/intermediate layer II (III, IV).

③ Formation of Heat Sealant Layer (All samples)

A 2 μm thick heat sealant layer was formed by coating the surface of the intermediate layer of the laminated structure of heat-resistant layer/adhesive layer/intermediate layer with the coating liquid A or the coating liquid B.

The heat sealant layer of the coating liquid B was coated with an antistatic layer formed by applying an antistatic agent (bisammonium organic sulfur semiconductor) by a gravure reverse process in a coating weight of 0.5 g/m². In a covering structure in Sample 22, a heat sealant layer was formed by spreading the coating liquid B, and an antistatic surface active agent (coating liquid C in Table 5) was spread on the heat sealant layer to form an antistatic layer. In a covering structure in Comparative sample 5, a heat sealant layer was formed by spreading the coating liquid B and any antistatic layer (coating liquid D in Table 5) was not formed on the heat sealant layer.

④ Formation of Adhesive Layer, Intermediate Layer and Heat Sealant Layer Containing Fine Particles (Samples 23 to 49)

1) Adhesive layer: When a two-part adhesive was used for forming an adhesive layer, 50 to 100 parts by weight of particles per 100 parts by weight of the resin was added to the liquid two-part adhesive, and the adhesive layer was formed by a dry lamination process.

When an adhesive resin was used for forming an adhesive layer, an adhesive mixture was prepared by mixing 30 to 50 parts by weight of particles and 100 parts by weight of the adhesive resin, and the adhesive layer was formed by thermal extrusion lamination.

2) Intermediate layer: An adhesive mixture was prepared by mixing 100 parts by weight of a resin for forming the intermediate layer and 50 parts by weight of particles by a dry blending process, and an intermediate layer was formed by a thermal extrusion lamination process.

3) Heat sealant layer: Mixtures of the coating liquids A and B, and 1 to 300 parts by weight of particles per 100 parts by weight of the thermoplastic resin were spread to form heat sealant layers containing particles.

(3) Evaluation of Laminated Structures (Covering Structures

① Measurement of Peel Strength and Zip-up

1) Peel Strength

The covering structures were heat-sealed to carrier tapes of a polycarbonate resin containing conductive carbon, and the covering structures were peeled from the carrier tapes under the following conditions. The mean of a maximum peel strength and a minimum peel strength was used as a peel strength. Measured results are tabulated in Tables 2-1 to 2-3.

Sealing conditions

Temperature: 130° C., Pressure: 2.0 kgf/cm², Heating time: 0.5 sec

Peeling conditions

Width of covering structure : 15 mm, Peeling angle: 1800, Peeling rate: 300 mm/min 2) Zip-up The covering structures were heat-sealed to carrier tapes of a polycarbonate resin containing conductive carbon under the conditions for 1), and the covering structures were peeled from the carrier tapes under the following conditions. The difference between a maximum peel strength and a minimum peel strength was used as a zip-up. Measured results are tabulated in Tables 2-1 to 2-3.

Peeling conditions

Width of covering structure: 2 mm, Peeling angle: 180°, Peeling rate: 300 mm/min ② Measurement of Stiffness Initial impact strength P (g), and the stiffness f at moments three minutes, five minutes and ten minutes after the start of measurement of the laminated structures (covering structures) were measured under the following conditions. A sample of 62 mm in loop length is pushed in by 5 mm at a moment when time t (min)=0, and a maximum stiffness among those measured in a period between t=0 and t=30 was used as an initial impact strength P.

Loop conditions

Sample width: 25 mm

Loop length: 62 mm

Sample tension during loop formation: 20 G

Pushing conditions

Pushing rate: 3.5 mm/sec

Pushing length: 5 mm

Diameter of pushing jig: 25.4 mm

The relation expressed by f=at+b between the stiffness f and time t (min) elapsed from the start of measurement was determined by processing values of stiffness f at moments three minutes, five minutes and ten minutes after the start of measurement by a least square method and proportional constant a was determined. Results are tabulated in Tables 2-1 to 2-3, in which the proportional constant is −a.

③ Measurement of Surface Resistivity

Surface resistivities of the laminated structures (covering structures) were measured at 23° C. and 60% RH by "HAIRESUTA IP" (Mitsubishi Kagaku K.K.), in which 10 V was applied to the samples. Measured results are tabulated in Tables 2-1 and 2-2.

④ Measurement of Static Decay Time

Static decay time, i.e., a time necessary for reducing a charge of 5000 V by 99% at 23±5° C. and 12±3% RH, was measured by a method specified in MIL-B-81705C. Measurement used "STATIC DECAY METER-406C" of ETS Inc. (Electro-Tech Systems Inc.). Measured results are tabulated in Tables 2-1 and 2-2.

(4) Examination of the Measured Results
① Covering Structure Provided with Multilayer Heat-resistant Base Layers (Samples 1 to 10)

TABLE 2-1(1)

| Covering structure | Construction of the heat-resistant base layer Outer surface←→Intermediate layer | Principal component of the adhesive *1 | Intermediate layer | Heat sealant layer *2 | Surface resistivity (Ω/□) | Static decay time (sec) |
|---|---|---|---|---|---|---|
| Sample 1 | PET(6)/PET(6) | Polyester | Intermediate layer 1) | Coating liquid B | $10^8$ | 0.01 |
| Sample 2 | PET(3)/PET/(3)/PET(3) | Polyester | Intermediate layer 1) | Coating liquid B | $10^8$ | 0.01 |
| Sample 3 | PET(6)/PET/(6)/PET(6) | Polyester | Intermediate layer 1) | Coating liquid B | $10^8$ | 0.01 |
| Sample 4 | PET(12)/PET/(6) | Polyester | Intermediate layer 1) | Coating liquid B | $10^8$ | 0.01 |
| Sample 5 | PET(6)/PET/(6)/PET(6) | Polyether | Intermediate layer 1) | Coating liquid A | $10^7$ | 0.01 |
| Sample 6 | PET(6)/PET/(6)/PET(6) | polyacrylate | Intermediate layer 1) | Coating liquid A | $10^7$ | 0.01 |
| Sample 7 | PET(6)/PET/(6)/PET(6) | Epoxy resin | Intermediate layer 1) | Coating liquid A | $10^7$ | 0.01 |
| Sample 8 | PET(6)/PET/(6)/PET(6) | Imide resin | Intermediate layer 2) | Coating liquid A | $10^7$ | 0.01 |
| Sample 9 | PET(12)/ON(10) | Polyether | Intermediate layer 3) | Coating liquid A | $10^7$ | 0.01 |
| Sample 10 | PC(20)/PET(3) | Polyether | Intermediate layer 4) | Coating liquid A | $10^7$ | 0.01 |
| Comp. sample 1 | PET 16 | Polyester | Intermediate layer 1) | Coating liquid B | $10^8$ | 0.01 |
| Comp. sample 2 | PET 31 | Polyester | Intermediate layer 1) | Coating liquid A | $10^7$ | 0.01 |

TABLE 2-1(2)

| | Sealing performance | | | Stiffness (Loop stiffness method) | | |
|---|---|---|---|---|---|---|
| Covering structure | Peel strength (g/15 mm) | Zip-up | Peeling mode | Initial impact strength P (g) | Stiffness f (g) | Proportional constant (×10³ g/min) |
| Sample 1 | 500 | 12 | Delamination | 5.5 | 4.8 | −24 |
| Sample 2 | 520 | 15 | Delamination | 5.7 | 4.9 | −26 |
| Sample 3 | 400 | 10 | Delamination | 7.7 | 6.2 | −40 |
| Sample 4 | 400 | 10 | Delamination | 6.5 | 5.0 | −35 |
| Sample 5 | 410 | 12 | Delamination | 7.5 | 6.1 | −30 |
| Sample 6 | 420 | 10 | Delamination | 8.0 | 6.3 | −42 |
| Sample 7 | 430 | 6 | Delamination | 8.2 | 6.5 | −45 |
| Sample 8 | 500 | 15 | Delamination | 6.0 | 4.5 | −30 |
| Sample 9 | 600 | 10 | Delamination | 7.8 | 6.0 | −40 |
| Sample 10 | 400 | 5 | Delamination | 15 | 11.0 | −72 |
| Comp. sample 1 | 490 | 55 | Delamination | 4.9 | 4.5 | −21 |
| Comp. sample 2 | 250 | 100 | Cohesive failure | 12 | 9.0 | −65 |

*1 Composition of the adhesive layer is 100 parts by weight of the principal component and 25 parts by weight of the hardening agent.
*2 A bisammonium organic sulfur semiconductor was applied to the heat sealant layer when the heat sealant layer is formed of the coating liquid B.

As is obvious from Table 2-1, Samples 1 to 10 each having the heat-resistant base layer of a two- or three-layer construction have surface resistivities of $10^{12}$ Ω/□ or below, static decay times of 2 sec or below, peel strengths in the range of 100 to 1200 g/15 mm and zip-ups of 50 g/2 mm or below. When Samples 1 to 10 were peeled, delamination occurred between the heat sealant layer and the intermediate layer, and Samples 1 to 10 had a stable peeling characteristic. Samples 1 to 10 had initial impact strengths P as measured by a loop stiffness test method in the range of 5 to 20 g. The stiffness f of each of Samples 1 to 10 varied in proportion to time t, and the proportional constant of an expression representing the relation between the stiffness f and time t met a condition expressed by an inequality: $-0.1 \leq$ (proportional constant) $\leq 0$, which proved that Samples 1 to 10 were moderately stiff.

Comparative sample 1 had an initial impact strength P less than 5 g measured by the loop stiffness test method and a zip-up exceeding 50 g/2 mm. When Comparative sample 1 was peeled, the heat sealant layer broke internally due to cohesive failure, and Comparative sample 1 had an unstable peeling characteristic.

② Covering Structures Respectively Having Adhesive Layers of Two-part Adhesives of Different Compositions (Samples 11 to 22)

TABLE 2-2(1)

| Covering structure | Heat-resistant base layer | Composition of the adhesive layer (Hardening agent content in parts by weight per 100 parts by weight of the principal component) | | Intermediate layer | Heat sealant layer | Surface resistivity (Ω/□) | Static decay time (sec) |
|---|---|---|---|---|---|---|---|
| Sample 11 | PET12 | Polyester | 25 | Intermediate layer 1) | Coating liquid B | $10^8$ | 0.01 |
| Sample 12 | PET16 | Polyester | 25 | Intermediate layer 1) | Coating liquid B | $10^8$ | 0.01 |

TABLE 2-2(1)-continued

| Covering structure | Heat-resistant base layer | Composition of the adhesive layer (Hardening agent content in parts by weight per 100 parts by weight of the principal component) | | Intermediate layer | Heat sealant layer | Surface resistivity ($\Omega/\square$) | Static decay time (sec) |
|---|---|---|---|---|---|---|---|
| Sample 13 | PET16 | Polyether | 25 | Intermediate layer 1) | Coating liquid B | $10^8$ | 0.01 |
| Sample 14 | PET16 | Polyether | 12 | Intermediate layer 1) | Coating liquid B | $10^8$ | 0.01 |
| Sample 15 | PET16 | Polyether | 60 | Intermediate layer 1) | Coating liquid B | $10^8$ | 0.01 |
| Sample 16 | PET16 | Polyacrylate | 25 | Intermediate layer 1) | Coating liquid B | $10^8$ | 0.01 |
| Sample 17 | PET16 | Epoxy resin | 25 | Intermediate layer 1) | Coating liquid B | $10^8$ | 0.01 |
| Sample 18 | PET16 | Imide resin | 25 | Intermediate layer 1) | Coating liquid B | $10^8$ | 0.01 |
| Sample 19 | PET16 | Polyester | 25 | Intermediate layer 1) | Coating liquid A | $10^7$ | 0.01 |
| Sample 20 | PET16 | Polyether | 25 | Intermediate layer 2) | Coating liquid A | $10^7$ | 0.01 |
| Sample 21 | PET16 | Polyether | 25 | Intermediate layer 3) | Coating liquid A | $10^7$ | 0.01 |
| Sample 22 | PC20 | Polyether | 25 | Intermediate layer 4) | Coating liquid C | $10^{12}$ | 1.5 |
| Comp. sample 3 | PET16 | Polyester | 9 | Intermediate layer 1) | Coating liquid B | $10^7$ | 0.01 |
| Comp. sample 4 | PET16 | Polyester | 75 | Intermediate layer 1) | Coating liquid B | $10^7$ | 0.01 |
| Comp. sample 5 | PET16 | Polyester | 25 | Intermediate layer 1) | Coating liquid D | $10^{13}$ | 10.0 |

TABLE 2-2(2)

| | Sealing performance | | | Stiffness (Loop stiffness method) | | |
|---|---|---|---|---|---|---|
| Covering structure | Peel strength (g/15 mm) | Zip-up | Peeling mode | Initial impact strength P (g) | Stiffness f (g) | Proportional constant ($\times 10^3$ g/min) |
| Sample 11 | 520 | 35 | Delamination | 5.0 | 4.0 | −22 |
| Sample 12 | 560 | 15 | Delamination | 6.4 | 5.1 | −45 |
| Sample 13 | 560 | 16 | Delamination | 6.5 | 5.0 | −44 |
| Sample 14 | 550 | 30 | Delamination | 5.2 | 4.1 | −25 |
| Sample 15 | 500 | 6 | Delamination | 15 | 12 | −72 |
| Sample 16 | 520 | 10 | Delamination | 16 | 14 | −75 |
| Sample 17 | 540 | 6 | Delamination | 18 | 15 | −82 |
| Sample 18 | 600 | 10 | Delamination | 8.0 | 6.3 | −50 |
| Sample 19 | 600 | 10 | Delamination | 7.0 | 5.0 | −30 |
| Sample 20 | 700 | 20 | Delamination | 7.2 | 5.1 | −32 |
| Sample 21 | 700 | 20 | Delamination | 8.0 | 6.3 | −50 |
| Sample 22 | 800 | 25 | Delamination | 17 | 13 | −85 |
| Comp. sample 3 | 550 | 75 | Delamination | 4.8 | 3.9 | −20 |
| Comp. sample 4 | 200 | 6 | Separation of the intermediate layer and the adhesive layer | 25 | 20 | −102 |
| Comp. sample 5 | 550 | 30 | Delamination | 5.0 | 4.0 | −22 |

*Layer of coating liquid C is formed by forming a layer of coating liquid B and applying a surface active agent to the layer of coating liquid B. Layer of coating liquid D is formed by forming a layer of coating liquid B.

As is obvious from Table 2-2, Samples 11 to 22 each having the adhesive layer of a two-part adhesive having a resin/hardener ratio in the range of 100/10 to 100/70 have surface resistivities of $10^{12}$ $\Omega/\square$ or below, static decay times of 2 sec or below, peel strengths in the range of 100 to 1200 g/15 mm and zip-ups of 50 g/2 mm or below. When Samples 11 to 22 were peeled, delamination occurred between the heat sealant layer and the intermediate layer, and Samples 11 to 22 had a stable peeling characteristic. Samples 11 to 22 had initial impact strengths P as measured by a loop stiffness test method in the range of 5 to 20 g. The stiffness f of each of Samples 11 to 22 varied in proportion to time t, and the proportional constant of an expression representing the relation between the stiffness f and time t met a condition expressed by an inequality:−0.1≦(proportional constant)±0, which proved that Samples 11 to 22 were moderately stiff.

The ratio of the hardener to the resin of the adhesive layer of Comparative sample 1 is small. Comparative sample 1 had an initial impact strength P less than 5 g measured by the loop stiffness test method and a zip-up exceeding 50 g/2 mm, and Comparative sample 1 had an unstable peeling characteristic.

The ratio of the hardener to the resin of the adhesive layer of Comparative sample 2 is large. Although Comparative sample 2 has a satisfactorily small zip-up, Comparative sample 2 had an initial impact strength P exceeding 20 g measured by the loop stiffness test method. When Comparative sample 2 was peeled, delamination occurred between the adhesive layer and the intermediate layer, which proved that the covering structure in Comparative sample 2 lacks capacity for practical application.

Comparative sample 3 had a surface resistivity exceeding $10^{12}$ $\Omega/\square$ and lacks capacity for practical application.

③ Covering Structures Containing Particles in at Least the Adhesive Layer, the Intermediate Layer or the Heat Sealant Layer (Samples 23 to 49)

TABLE 2-3(1-1)

| Covering structure | Adhesive layer | | | Intermediate layer | | Heat sealant layer | |
|---|---|---|---|---|---|---|---|
| | Type of particles | Composition | Particle content per 100 of principal component | Resin | Particle content per 100 of resin | Coating liquid | Particle content per 100 of resin |
| Sample 23 | Alumina | Two-part | 100 | Intermediate layer 1) | 0 | Coating liquid B | 0 |
| Sample 24 | Silica | Two-part | 100 | Intermediate layer 1) | 0 | Coating liquid B | 0 |
| Sample 25 | Tin oxide | Two-part | 100 | Intermediate layer 1) | 0 | Coating liquid A | 0 |
| Sample 26 | Acrylate beads | Two-part | 50 | Intermediate layer 1) | 0 | Coating liquid B | 0 |
| Sample 27 | Polyester beads | Two-part | 50 | Intermediate layer 1) | 0 | Coating liquid B | 0 |
| Sample 28 | Silica | PE | 30 | Intermediate layer 1) | 0 | Coating liquid B | 0 |
| Sample 29 | Silica | I | 30 | Intermediate layer 1) | 0 | Coating liquid B | 0 |
| Sample 30 | Polyacrylate beads | PE | 50 | Intermediate layer 1) | 0 | Coating liquid B | 0 |
| Sample 31 | Polyester beads | I | 50 | Intermediate layer 1) | 0 | Coating liquid B | 0 |
| Sample 32 | Alumina | Two-part | 0 | Intermediate layer 1) | 50 | Coating liquid B | 0 |
| Sample 33 | Silica | Two-part | 0 | Intermediate layer 1) | 50 | Coating liquid B | 0 |
| Sample 34 | Tin oxide | Two-part | 0 | Intermediate layer 1) | 50 | Coating liquid A | 0 |
| Sample 35 | Polyacrylate beads | Two-part | 0 | Intermediate layer 1) | 50 | Coating liquid B | 0 |
| Sample 36 | Polyester beads | Two-part | 0 | Intermediate layer 1) | 50 | Coating liquid B | 0 |
| Sample 37 | Alumina | Two-part | 0 | Intermediate layer 2) | 50 | Coating liquid B | 0 |

TABLE 2-3(1-2)

| Covering structure | Adhesive layer | | | Intermediate layer | | Heat sealant layer | |
|---|---|---|---|---|---|---|---|
| | Type of particles | Composition | Particle content per 100 of principal component | Resin | Particle content per 100 of resin | Coating liquid | Particle content per 100 of resin |
| Sample 38 | Alumina | Two-part | 0 | Intermediate layer 3) | 50 | Coating liquid B | 0 |
| Sample 39 | Alumina | Two-part | 0 | Intermediate layer 4) | 50 | Coating liquid B | 0 |
| Sample 40 | Alumina | Two-part | 0 | Intermediate layer 1) | 0 | Coating liquid B | 60 |
| Sample 41 | Silica | Two-part | 0 | Intermediate layer 1) | 0 | Coating liquid B | 100 |
| Sample 42 | Tin oxide | Two-part | 0 | Intermediate layer 1) | 0 | Coating liquid A | 80 |
| Sample 43 | Polyacrylate beads | Two-part | 0 | Intermediate layer 1) | 0 | Coating liquid B | 45 |
| Sample 44 | Polyester beads | Two-part | 0 | Intermediate layer 1) | 0 | Coating liquid B | 30 |
| Sample 45 | Tin oxide | Two-part | 0 | Intermediate layer 1) | 0 | Coating liquid A | 5 |
| Sample 46 | Tin oxide | Two-part | 0 | Intermediate layer 1) | 0 | Coating liquid A | 280 |
| Sample 47 | Silica | Two-part | 0 | Intermediate layer 2) | 0 | Coating liquid B | 100 |
| Sample 48 | Tin oxide | Two-part | 0 | Intermediate layer 3) | 0 | Coating liquid A | 80 |
| Sample 49 | Polyester beads | Two-part | 0 | Intermediate layer 4) | 0 | Coating liquid B | 100 |
| Comp. sample 6 | | Two-part | 0 | Intermediate layer 1) | 0 | Coating liquid B | 0 |
| Comp. sample 7 | Tin oxide | Two-part | 0 | Intermediate layer 1) | 0 | Coating liquid A | 0.5 |
| Comp. sample 8 | Tin oxide | Two-part | 0 | Intermediate layer 1) | 0 | Coating liquid A | 305 |

•Construction: Heat-resistant base layer (16 μm thick PET)/Adhesive layer/Intermediate layer (30 μm thick)/Heat sealant layer (2 μm thick)
•Adhesive layer: Adhesive resin and a two-part adhesive, Two-part adhesive of 100 parts by weight of 12 polyester resin and 10 parts by weight of hardener
•Notation: Two-part: Two-part adhesive, PE: Maleic anhydrate graft polyethylene, I: Ionomer

TABLE 2-3(2-1)

| Covering structure | Sealing performance | | | Stiffness | | |
|---|---|---|---|---|---|---|
| | Peel strength (g/15 mm) | Zip-up | Peeling mode | Initial impact strength P (g) | Stiffness f (g) | Proportional constant (×10³ g/min) |
| Sample 23 | 510 | 35 | Delamination | 5.0 | 4.0 | −22 |
| Sample 24 | 520 | 30 | Delamination | 5.2 | 4.1 | −23 |
| Sample 25 | 500 | 35 | Delamination | 6.0 | 4.9 | −25 |
| Sample 26 | 520 | 30 | Delamination | 5.5 | 4.3 | −24 |
| Sample 27 | 500 | 28 | Delamination | 5.8 | 5.0 | −24 |
| Sample 28 | 520 | 32 | Delamination | 6.0 | 5.1 | −26 |
| Sample 29 | 510 | 30 | Delamination | 5.2 | 4.1 | −24 |
| Sample 30 | 530 | 29 | Delamination | 6.0 | 4.9 | −25 |
| Sample 31 | 540 | 30 | Delamination | 5.2 | 4.0 | −24 |
| Sample 32 | 700 | 20 | Delamination | 6.0 | 4.9 | −28 |
| Sample 33 | 700 | 20 | Delamination | 6.2 | 5.2 | −30 |
| Sample 34 | 800 | 25 | Delamination | 5.8 | 4.5 | −25 |

TABLE 2-3(2-1)-continued

| Covering structure | Sealing performance | | | Stiffness | | |
| --- | --- | --- | --- | --- | --- | --- |
| | Peel strength (g/15 mm) | Zip-up | Peeling mode | Initial impact strength P (g) | Stiffness f (g) | Proportional constant (×10³ g/min) |
| Sample 35 | 820 | 25 | Delamination | 5.7 | 4.5 | −26 |
| Sample 36 | 750 | 25 | Separation of the intermediate layer and the adhesive layer | 5.7 | 4.4 | −27 |
| Sample 37 | 880 | 30 | Delamination | 5.4 | 4.8 | −24 |

TABLE 2-3(2-2)

| Covering structure | Sealing performance | | | Stiffness | | |
| --- | --- | --- | --- | --- | --- | --- |
| | Peel strength (g/15 mm) | Zip-up | Peeling mode | Initial impact strength P (g) | Stiffness f (g) | Proportional constant (×10³ g/min) |
| Sample 38 | 900 | 35 | Delamination | 5.1 | 4.0 | −21 |
| Sample 39 | 1000 | 45 | Delamination | 5.0 | 4.1 | −18 |
| Sample 40 | 650 | 16 | Delamination | 6.8 | 5.5 | −38 |
| Sample 41 | 600 | 14 | Delamination | 7.0 | 5.7 | −41 |
| Sample 42 | 550 | 8 | Delamination | 8.0 | 6.0 | −48 |
| Sample 43 | 600 | 10 | Delamination | 7.8 | 5.9 | −50 |
| Sample 44 | 620 | 20 | Delamination | 6.2 | 5.2 | −35 |
| Sample 45 | 490 | 32 | Delamination | 5.2 | 4.0 | −21 |
| Sample 46 | 750 | 6 | Delamination | 7.0 | 5.7 | −40 |
| Sample 47 | 800 | 10 | Delamination | 7.6 | 5.8 | −45 |
| Sample 48 | 750 | 10 | Delamination | 7.7 | 5.8 | −46 |
| Sample 49 | 1020 | 20 | Delamination | 6.4 | 5.2 | −35 |
| Comp. sample 6 | 550 | 75 | Delamination | 4.8 | 3.6 | −20 |
| Comp. sample 7 | 100 | 62 | Delamination | 4.9 | 3.6 | −20 |
| Comp. sample 8 | 800 | 5 | Delamination | 7.8 | 6.0 | −55 |

•Construction: Heat-resistant base layer (16 μm thick PET)/Adhesive layer/Intermediate layer (30 μm thick)/Heat sealant layer (2 μm thick)
•Adhesive layer: Adhesive resin and a two-part adhesive, Two-part adhesive of 100 parts by weight of 12 polyester resin and 10 parts by weight of hardener
•Notation: Two-part: Two-part adhesive, PE: Maleic anhydrate graft polyethylene, I: Ionomer As is obvious from Table 2-3, covering structures in Samples 23 to 31 having adhesive layers containing particles, covering structures in Samples 322 to 39 having intermediate layers containing particles and covering structures in samples 40 to 49 having heat sealant layers containing particles had peel strengths in the range of 100 to 1200 g/15 mm and zip-ups of 50 g/2 mm or below. When Samples 23 to 49 were peeled, delamination occurred between the heat sealant layer and the intermediate layer, which proved that Samples 23 to 49 had a stable peeling characteristic. Samples 23 to 49 had initial impact strengths P as measured by a loop stiffness test method in the range of 5 to 20 g. The stiffness f of each of Samples 23 to 49 varied in proportion to time t, and the proportional constant of an expression representing the relation between the stiffness f and time t met a condition expressed by an inequality: $-0.1 \leq$ (proportional constant) $\leq 0$, which proved that Samples 23 to 49 were moderately stiff.

Comparative sample 1 having the adhesive layer, the intermediate layer and the heat sealant layer not containing particles had an initial impact strength P less than 5 g measured by the loop stiffness test method and a zip-up exceeding 50 g/2 mm. Comparative sample 1 has an unstable peeling characteristic.

Although Comparative sample 2 has the heat sealant layer containing particles, the particle content of the heat sealant layer is excessively small. Comparative sample 2 had an initial impact strength P less than 5 g measured by the loop stiffness test method and a zip-up exceeding 50 g/2 mm. Comparative sample 2 has an unstable peeling characteristic.

Although Comparative sample 3 has the heat sealant layer containing particles, and has a small zip-up and a satisfactory peeling characteristic, the particle content of the heat sealant layer is excessively large, and the covering structure in Comparative sample 3 is unsatisfactory in transparency and lacks capacity for practical use.

As is apparent from the foregoing description, the laminated structures (covering structures) in accordance with the present invention have initial impact strengths P measured by the loop stiffness test method in the range of 5 to 20 g, stiffnesses f varying in proportion to time t (t≧3) elapsed from the start of measurement in a mode expressed by an expression having a proportional constant meeting an inequality: $-0.1 \leq$ (proportional constant) $\leq 0$, and a high stiffness. Accordingly, the covering structures can be peeled with a small zip-up, delamination occurs between the intermediate layer and the heat sealant layer or the heat sealant layer breaks internally due to cohesive failure when the covering structures are peeled. Thus, the heat sealant layer maintains a high adhesion, and the covering structures have a satisfactory peeling characteristic which enables the covering structures to be peeled with a small zip-up. Therefore, conditions for heat-sealing the covering structure to the synthetic resin container can easily be determined and the visibility of the contents of the synthetic resin container covered with the covering structure is satisfactory.

Third Embodiment

Figure 17:
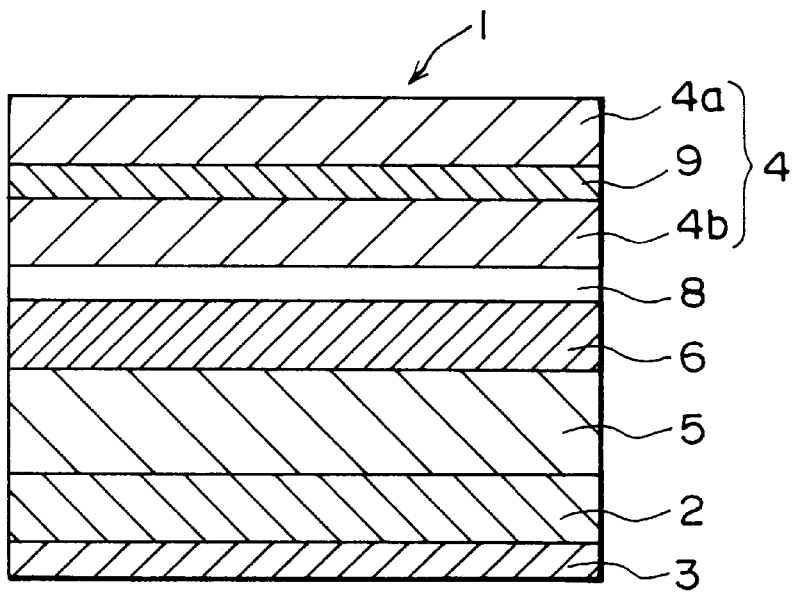
FIG. 17 is a typical sectional view of a covering structure in a third embodiment according to the present invention.

A covering structure formed by processing a laminated structure of the present invention is a cover tape 1 capable of being heat-sealed to a carrier tape, and the cover tape 1 is fabricated by sequentially laminating a two-layer composite base sheet 4 formed by bonding together oriented films 4a and 4a with an additional adhesive layer 9, an anchor coat layer 8, an adhesive layer 6, an intermediate layer 5, a heat sealant layer 2 and an antistatic layer 3 of a material containing a bisammonium orgnic sulfur semiconductor as a principal component as shown in FIG. 17.

The oriented films 4a and 4b are 3 to 25 $\mu$m thick uniaxially or biaxially oriented films of a thermoplastic resin, such as a polyester, such as polyethylene terephthalate or polyethylene napthalate, a polyolefin, such as polypropylene, a polyamide, such as nylon, or a polycarbonate. The surfaces of the oriented films 4a and 4b contiguous with the additional adhesive layer 9 may be finished by a surface treatment, such as a corona discharge treatment, a plasma treatment or a sandblasting treatment, to improve the adhesion between the oriented films 4a and 4b, and the additional adhesive layer 9.

An antistatic agent, such as the surface active agent employed in the first embodiment may be used for an antistatic treatment.

Preferably, the additional adhesive layer 9 uniting together the films 4a and 4b, which may be made of the same or different materials, to construct the composite base sheet 41 is formed of a reactive adhesive.

Suitable resins for forming the thermosetting additional adhesive layer 9 of the present invention are polyester resins, polyether resins, urethane resins, vinyl copolymers, ethylene-acrylic resins, polythiols and epoxy resins, and suitable hardeners for the two-part adhesive are trilene diisocyanate, 4,4'-diphenylmethane diisocyanate, hexamethylene diusocyanate, xylene diisocyanate, naphthylene-1,5-diisocyanate, and polyamine.

Suitable ionizing radiation setting resins are prepolymers having molecules including polymerizing unsaturated bonds or epoxy groups, oligomers, and compositions produced by properly mixing monomers.

The formation of the additional adhesive layer 9 and the lamination of the base sheet 4 and the intermediate layer 5 can be achieved by an ordinary dry lamination process. The additional adhesive layer 9 may be formed by any suitable method, such as a gravure coating method or a roll coating method.

Preferably, the thickness of the additional adhesive layer 9 formed of the reactive adhesive, which is a factor to provide the cover tape 1 with rigidity, is in the range of 1 to 10 $\mu$m, more preferably, in the range of 2 to 5 $\mu$m. If the additional adhesive layer 9 has a thickness of 2 $\mu$m or below, the additional adhesive layer 9 is unable to exercise uniform adhesive strength. If the additional adhesive layer 9 has a thickness of 10 $\mu$m or above, the additional adhesive layer 9 is economically disadvantageous, is excessively rigid and may cause the cover tape 1 crack. If the adhesive layer 9 is excessively thick, the low-temperature heat-sealing property may possibly be deteriorated.

The composite base sheet 4 has a heat-resisting property to prevent the cover tape 1 from being melted or being caused to contract by heat applied to the cover tape 1 by a heat-sealing bar when heat-sealing the cover tape 1 to a carrier tape 31, by the agency of combined actions of the heat-resistant oriented films 4a and 4b, and the additional adhesive layer 9.

It is conjectured that the composite base sheet 4 formed by uniting together the oriented films 4a and 4b with the additional adhesive layer 9, as compared with a single-layer base sheet, has a high rigidity owing to the effect of the additional adhesive layer 9 of the reactive adhesive, is peeled at a stable peeling angle and hence has a small zip-up, i.e., the difference between a maximum and a minimum peel strength resisting against peeling.

A single-layer base sheet having a high rigidity can be formed by employing an oriented film of a big thickness. However, when heat-sealing the cover tape to a carrier tape, the thick base sheet is unable to transfer heat energy required by the heat sealant layer 2 and hence the heat-sealing bar must be heated at an elevated temperature. Consequently, the carrier tape 1 having low heat resistance is subject to deformation and dimensional change, and the position of electronic parts carried by the carrier tape 31 varies when mounting the electronic parts.

A composite base sheet, not shown, in a modification of the composite base sheet 4 may be a multilayer structure consisting of three or more oriented films and adhesive layers. The thickness of the composite base sheet 4, which is dependent on the purpose of the cover tape 1, is in the range of 6 to 100 $\mu$m, preferably, in the range of 20 to 45 $\mu$m. A surface of the composite base sheet 4 serving as the outer surface of the cover tape 1 may be finished by an antistatic treatment using a surface active agent, conductive carbon black, an evaporated metal film, or a conductive film of a metal oxide or the like when necessary to avoid the adhesion of dust and dirt to the surface of the composite base sheet 4 or to prevent the generation of static electricity by friction with external objects.

The composite base sheet 4 and the intermediate layer 5 can be bonded together with the adhesive layer 6 of a reactive adhesive by dry lamination or the single-layer or multilayer intermediate layer 5 can be formed on the anchor coat layer 8 formed on the composite base sheet 4 by extrusion thermal lamination. Generally, the adhesive layer 6 of a thermoplastic resin formed between the composite base sheet 4 and the intermediate layer 5 enables the uniform application of heat and pressure for heat-sealing.

The adhesive layer may 6 be formed of a modified resin obtained by denaturing polyethylene, an ethylene-vinyl acetate copolymer, an ethylene-acrylate copolymer, an ethylene-acrylic ester copolymer, an ionomer or polypropylene, or a blend of some of modified resins of those substances by extrusion thermal lamination or sandwich lamination in a thickness of 60 $\mu$m or below.

It is preferable to form the anchor coat layer 8 (AC layer 8) by thermal extrusion lamination to enhance adhesion between the composite base sheet 4 and the adhesive layer 6 of a thermoplastic resin. The AC layer 8 may be formed of an ordinary adhesive, such as an isocyanate resin or a polyethylene imine resin. The AC layer 8 formed of an reactive adhesive enhances the rigidity of the cover tape.

The adhesive layer 6 of a thickness exceeding 60 $\mu$m is undesirable because an excessively thick adhesive layer reduces the rate of heat transfer of the cover tape and hence the heat-sealing bar needs to be heated at an elevated temperature.

The intermediate layer 5 of the present invention serves as a cushioning layer which secures the uniform close adhesion of the cover tape 1 to the carrier tape 31 when the cover tape 1 is heat-sealed to the carrier tape 31. The adhesive strength between the intermediate layer 5 and the heat sealant layer 2 is adjusted so that delamination occurs between the intermediate layer 5 and the heat sealant layer 2 when the cover tape 1 heat-sealed to the carrier tape 31 is peeled from the carrier tape 3.

Figure 18:
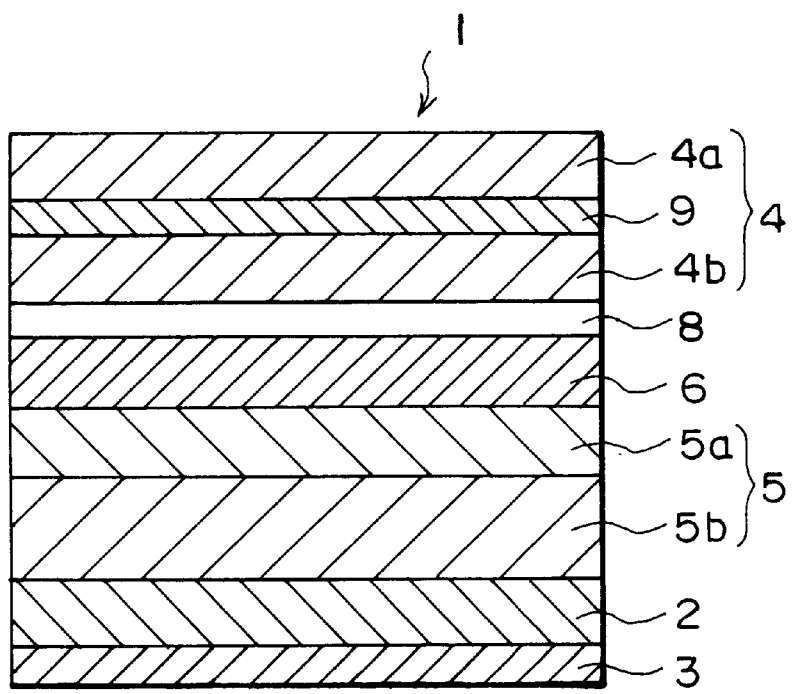
FIG. 18 is a typical sectional view of a covering structure having two-layer intermediate layer, in a modification of the covering structure of FIG. 17.
Figure 19:
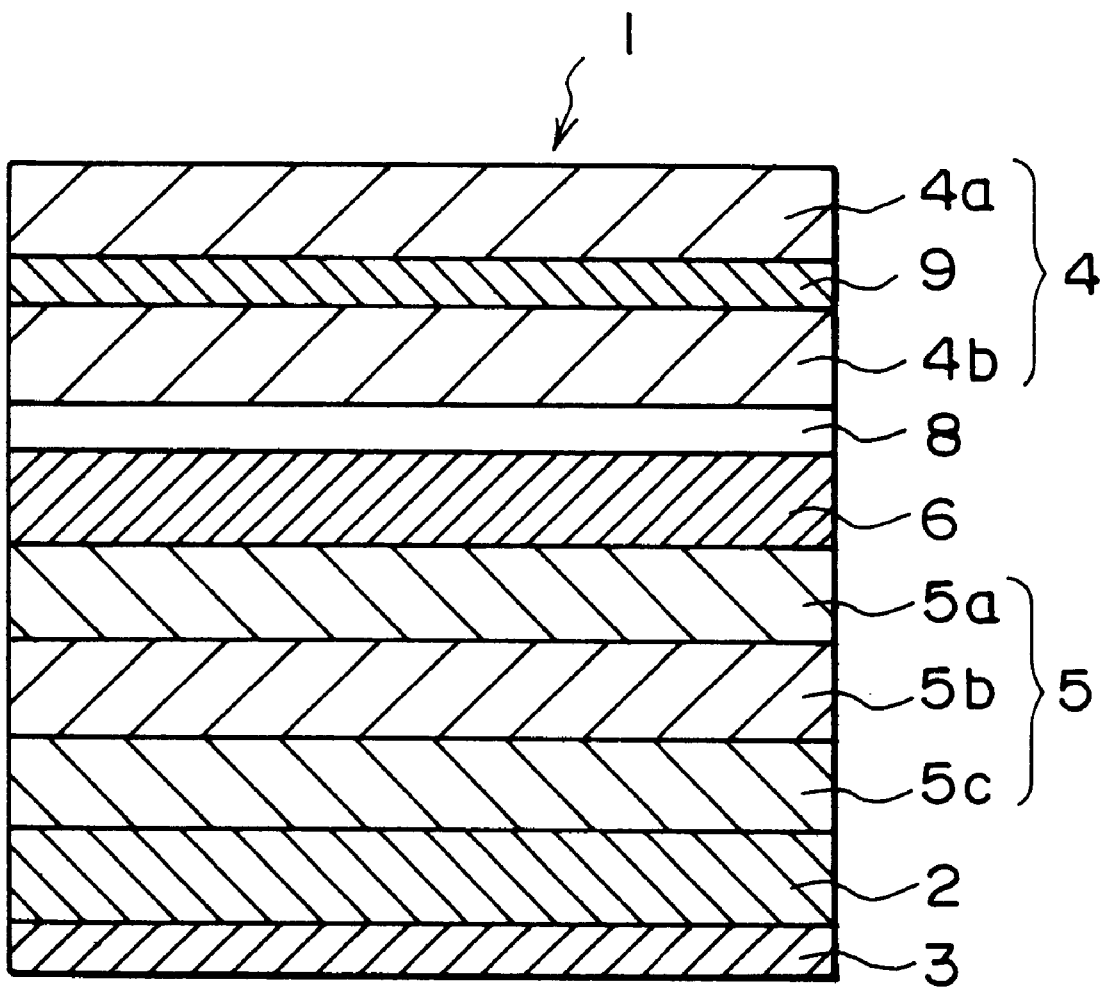
FIG. 19 is a typical sectional view of a covering structure having three-layer intermediate layer, in a modification of the covering structure of FIG. 17.

The intermediate layer 5 may be of either a single-layer construction as shown in FIG. 17 or a multilayer construction as shown in FIG. 18 or 19. The intermediate layer 5, similarly to the intermediate layer of the first embodiment, may be formed of a combination of two or more kinds of thermoplastic resins.

An intermediate layer 5 shown in FIG. 18 consists of a first resin layer 5a and a second resin layer 5b, and an intermediate layer shown in FIG. 19 consists of a first resin layer 5a, a second resin layer 5b and a third resin layer 5c.

Figure 20:
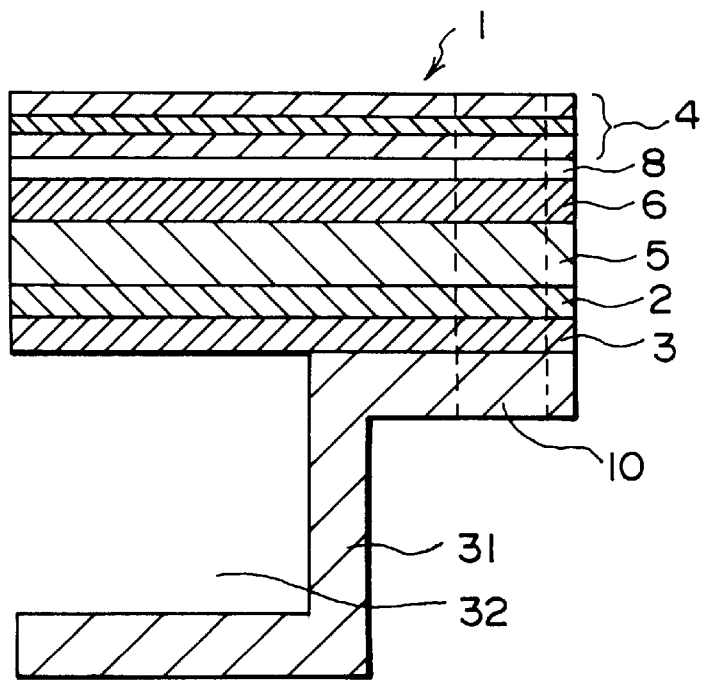
FIG. 20 is a typical sectional view of a covering structure according to the present invention and a carrier tape bonded together by heat-sealing.
Figure 21:
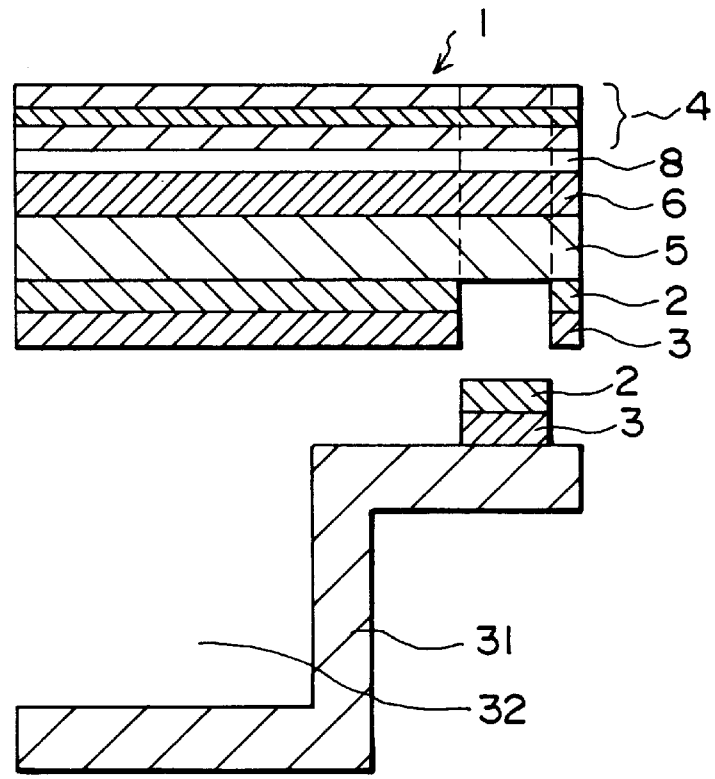
FIG. 21 is a typical sectional view of the covering structure of FIG. 20 separated from the carrier tape.

Since the cover tape 1 of the present invention has the heat sealant layer 2 formed on the intermediate layer 5, desirable delamination occurs between the intermediate layer 5 and the heat sealant layer 2 as shown in FIG. 21 when the cover tape 1 heat-sealed to the carrier tape 31 having blisters 32 as shown in FIG. 20 is peeled from the carrier tape 31. The peel strength is lower than the adhesive strength between the heat sealant layer 2 and the antistatic layer 3 or the adhesive strength between the antistatic layer 3 and the carrier tape 31. Preferably, the peel strength is in the range of 100 to 1200 g/15 mm. A peel strength outside this peel strength range is undesirable. It is possible that the intermediate layer 5 and the heat sealant layer 2 are separated by delamination and the contents of a container covered with the cover tape 1 by heat-sealing fall off during the transportation of the container if the peel strength is less than 100 g/15 mm. The blister 32 of the carrier tape 31 is vibrated and the contents may be shook out of the blister 32 when the cover tape 1 is peeled from the carrier tape 31 if the peel strength is higher than 1200 g/15 mm. Peel strength is measured in an environment of 23° C. and 40% RH in a 180°-peeling mode and a peeling rate of 300 mm/min. Values of peel strength referred to in the following description are measured under the foregoing conditions unless otherwise specified.

Preferably, the zip-up is 30 g/2 mm or below. The carrier tape 31 vibrates when the cover tape 1 is peeled from the carrier tape 31 and the contents sometimes are shook out from the carrier tape 31 if the zip-up is greater than 30 g/2 mm.

Thus the delamination of the intermediate layer 5 and the heat sealant layer 2 can be achieved by sufficient heating and pressing. Suitable conditions for heating and pressing are, for example, a temperature in the range of 130 to 200° C., heating time in the range of 0.3 to 2.0 sec and a pressure in the range of about 0.73 to about 3.0 kgf/cm².

The peel strength, as measured in a 180°-peeling mode, is lower than the adhesive strength between the heat sealant layer 2 and the carrier tape 31. Preferably, the peel strength is in the range of 100 to 1200 g/15 mm. A peel strength outside this peel strength range is undesirable. It is possible that the intermediate layer 5 and the heat sealant layer 2 are separated by delamination and the contents of a container covered with the cover tape 1 by heat-sealing fall off during transportation if the peel strength is less than 100 g/15 mm. The carrier tape 31 is vibrated and the contents may be shook out of the carrier tape 31 when the cover tape 1 is peeled from the carrier tape 31 if the peel strength is higher than 1200 g/15 mm.

Delamination occurs between the intermediate layer 5 and the heat sealant layer 2 in the cover tape 1 of the present invention and the mode of delamination is not affected by heat-sealing conditions. Accordingly, when heat-sealing the cover tape 1 to the carrier tape 31, the cover tape can sufficiently be heated to secure stable adhesive strength and peel strength.

The heat sealant layer of the cover tape 1 the present invention may be the same as that of the first embodiment.

The antistatic layer 3 formed on the heat sealant layer of the present invention may be the same as that of the first embodiment.

Since delamination occurs between the intermediate layer 5 and the heat sealant layer 2, the cover tape 1 of the present invention can be heat-sealed to the carrier tape 31 without being affected by conditions and exercises stable peeling performance. Delamination will be described specifically with reference to FIGS. 20 and 21. The cover tape 1 shown in FIG. 17 is heat-sealed to the carrier tape 31 having the blister 32 shown in FIG. 20 by forming linear heat-sealing portions 10 of a predetermined width at the opposite ends of the blister 32. Adhesive strength between the intermediate layer 5 and the antistatic layer 3 of the cover tape 1 is in the range of 100 to 200 g/15 mm, which is lower than the adhesive strength between the heat sealant layer 6 and the antistatic layer 3 or the adhesive strength between the antistatic layer 3 and the carrier tape 31. When the cover tape 1 is pulled to peel the same from the carrier tape 31, the cover tape 1 is peeled from the carrier tape 31 and portions of the heat sealant layer 2 and the antistatic layer 3 in the linear heat-sealing portions 10 remain on the carrier tape 31. The cover tape 1 of the present invention has contradictory characteristics, i.e., a characteristic that secures stable heat-sealing performance and a characteristic that makes the cover tape 1 easy to be peeled. If the composite base sheet 4 consists of a plurality of layered oriented films, the zip-up is small and the cover tape 1 can stably be peeled.

Suitable materials for forming the carrier tape 31 to be used in combination with the cover tape 1 of the present invention are polyvinyl chloride, polystyrene, polyesters (A-PET, PEN, PET-G, PCTA), polypropylene, polycarbonates, polyacrylonitrile resins and ABS resins. As mentioned in connection with the description of the first embodiment, a conductive material, such as a powder of conductive carbon black, a powder of a metal, a conductive powder of a conductive metal oxide, an organosilicic compound or a surface active agent, is mixed in the material for forming the carrier tape 31 or is applied to the carrier tape 31. The carrier tape 31 may be formed from a multilayer sheet formed by coating one or both surfaces of a sheet of polystyrene or an ABS resin with a polystyrene film or an ABS resin film containing carbon black by coextrusion or a plastic sheet coated with a conductive polymer.

A plastic sheet coated with a conductive polymer may be used.

Concrete examples of the cover tape 1 of the present invention will be described hereinafter.

Experiment 1

A composite base sheet 4 as shown in FIG. 17 was formed by uniting together a 12 μm thick biaxially oriented polyester film 4a and 6 μm thick surface-treated biaxially oriented polyester film 4b ("ESUPETTO 6140" commercially available from Toyo-bo K.K.) with an adhesive layer 7 of a mixture of "TAKERAKKU A515" and "TAKENETO A-50" (hardener) (commercially available from Takeda Yakuhin Kogyo K.K.) by dry lamination.

Single-layer 30 μm thick intermediate layers 5 of materials of compositions shown in Table 1 were formed.

① Ethylene-α-olefin copolymer (E•O copolymer): "URUTOZEKKUSU 3550" commercially available from Mitsui Sekiyu Kagaku Kogyo K.K., density: 0.925 g/cm³

② Styrene-butadiene block copolymer (S•B copolymer): "ASAFUREKKUSU 810" commercially available from Asahi Kasei Kogyo K.K., styrene content: 70 to 90% by weight, Butadiene 10 content: 30 to 10% by weight ③ Hydrogenated S•B copolymer: "TAFUTEKKU H1041", commercially available from Asahi Kasei Kogyo K.K., styrene: 20 to 50% by weight, butadiene: 80 to 50% by weight ④ High impact polystyrene (HIPS): "SUTAIRON 475D", commercially available from Asahi Kasei Kogyo K.K.

⑤ Styrene-butadiene block elastomer (S•B block elastomer): :TAFUPUREN A", commercially available from Asahi Kasei Kogyo K.K., a not hydrogenated elastomer of 20 to 50% by weight styrene and 80 to 50% by weight butadiene An AC layer 8 was formed on the oriented film 4b of the composite base sheet 4, and each of intermediate layers 5 of compositions tabulated in Table 3-1 was laminated to the composite base sheet 2 with an adhesive layer 6 of a low-density polyethylene ("MIRASON 16" commercially available from Mitsui Sekiyu Kagaku Kogyo K.K.) by sandwich lamination.

Then, a 2 μm thick heat sealant layer 2 was formed on the intermediate layer 5 by spreading a solution prepared by dissolving a material of the following composition in a solvent by a gravure reverse process.

An antistatic layer 3 was formed on the heat sealant layer 6 by applying a solution of a bisammonium sulfur organic semiconductor in a mass per unit area of 0.1 g/m$^2$ by a gravure coating process to obtain cover tapes in Samples 1 to 16 and Comparative samples 1 to 6 shown in Table 1.

Liquid for Forming the Heat Sealant Layer

Polyurethane: "NIPPORAN 5120" (Nippon Polyurethane Kogyo K.K.), 20 parts by weight Vinyl chloride-vinyl acetate copolymer: "BINIRAITO VAGH" (Union Carbide Co.), 75 parts by weight

TABLE 3-1

| Covering structure | Composition of single-layer intermediate layer | | | | Antistatic layer |
|---|---|---|---|---|---|
| | E.O copolymer | S.B copolymer | Hydrogenated S.B copolymer | HIPS | |
| Sample | | | | | |
| 1 | 12 | 88 | — | — | Provided |
| 2 | 12 | 80 | 8 | — | Provided |
| 3 | 12 | 80 | — | 8 | Provided |
| 4 | 40 | 60 | — | — | Provided |
| 5 | 40 | 50 | 5 | 5 | Provided |
| 6 | 40 | 42 | 28 | — | Provided |
| 7 | 40 | 42 | — | 28 | Provided |
| 8 | 40 | 10 | 25 | 25 | Provided |
| 9 | 88 | 12 | — | — | Provided |
| 10 | 88 | — | 12 | — | Provided |
| 11 | 40 | 60 | — | — | Provided |

TABLE 3-1-continued

| Covering structure | Composition of single-layer intermediate layer | | | | Antistatic layer |
|---|---|---|---|---|---|
| | E.O copolymer | S.B copolymer | Hydrogenated S.B copolymer | HIPS | |
| 12 | 40 | 60 | — | — | Provided |
| 13 | 40 | 60 | — | — | Provided |
| 14 | 40 | 60 | — | — | Provided |
| 15 | 40 | 60 | — | — | Provided |
| 16 | 40 | 60 | — | — | Provided |
| Comp. sample | | | | | |
| 1 | 5 | 95 | — | — | Provided |
| 2 | 95 | 5 | — | — | Provided |
| 3 | 40 | 25 | 35 | — | Provided |
| 4 | 40 | 5 | — | 55 | Provided |
| 5 | 40 | 60 | — | — | Not provided |
| 6 | 40 | 60 | — | — | * |

*: Treated with an antistatic surface active agent
Unit in parts by weight

The sample cover tapes 1 in Examples 1 to 16 and Comparative examples 1 to 6 were subjected to the measurement of haziness, surface resistivity, charge decay time and peel strength. Peel strength was measured by peeling the sample cover tapes heat-sealed to a conductive polyvinyl chloride sheet ("XEG47", commercially available from Taihei Kagaku K.K.). Measured results are tabulated in Table 3-2.

Haziness and total transmissivity were measured by "Color computer SM-44C" provided by Suga Shikenki K.K.

Surface resistivity was measured by "STATIC DECAY METER 406C" provided by Electro-Tech Systems Inc. The static decay time necessary for reducing a charge of 5000 V by 99% at 23±5° C. and 12±3% RH was measured according to a method specified in MIL-B-81705.

Peel strength was measured by heat-sealing the sample cover tapes at a temperature of 150° C. and a pressure of 3 kgf/cm$^2$ for a heating time of 0.5 sec, and peeling the sample cover tapes in a 1800-peeling mode at a peeling rate of 300 mm/min by "TENSILON BANNO SHIKENKI HTH-100" provided by Toyo Baldwin Co.

TABLE 3-2

| Covering structure | Haziness (%) | Light transmissivity (%) | Surface resistivity (Ω) | Static decay time (sec) | Peel strength (g/15 mm) | Peeling mode |
|---|---|---|---|---|---|---|
| Sample | | | | | | |
| 1 | 20 | 90 | 10$^7$ | 0.01 | 1120 | Delamination |
| 2 | 24 | 85 | 10$^7$ | 0.01 | 1100 | Delamination |
| 3 | 26 | 84 | 10$^7$ | 0.01 | 1170 | Delamination |
| 4 | 20 | 92 | 10$^7$ | 0.01 | 600 | Delamination |
| 5 | 30 | 80 | 10$^7$ | 0.01 | 700 | Delamination |
| 6 | 32 | 75 | 10$^7$ | 0.01 | 700 | Delamination |
| 7 | 35 | 70 | 10$^7$ | 0.01 | 700 | Delamination |
| 8 | 40 | 65 | 10$^7$ | 0.01 | 720 | Delamination |
| 9 | 10 | 92 | 10$^7$ | 0.01 | 1050 | Delamination |
| 10 | 12 | 92 | 10$^7$ | 0.01 | 1050 | Delamination |
| 11 | 20 | 92 | 10$^7$ | 0.01 | 700 | Delamination |
| 12 | 22 | 90 | 10$^7$ | 0.01 | 400 | Delamination |
| 13 | 20 | 92 | 10$^7$ | 0.01 | 420 | Delamination |

TABLE 3-2-continued

| Covering structure | Haziness (%) | Light transmissivity (%) | Surface resistivity (Ω) | Static decay time (sec) | Peel strength (g/15 mm) | Peeling mode |
|---|---|---|---|---|---|---|
| 14 | 15 | 92 | $10^7$ | 0.01 | 520 | Delamination |
| 15 | 16 | 90 | $10^7$ | 0.01 | 600 | Delamination |
| 16 | 20 | 85 | $10^7$ | 0.01 | 600 | Delamination |
| Comp. sample | | | | | | |
| 1 | 15 | 90 | $10^7$ | 0.01 | 1250 | Delamination |
| 2 | 15 | 90 | $10^7$ | 0.01 | 80 | Delamination |
| 3 | 25 | 85 | $10^7$ | 0.01 | 700 | Delamination |
| 4 | 52 | 60 | $10^7$ | 0.01 | 700 | Delamination |
| 5 | 20 | 92 | $>10^{13}$ | $>2.0$ | 600 | Delamination |
| 6 | 20 | 92 | $>10^{13}$ | 10.0 | 600 | Delamination |

Delamination: Separation of the heat sealant layer and the intermediate layer

Experiment 2

Composite base sheets 4 of characteristic qualities tabulated in Table 3 were formed by dry lamination using biaxially oriented polyethylene terephthalate films 2a and 2b and an adhesive layers 9 of adhesives specified below.

Biaxially oriented polyethylene terephthalate films: "TETRON FILM TYPE F", 3.6 and 12 μm thick, commercially available from Teijin K.K.

Biaxially oriented polyethylene terephthalate films: "TETRON FILM TYPE V", 20 and 25 μm thick, commercially available from Teijin K.K.

Adhesives

Polyester, polyether, acrylic, epoxy, urethane and polyimide resins Each of the composite base sheets and the single-layer base sheets 4 shown in Table 3 was laminated to a 30 μm thick intermediate layer 5 of a material containing 40% by weight of E•O copolymer and 60% by weight of S•B copolymer by dry lamination using the adhesive layer 6 employed in Experiment 1.

A 2 μm thick heat sealant layer 2 of a material of a composition shown below was formed on the intermediate layer 5 by gravure reverse coating, and, similarly to Experiment 1, an antistatic layer 3 of 0.1 g/m² in mass per unit area was formed on the heat sealant layer 2 to obtain sample cover tapes in Samples 17 to 25 and Comparative samples 7 to 9 shown in Table 3.

Liquid for Forming the Heat Sealant Layer

Polyurethane: "NIPPORAN 5120"(Nippon Polyurethane Kogyo K.K.), 70 parts by weight Vinyl chloride-vinyl acetate copolymer: "BINIRAITO VAGH" (Union Carbide Co.), 18 parts by weight Silica: Particle size 0.02 μm, 12 parts by weight The sample cover tapes in Samples 17 to 25 and Comparative samples 7 to 9 were heat-sealed at temperatures of 1340° C. and 150° C., a pressure of 2 kgf/cm² and heating time of 0.5 sec to a sheet XEG47 available from Taihei Kagaku K.K. and were subjected to peel strength measurement. Mean values of peel strengths and zip-ups, i.e., the difference between a maximum and a minimum peel strength are tabulated in Table 3-3.

TABLE 3-3

| | Construction of composite base sheet | | | Heat-sealing temperature: 130° C. | | | Heat-sealing temperature: 150° C. | | |
|---|---|---|---|---|---|---|---|---|---|
| Covering structure | Thickness (Outer surface → intermediate layer) | Adhesive | | Peel strength | Zip-up | Peeling mode | Peel strength | Zip-up | Peeling mode |
| Sample | | | | | | | | | |
| 17 | 6/6 | U | | 450 | 12 | Delamination | 530 | 10 | Delamination |
| 18 | 3/3/3/3 | U | | 500 | 10 | Delamination | 560 | 8 | Delamination |
| 19 | 6/6/6 | U | | 380 | 6 | Delamination | 430 | 8 | Delamination |
| 20 | 12/6 | U | | 380 | 8 | Delamination | 430 | 8 | Delamination |
| 21 | 6/6/6 | Es | | 390 | 6 | Delamination | 450 | 6 | Delamination |
| 22 | 6/6/6 | E | | 400 | 6 | Delamination | 470 | 6 | Delamination |
| 23 | 6/6/6 | Ac | | 410 | 8 | Delamination | 450 | 8 | Delamination |
| 24 | 6/6/6 | Ep | | 380 | 5 | Delamination | 450 | 5 | Delamination |
| 25 | 6/6/6 | I | | 380 | 5 | Delamination | 450 | 5 | Delamination |

TABLE 3-3-continued

| | Construction of composite base sheet | | | Heat-sealing temperature: 130° C. | | | Heat-sealing temperature: 150° C. | | |
|---|---|---|---|---|---|---|---|---|---|
| Covering structure | Thickness (Outer surface → intermediate layer) | Adhesive | Peel strength | Zip-up | Peeling mode | Peel strength | Zip-up | Peeling mode |
| Comp. sample | | | | | | | | |
| 7 | 12 | — | 480 | 36 | Delamination | 500 | 35 | Delamination |
| 8 | 18 | — | 360 | 30 | Delamination | 430 | 30 | Delamination |
| 9 | 18 | — | 250 | 100 | Cohesive failure | 280 | 10 | Delamination |

Adhesives
U: Polyurethane,
Es: Polyester,
E: Polyether,
Ac: Polyacrylate,
Ep: Epoxy resin,
I: Imide resin
Peel strength: g/15 mm
Zip-up: g/2 mm As is obvious from Table 3-3, the zip-ups of Comparative samples, which are single-layer base sheets, are greater than those of Samples 17 to 25, and Comparative samples lack stability.

The zip-ups of the cover tapes each having the composite base sheet formed by laminating two or more oriented films with a hardening adhesive are small. The heat sealant layer formed on the intermediate layer formed of three or more kinds of resins including at least the E•O copolymer and the SOB copolymer among the E•O copolymer, the S•B copolymer, the hydrogenated S•B copolymer and HIPS is stably separated from the intermediate layer when the cover tape is peeled from the carrier tape.

The antistatic layer of a material containing a bisammonium organic sulfur semiconductor as a principal component formed on the heat sealant layer provides the cover tape with excellent antistatic characteristic including surface resistivity and static decay time.

Fourth Embodiment

Figure 22:
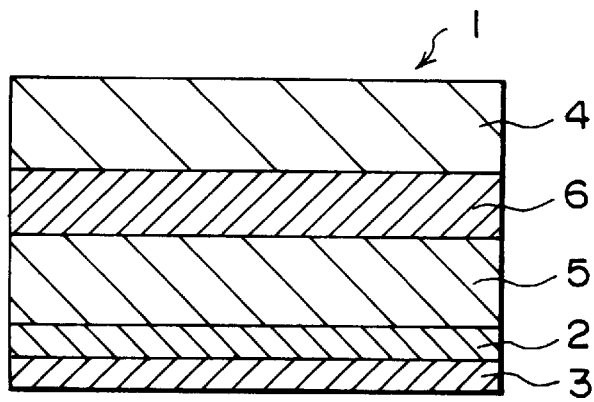
FIG. 22 is a typical sectional view of a covering structure in a fourth embodiment according to the present invention.

Referring to FIG. 22, a covering structure 1 in a fourth embodiment according to the present invention is a laminated cover tape 1 capable of being heat-sealed to a carrier tape and consists of a biaxially oriented film 4, an adhesive layer 6, an intermediate layer 5, a heat sealant layer 2 and an antistatic layer 3 of a material containing a bisammonium organic sulfur semiconductor stacked in that order.

The biaxially oriented film 4 of the present invention is a biaxially oriented film of a thickness in the range of 12 to 25 μm formed of any one of thermoplastic resins including polyester resins, such as polyethylene terephthalate and polyethylene naphthalate, polyolefins, such as polypropylene, polyamides, such as nylon, and polycarbonates. If necessary, a surface of the biaxially oriented film 4 on which the adhesive layer is formed may be finished by a surface treatment, such as a corona discharge treatment, a plasma treatment or sandblasting to secure a high adhesive strength between the biaxially oriented film 4 and the adhesive layer.

The material forming the biaxially oriented film 4 may contain the surface active agent employed in the first embodiment to provide the biaxially oriented film 4 with an antistatic characteristic.

The thickness of the biaxially oriented film 4 is dependent on the purpose of the cover tape 1 and is in the range of 6 to 100 μm, preferably, in the range of 20 to 45 mm.

The biaxially oriented film may be a film of a rigid material, such as a hard polyvinyl chloride film or a uniaxially oriented polycarbonate film.

Preferably, the adhesive layer 6 bonding together the biaxially oriented film and the intermediate layer is an adhesive layer of a hardening reactive adhesive.

A principal component of a two-part reactive adhesive or a thermosetting adhesive for forming the adhesive layer 6 of the present invention are polyester resins, polyether resins, urethane resins, urethane modified polyester resins, urethane polyether resins, vinyl copolymers, ethylene-vinyl acetate resins, ethylene-vinyl acetate-acrylate resins, acrylic resins, aromatic polyamine resins, polythiol resins, ethylene-acrylate resins, epoxy resins, polyamide resins, ionizing radiation setting resins and synthetic resins. Suitable hardeners are trilene diisocyanate, 4,4'-diphenylmethane diisocyanate, hexamethylene diisocyanate, xylene diisocyanate, naphthylene-1,5-diisocyanate, polyamine and polythiol. The two-part adhesive contains 100 parts by weight of the principal agent and 10 to 70 parts by weight of the hardener.

Suitable ionizing radiation setting resins are prepolymers having molecules including polymerizing unsaturated bonds or epoxy groups, oligomers, and/or compositions produced by properly mixing monomers. Suitable ionizing radiation setting resins are, for example, urethane acrylate and polyester acrylate.

The adhesive layer 6 may be formed by any suitable process, such as a gravure coating process or a roll coating process.

Preferably, the thickness of the adhesive layer 6 formed of the reactive adhesive, which is a factor to provide the cover tape 1 with rigidity, is in the range of 3 to 80 μm, more preferably, in the range of 5 to 20 μm. If the adhesive layer 6 has a thickness of 3 μm or below, the adhesive layer 6 is unable to exercise uniform adhesive strength. If the adhesive layer 6 has a thickness of 80 μm or above, the adhesive layer 6 is economically disadvantageous, is excessively rigid and may cause the cover tape 1 to crack. If the adhesive layer 6 is excessively thick, the low-temperature heat-sealing property may possibly be deteriorated.

The combined action of the heat-resistant biaxially oriented film 4 and the adhesive layer 6 of the reactive adhesive prevents the cover tape 1 from being melted or being caused to contract by heat applied to the cover tape 1 by a heat-sealing bar when heat-sealing the cover tape 1 to a carrier tape.

It is conjectured that the cover tape 1 having the biaxially oriented film 4 and the intermediate layer 5 bonded together with the adhesive layer 6, as compared with a cover tape having layers adhesively bonded together with an adhesive thermoplastic resin by sandwich dry lamination, has a high rigidity owing to the effect of the adhesive layer 6 of the reactive adhesive, is peeled at a stable peeling angle and hence has a small zip-up, i.e., the difference between a maximum and a minimum peel strength resisting against peeling. Thus, the cover tape 1 can be peeled from a carrier tape at a high peeling rate.

The rigidity of the biaxially oriented film 4 can be increased by increasing the thickness of the biaxially oriented film 4. However, when heat-sealing the cover tape to a carrier tape, the thick biaxially oriented film 4 is unable to transfer heat energy required by the heat sealant layer 2 and hence the heat-sealing bar must be heated at an elevated temperature. Consequently, the carrier tape 1 having low heat resistance is subject to deformation and dimensional change, and the position of electronic parts carried by the carrier tape varies when mounting the electronic parts.

Electronic parts are shook out of the carrier tape and stable high-speed electronic part mounting operation cannot be achieved if the zip-up is large even if the cover tape 1 has a proper peel strength. It was found through assiduous studies that zip-up is dependent on the rigidity of the cover tape; zip-up is large if the rigidity of the cover tape is low, and zip-up is small if the rigidity of the cover tape is high.

The adhesive layer of a thickness exceeding 80 $\mu$m deteriorates the heat seal property of the cover sheet. Preferably, the thickness of the adhesive layer is in the range of 5 to 20 $\mu$m.

A surface of the cover tape 1 opposite the surface formed by the heat sealant layer 2, i.e., the outermost surface of the cover tape 1, may be finished, when necessary, by an antistatic treatment using an antistatic agent, such as a surface active agent, an organic silicic compound, conductive carbon black, an evaporated metal film, conductive particles of a metal oxide or the like to avoid the adhesion of dust and dirt to the surface of the base sheet 2 or to prevent the generation of static electricity by friction with external objects.

Figure 23:
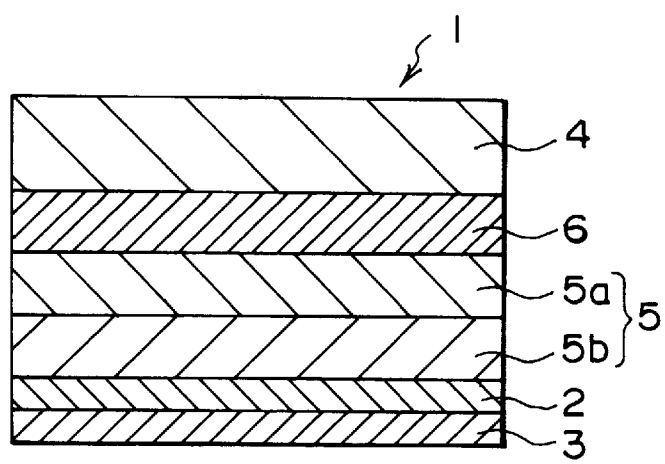
FIG. 23 is a typical sectional view of a covering structure having two-layer intermediate layer, in a modification of the covering structure of FIG. 22.
Figure 24:
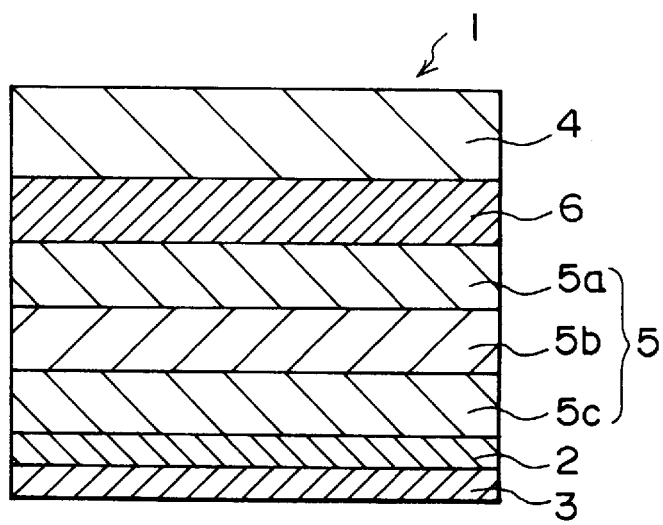
FIG. 24 is a typical sectional view of a covering structure having three-layer intermediate layer, in a modification of the covering structure of FIG. 22.

As shown in FIGS. 22, 23 or 24, the intermediate layer 5 may be formed by a separate process, and the biaxially oriented film 4 and the intermediate layer 5 can be bonded together with the adhesive layer 6 of a reactive adhesive by dry lamination.

Figure 25:
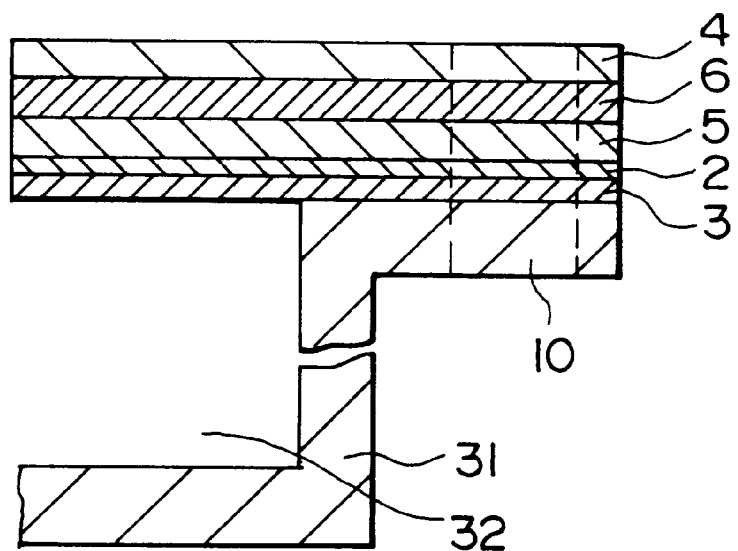
FIG. 25 is atypical sectional view of a covering structure according to the present invention and a carrier tape bonded together by heat-sealing.

The intermediate layer 5 of the present invention serves as a cushioning layer which secures the uniform close adhesion of the cover tape 1 to a carrier tape when the cover tape 1 is heat-sealed to the carrier tape. The adhesive strength between the intermediate layer 5 and the heat sealant layer 2 is adjusted so that delamination occurs between the intermediate layer 5 and the heat sealant layer 2 when the cover tape 1 heat-sealed to the carrier tape is peeled from the carrier tape as shown in FIGS. 25 and 26.

The intermediate layer 5 may be of either a single-layer construction as shown in FIG. 22 or a multilayer construction as shown in FIGS. 23 or 24. The intermediate layer 5 may be formed of a combination of two or more kinds of thermoplastic resins. The intermediate layer 5 shown in FIG. 23 consists of a first resin layer 5a and a second resin layer 5b, and the intermediate layer 5 shown in FIG. 24 consists of a first resin layer 5a, a second resin layer 5b and a third resin layer 5c.

Figure 26:
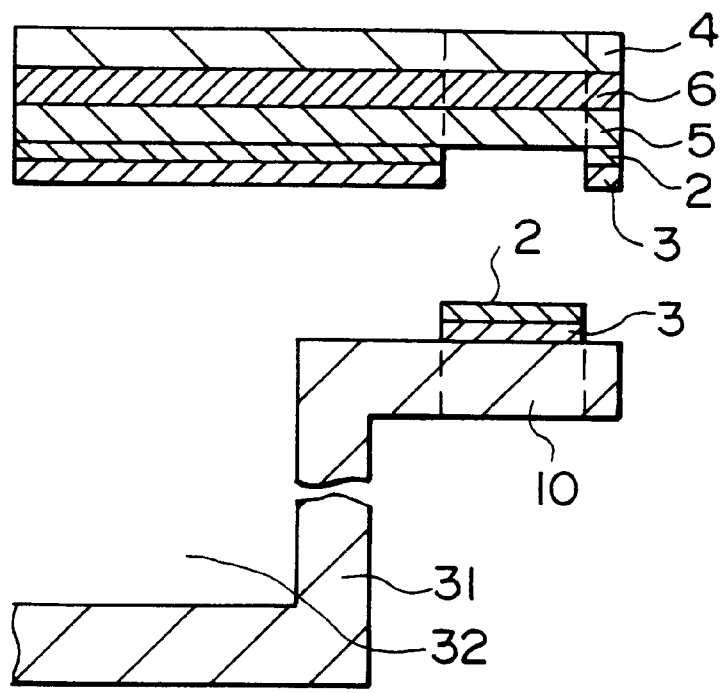
FIG. 26 is a typical sectional view of the covering structure of FIG. 25 separated from the carrier tape.

Since the cover tape 1 of the present invention has the heat sealant layer 2 formed on the intermediate layer 5, desirable delamination occurs between the intermediate layer 5 and the heat sealant layer 21 as shown in FIG. 26 when the cover tape 1 heat-sealed to a carrier tape 32 having blisters 32 as shown in FIG. 26 is peeled from the carrier tape 31. It is desirable, when peeling the cover tape 1 having heat-sealed portions 10 heat-sealed to the carrier tape 31 as shown in FIG. 25, that delamination occurs between the intermediate layer 5 and the heat sealant layer 2 as shown in FIG. 26 or cohesive failure occurs in the heat sealant layer 2.

This embodiment is designed to cause delamination between the intermediate layer 5 and the heat sealant layer 2. When the intermediate layer 5 and the heat sealant layer 2 are separated as shown in FIG. 26, it is considered that delamination occurred between the intermediate layer 5 and the heat sealant layer 2 because any molecules other than those of the intermediate layer 5 and any molecules other than those of the heat sealant layer cannot be detected in the intermediate layer 5 and the heat sealant layer 2, respectively. However, if a trace of a compound or molecules other than those of the intermediate layer 5 can be detected in the intermediate layer 5 or a compound or molecules other than those of the heat sealant layer 2 can be detected in the heat sealant layer 2 by an advanced method of analysis, the separation of the intermediate layer 5 and the heat sealant layer 2 regarded as delamination could be cohesive failure of the intermediate layer 5 or the heat sealant layer 2. In this description, it is decided that the intermediate layer 5 and the heat sealant layer 2 are separated by delamination when any foreign molecules cannot be detected in the intermediate layer 5 and the heat sealant layer by an ordinary method of analysis.

The adhesive strength (peel strength) in the range of 10 to 2000 g/mm between the intermediate layer 5 and the heat sealant layer 2 in the cover tape 1 heat-sealed to the carrier tape by forming the linear heat-sealing portions 10 is lower than the adhesive strength between the heat sealant layer 2 and the antistatic layer 3 or the adhesive strength between the antistatic layer 3 and the carrier tape 31. When the cover tape 1 is pulled to peel the same from the carrier tape 31, the cover tape 1 is peeled from the carrier tape 31 and portions of the heat sealant layer 2 and the antistatic layer 3 in the linear heat-sealing portions 10 remain on the carrier tape 31.

The cover tape 1 of the present invention has contradictory characteristics, i.e., a characteristic that secures stable heat-sealing performance and a characteristic that makes the cover tape 1 easy to be peeled.

The cover tape having the biaxially oriented film and the adhesive layer can be peeled from the carrier tape with a small zip-up.

Since delamination occurs between the intermediate layer 5 and the heat sealant layer 2 when the cover tape 1 is peeled from the carrier tape, the peeling performance of the cover tape 1 is not affected by heat-sealing conditions. Therefore, the cover tape 1 can sufficiently be heated when heat-sealing the cover tape 1 to the carrier tape 31, so that the cover tape 1 can stably be heat-sealed to the cover tape 31 and is able to secure peeling strength.

Suitable materials for forming the carrier tape 31 to be used in combination with the cover tape 1 of the present invention are polyvinyl chloride, polystyrene, polyesters (A-PET, PEN, PET-G, PCTA), polypropylene, polycarbonates, polyacrylonitrile resins and ABS resins. As mentioned in connection with the description of the first embodiment, a conductive material, such as a powder of conductive carbon black, a powder of a metal, a conductive powder of a conductive metal oxide, an organosilicic compound or a surface active agent, is mixed in the material for forming the carrier tape 31 or is applied to the carrier tape 31. The carrier tape 31 may be formed from a multilayer sheet formed by coating one or both surfaces of a sheet of polystyrene or an ABS resin with a polystyrene film or an ABS resin film containing carbon black by coextrusion or a plastic sheet coated with a conductive polymer.

A plastic sheet coated with a conductive polymer may be used.

Concrete examples of the cover tape of the present invention will be described hereinafter.

Experiment 1

As shown in FIG. 22, each of intermediate layers 5 shown in Table 1 was bonded to a 16 $\mu$m thick biaxially oriented film 2, i.e., a 16 $\mu$m thick biaxially oriented polyester film ("ESUPETTO 6140" commercially available from Toyo-bo K.K.) with an adhesive layer 3 of a mixture of "TAKER-AKKU A515" and "TAKENETO A-50" (hardener) (commercially available from Takeda Yakuhin Kogyo K.K.) by dry lamination.

Single-layer 30 $\mu$m thick intermediate layers 5 of materials of compositions shown in Table 1 were formed.

① E•O copolymer: "URUTOZEKKUSU 3550" commercially available from Mitsui Sekiyu Kagaku Kogyo K.K., density: 0.925 g/cm$^3$ ② S•B copolymer: "ASAFUREKKUSU 810" commercially available from Asahi Kasei Kogyo K.K., styrene content: 70 to 90% by weight, Butadiene content: 30 to 10% by weight ③ Hydrogenated SOB copolymer: "TAFUTEKKU H1041", commercially available from Asahi Kasei Kogyo K.K., styrene: 20 to 50% by weight, butadiene: 80 to 50% by weight ④ HIPS: "SUTAIRON 475D", commercially available from Asahi Kasei Kogyo K.K.

Then, a 2 $\mu$m thick (solid) heat sealant layer 6 was formed on the intermediate layer 5 by spreading a heat sealant liquid 1 prepared by dissolving a material of the following composition in a solvent by a gravure reverse process.

Heat Sealant Liquid 1

Polyurethane: "NIPPORAN 5120" (Nippon Polyurethane Kogyo K.K.), 25.0 parts by weight Vinyl chloride-vinyl acetate copolymer: "BINIRAITO VAGH" (Union Carbide Co.), 25.0 parts by weight An antistatic layer was formed on the heat sealant layer 6 by applying a solution of a bisammonium organic sulfur semiconductor ("HAIBORON SC" commercially available from Boron Intanashonaru K.K.) in a mass per unit area of 0.1 g/m$^2$ by a gravure reverse process to obtain cover tapes in Samples 1 to 15 and Comparative samples 1 to 6.

TABLE 4-1

Composition of Samples for Experiment 1

Composition of intermediate layer

| Sample number | E.O copolymer | S.B copolymer | Hydrogenated S.B copolymer | HIPS | Antistatic layer |
|---|---|---|---|---|---|
| Sample | | | | | |
| 1 | 12 | 88 | — | — | Provided |
| 2 | 12 | 80 | 8 | — | Provided |
| 3 | 12 | 80 | — | 8 | Provided |
| 4 | 40 | 60 | — | — | Provided |
| 5 | 40 | 50 | 5 | 5 | Provided |

TABLE 4-1-continued

Composition of Samples for Experiment 1

Composition of intermediate layer

| Sample number | E.O copolymer | S.B copolymer | Hydrogenated S.B copolymer | HIPS | Antistatic layer |
|---|---|---|---|---|---|
| 6 | 40 | 42 | 28 | — | Provided |
| 7 | 40 | 42 | — | 28 | Provided |
| 8 | 40 | 10 | 25 | 25 | Provided |
| 9 | 88 | — | 12 | — | Provided |
| 10 | 40 | 60 | — | — | Provided |
| 11 | 40 | 60 | — | — | Provided |
| 12 | 40 | 60 | — | — | Provided |
| 13 | 40 | 60 | — | — | Provided |
| 14 | 40 | 60 | — | — | Provided |
| 15 | 40 | 60 | — | — | Provided |
| Comp. Sample | | | | | |
| 1 | 5 | 95 | — | — | Provided |
| 2 | 95 | 5 | — | — | Provided |
| 3 | 40 | 25 | 35 | — | Provided |
| 4 | 40 | 5 | — | 55 | Provided |
| 5 | 40 | 60 | — | — | Not provided |
| 6 | 40 | 60 | — | — | * |

*Antistatic layer: Layer of an antistatic active agent

Unit in percent by weight

The sample cover tapes 1 in Examples 1 to 15 and Comparative examples 1 to 6 were subjected to the measurement of haziness, surface resistivity, static decay time and peel strength. Peel strength was measured by peeling the sample cover tapes heat-sealed to a conductive polyvinyl chloride sheet ("XEG47", commercially available from Taihei Kagaku K.K.) Measured results are tabulated in Table 4-2.

Haziness and transmissivity were measured by "Color computer SM-44C" provided by Suga Shikenki K.K.

Surface resistivity was measured by "HAIRESUTA IP" provided by Mitsubishi Kagaku K.K. at 22° C. and 40% RH.

Static decay time necessary for reducing a charge of 5000 V by 99% at 23±5° C. and 12±3% RH was measured according to a method specified in MIL-B-81705 by "STATIC DECAY METER 406C" provided by Electro-Tech Systems Inc.

Peel strength (g/15 mm) was measured by heat-sealing the sample cover tapes at a temperature of 150° C. and a pressure of 2 kgf/cm$^2$ for a heating time of 0.5 sec, and peeling the sample cover tapes in a 180°-peeling mode at a peeling rate of 300 mm/min by "TENSHIRON BANNO SHIKENKI HTH-100" provided by Toyo Baldwin Co.

TABLE 4-2

Characteristics of Samples for Experiment 1

| Sample number | Haziness (%) | Light transmissivity (%) | Surface resistivity ($\Omega/\square$) | Static decay time (sec) | Peel strength (g/15 mm) | Peeling mode |
|---|---|---|---|---|---|---|
| Sample | | | | | | |
| 1 | 20 | 90 | $10^7$ | 0.01 | 1120 | Delamination |
| 2 | 24 | 85 | $10^7$ | 0.01 | 1100 | Delamination |
| 3 | 26 | 84 | $10^7$ | 0.01 | 1100 | Delamination |
| 4 | 20 | 92 | $10^7$ | 0.01 | 600 | Delamination |
| 5 | 30 | 80 | $10^7$ | 0.01 | 700 | Delamination |
| 6 | 32 | 75 | $10^7$ | 0.01 | 700 | Delamination |
| 7 | 35 | 70 | $10^7$ | 0.01 | 700 | Delamination |
| 8 | 40 | 65 | $10^7$ | 0.01 | 1050 | Delamination |
| 9 | 10 | 92 | $10^7$ | 0.01 | 1050 | Delamination |
| 10 | 12 | 92 | $10^7$ | 0.01 | 700 | Delamination |
| 11 | 20 | 92 | $10^7$ | 0.01 | 400 | Delamination |
| 12 | 22 | 90 | $10^7$ | 0.01 | 420 | Delamination |
| 13 | 20 | 92 | $10^7$ | 0.01 | 520 | Delamination |
| 14 | 15 | 92 | $10^7$ | 0.01 | 600 | Delamination |
| 15 | 16 | 90 | $10^7$ | 0.01 | 600 | Delamination |
| Comp. sample | | | | | | |
| 1 | 15 | 90 | $10^7$ | 0.01 | 1250 | Delamination |
| 2 | 15 | 90 | $10^7$ | 0.01 | 80 | Separation |
| 3 | 25 | 85 | $10^7$ | 0.01 | 700 | Delamination |
| 4 | 52 | 60 | $10^7$ | 0.01 | 700 | Delamination |
| 5 | 20 | 92 | $>10^{13}$ | $>2.0*$ | 600 | Delamination |
| 6 | 20 | 92 | $>10^{13}$ | 10 | 600 | Delamination |

*: Not decayed
>: Unmeasurable
Delamination: Separation of the heat sealant layer and the intermediate layer
Cohesive failure: Internal breakage of the heat sealant layer
Separation: Separation of the heat sealant layer from the container As is obvious from Table 4-2, the peel strength of Comparative sample 1 was excessively high and the performance of Comparative sample 1 was not satisfactory. The peel strength of Comparative sample 2 was excessively low. Blocking of the intermediate layer of Comparative sample 3 occurred. Comparative sample 4 was unsatisfactory in transparency and Comparative samples 5 and 6 were inferior in electric conductivity.

Experiment 2

Cover tapes shown in Table 4-3 were formed by laminating biaxially oriented polyethylene terephthalate films, adhesives and intermediate layers specified below.

Biaxially oriented polyethylene terephthalate films: "Tetron Film Type F", thickness ($\mu$m): 12, 16, 25, 50, 75, commercially available from Teijin K.K.

Adhesives: Principal component: Polyurethane resin, polyester resin, polyether resin, acrylic resin, epoxy resin, and polyimide resin, Hardener: Isocyanate and amine Intermediate layer ①: Intermediate layers 5 of 8, 10, 30, 50, 90 and 120 $\mu$m in thickness were formed by subjecting a mixture prepared by mixing 40% by weight of "URUTOZEKKUSU 3550" commercially available from Mitsui Sekiyu Kagaku Kogyo K.K. and 60% by weight of "ASA-FUREKKUSU 810" commercially available from Asahi Kasei Kogyo K.K. to an ordinary inflation process.

Intermediate layer ②: Intermediate layers 5 of 8, 10, 30, 50, 90 and 120 $\mu$m in thickness were formed by subjecting a mixture prepared by mixing 30% by weight of "URUTOZEKKUSU 3550" commercially available from Mitsui Sekiyu Kagaku Kogyo K.K. 30% by weight of "ASA-FUREKKUSU 810" commercially available from Asahi Kasei Kogyo K.K. and 10% by weight of "SUTAIRON 475D" commercially available from Asahi Kasei Kogyo K.K. to an ordinary inflation process.

The intermediate layer 5 was laminated to the biaxially oriented film 2 with an adhesive layer 3 of a polyester resin and an isocyanate.

A heat sealant liquid 2 prepared by dissolving the following materials in a solvent was applied to the intermediate layer 5 by a gravure reverse process to form a heat sealant layer 6 of 2 $\mu$m in thickness (solid).

Heat sealant liquid 2:
Polyurethane: "NIPPORAN 5120" (Nippon Polyurethane Kogyo K.K.), 25.0 parts by weight
Vinyl chloride-vinyl acetate copolymer: "BINIRAITO VAGH" (Union Carbide Co.), 80.0 parts by weight An antistatic layer was formed on the heat sealant layer 6 by applying a solution of a bisammonium organic sulfur semiconductor ("HAIBORON SC" commercially available from Boron Intanashonaru K.K.) in a mass per unit area of 0.1 g/m$^2$ by a gravure reverse process to obtain cover tapes in Samples 21 to 39 and Comparative samples 11 to 17.

The cover tapes in Samples 21 to 39 and Comparative samples 21 to 27 were heat-sealed to carrier tapes of "XEG47" commercially available from Taihei Kagaku K.K. under heat-sealing conditions shown below. Peel strength of the cover tapes was measured. Peeling characteristics of the cover tapes were evaluated in terms of mean peeling strength, zip-up, i.e., the difference between a maximum and a minimum peel strength, and peeling mode. Measured heat-sealing characteristics of the cover tapes are tabulated in Table 4-3.

Measuring instrument: Peel tester VG-10 provided by Bangado K.K.

Heat-sealing conditions: Temperature: 1500C, Pressure: 2.0 kgf/cm², Time: 0.5 sec Heat-sealing head: Width: 0.5 mm, Length: 16 mm, Feed: 8 mm Sampling: Cover tapes formed by 25 shots (200 mm) subsequent to 50 shots (400 mm)

Sample cover tapes of 1 mm in bond width were peeled in a 180°-peeling mode at a peeling rate of 300 mm/min for the measurement of peel strength.

The stiffness of the cover tapes in Samples 21 to 39 and Comparative samples 21 to 27 was measured. Constants a and b of relation determined on the basis of measured results are shown in Table 4-3.

Measuring instrument: Loop stiffness Tester provided by Toyo Seiki K.K.

Measuring conditions: Size: 15 mm wide and 110 mm long, Loop length: 62 mm, Pushing length: 5 mm

TABLE 4-3(1)

Results of Peel Tests in Experiment 2

| Sample number | Intermediate layer | Thickness of oriented film (μm) | Thickness of intermediate layer (μm) | Adhesive Principal component | Hardener | Mixing ratio | Thickness (μm) |
|---|---|---|---|---|---|---|---|
| Samples | | | | | | | |
| 21 | Intermediate layer ① | 16 | 30 | PU | I | 100/25 | 8 |
| 22 | | " | " | " | " | 100/10 | " |
| 23 | | " | " | " | " | 100/25 | " |
| 24 | | " | " | " | " | " | " |
| 24a | | " | " | " | " | 100/50 | " |
| 24b | | " | " | " | " | 100/90 | " |
| 25 | | " | " | Es | " | " | " |
| 26 | | " | " | Et | " | " | " |
| 27 | | " | " | AC | " | " | " |
| 28 | | " | " | PI | " | " | " |
| 29 | | " | " | Ep | A | " | " |
| 30 | | 12 | " | PU | " | " | " |
| 31 | | 25 | " | " | " | " | " |
| 32 | | 50 | " | " | " | " | " |
| 33 | | 16 | 10 | " | " | " | " |
| 34 | | " | 50 | " | " | " | " |
| 35 | | " | 90 | " | " | " | " |
| 36 | | " | 30 | " | " | " | 5 |
| 37 | | " | " | " | " | " | 20 |
| 38 | | " | " | " | " | " | 50 |
| 39 | | " | " | " | " | " | 80 |
| 40 | Intermediate layer ② | " | 10 | " | I | 100/25 | 8 |
| 41 | | " | 30 | " | " | " | " |
| 42 | | " | 50 | " | " | " | " |
| 43 | | " | 90 | " | " | " | " |
| Comp. samples | | | | | | | |
| 21 | Intermediate layer ① | 16 | 30 | PU | I | 100/120 | 8 |
| 22 | | " | " | " | " | 100/0.1 | " |
| 23 | | " | " | " | " | 100/25 | 2 |
| 24 | | " | " | " | " | " | 100 |
| 25 | | 75 | " | " | " | " | 8 |
| 26 | | 16 | 8 | " | " | " | " |
| 27 | | " | 120 | " | " | " | " |
| 28 | | " | 30 | " | " | 100/150 | " |
| 29 | Intermediate layer ② | " | 8 | " | " | 100/25 | " |
| 30 | | " | 120 | " | " | " | " |

TABLE 4-3(2)

Results of Peel Tests in Experiment 2

| Sample number | Constants a | b | Initial value (g) | Zip-up (g) | Peel strength (g/15 mm) | Peeling mode | Haziness (%) |
|---|---|---|---|---|---|---|---|
| Samples | | | | | | | |
| 21 | 0.055 | 8.5 | 10.0 | 10 | 530 | Delamination | 30.3 |
| 22 | 0.053 | 6.2 | 6.8 | 13 | 470 | " | 30.7 |
| 23 | 0.050 | 20.0 | 20.0 | 8 | 580 | " | 30.6 |
| 24 | 0.061 | 30.0 | 30.0 | 5 | 620 | " | 30.9 |
| 24a | 0.080 | 11.4 | 16.5 | 8 | 520 | " | 30.7 |

TABLE 4-3(2)-continued

Results of Peel Tests in Experiment 2

| Sample number | Constants a | b | Initial value (g) | Zip-up (g) | Peel strength (g/15 mm) | Peeling mode | Haziness (%) |
|---|---|---|---|---|---|---|---|
| 24b | 0.103 | 14.6 | 20.8 | 6 | 550 | " | 31.1 |
| 25 | 0.071 | 9.0 | 9.0 | 10 | 520 | " | 31.1 |
| 26 | 0.052 | 11.0 | 7.5 | 11 | 510 | " | 30.3 |
| 27 | 0.071 | 14.0 | 8.2 | 14 | 480 | " | 30.6 |
| 28 | 0.092 | 12.0 | 6.5 | 12 | 470 | " | 31.8 |
| 29 | 0.068 | 15.0 | 5.2 | 15 | 560 | " | 30.9 |
| 30 | 0.112 | 5.0 | 5.0 | 18 | 620 | " | 29.4 |
| 31 | 0.351 | 10.0 | 25.0 | 10 | 490 | " | 35.6 |
| 32 | 0.481 | 7.0 | 43.0 | 7 | 410 | " | 37.1 |
| 33 | 0.012 | 23.0 | 4.5 | 23 | 510 | " | 30.8 |
| 34 | 0.189 | 13.0 | 10.0 | 13 | 500 | " | 36.6 |
| 35 | 0.310 | 8.0 | 31.0 | 8 | 400 | " | 38.4 |
| 36 | 0.410 | 13.0 | 5.0 | 13 | 480 | " | 30.4 |
| 37 | 0.951 | 11.0 | 10.0 | 11 | 520 | " | 30.7 |
| 38 | 0.130 | 8.0 | 16.0 | 8 | 540 | " | 30.8 |
| 39 | 0.280 | 7.0 | 18.0 | 7 | 550 | " | 31.1 |
| 40 | 0.018 | 6.5 | 6.7 | 16 | 610 | " | 19.3 |
| 41 | 0.160 | 8.1 | 19.0 | 13 | 570 | " | 21.0 |
| 42 | 0.225 | 10.2 | 12.3 | 11 | 540 | " | 22.3 |
| 43 | 0.336 | 20.9 | 25.8 | 7 | 520 | " | 22.7 |
| Comp. samples | | | | | | | |
| 21 | 0.810 | 61.0 | 61.0 | 5 | 620 | Separation | 30.7 |
| 22 | 0.025 | 10.0 | 10.0 | 41 | 560 | Delamination | 31.5 |
| 23 | 0.013 | 5.0 | 5.0 | 38 | 590 | " | 30.9 |
| 24 | 0.510 | 20.0 | 20.0 | 6 | 350 | Separation | 32.7 |
| 25 | 1.010 | 67.0 | 67.0 | 5 | 550 | Delamination | 38.8 |
| 26 | 0.031 | 10.0 | 10.0 | 40 | 510 | " | 29.9 |
| 27 | 0.810 | 18.0 | 18.0 | 38 | 490 | Separation | 40.7 |
| 28 | 0.285 | 15.0 | 18.7 | 6 | 610 | Delamination | 33.6 |
| 29 | 0.015 | 3.6 | 4.1 | 43 | 580 | " | 18.8 |
| 30 | 0.830 | 25.0 | 28.8 | 31 | 430 | Separation | 36.7 |

Drawn film: Biaxially oriented film
U: Polyurethane
Es: Polyester
Et: Polyether
AC: Polyacrylate
PI: Polyimide
Ep: Epoxy resin
PU: Acrylic copolymer
I: Isocyanate hardener
A: Amine hardener As is obvious from Table 4-3, Comparative samples 21 and 25 are excessively rigid, and the zip-ups of Comparative samples 22, 23, 26 and 27 are impermissibly large.

In the cover tape of the present invention, the heat sealant layer can firmly be heat-sealed to the carrier tape, and delamination occurs between the intermediate layer and the heat sealant layer.

A peeling mode in which a cover tape 1 heat-sealed to a cover tape 31 as shown in FIG. 25 is peeled from the cover tape 31 will be described with reference to FIGS. 25 and 26. The cover tape 1 shown in FIG. 25 is heat-sealed to the carrier tape 31 having a blister 32 by forming linear heat-sealing portions 10 of a predetermined width at the opposite ends of the blister 32.

Adhesive strength between the heat sealant layer 2 of the cover tape 1 and the carrier tape 31 is in the range of 10 to 200 g/mm. When the cover tape 1 is pulled to peel the same from the carrier tape 31, delamination occurs between portions of the intermediate layer 5 and those of the heat sealant layer 2 in the linear heat-sealing portions 10 as shown in FIG. 26.

The cover tape 1 of the present invention has contradictory characteristics, i.e., a characteristic that secures stable heat-sealing performance and a characteristic that makes the cover tape 1 easy to be peeled.

If the thickness of the adhesive layer uniting together the biaxially oriented film and the intermediate layer is increased or the hardener content of the material forming the adhesive layer is increased, the stiffness of the cover tape, i.e., an ability of restoring the original shape when bent, is enhanced and the zip-up is reduced.

The zip-up of the cover tape having the biaxially oriented film and the intermediate layer laminated to the biaxially oriented film with the adhesive layer is small. The heat sealant layer formed on the intermediate layer formed of three or more kinds of resins including at least the E•O copolymer and the sub copolymer among the E•O copolymer, the S•B copolymer, the hydrogenated S•B copolymer and hips is stably separated from the intermediate layer when the cover tape is peeled from the carrier tape.

What is claimed is:

1. A laminated structure comprising: a heat sealant layer, and an antistatic layer formed on one surface of the heat sealant layer; wherein the antistatic layer contains, as a principal component, a bisammonium organic sulfur semiconductor.

2. The laminated structure according to claim 1, wherein an oriented resin layer is formed on a surface of the heat sealant layer opposite the surface of the same on which the antistatic layer is formed.

3. The laminated structure according to claim 2, wherein an intermediate layer is formed between the oriented resin layer and the heat sealant layer.

4. The laminated structure according to claim 2, wherein an intermediate layer, and an inorganic layer of a metal foil or an evaporated inorganic layer are formed between the oriented resin layer and the heat sealant layer.

5. The laminated structure according to claim 2, wherein an intermediate layer and a moisture absorbing layer are formed between the oriented resin layer and the heat sealant layer.

6. The laminated structure according to claim 2, wherein an intermediate layer, a moisture absorbing layer and an oxygen absorbing layer are formed between the oriented resin layer and the heat sealant layer.

7. The laminated structure according to claim 2, wherein an intermediate layer and an elastic layer are formed between the oriented resin layer and the heat sealant layer.

8. The laminated structure according to claim 2, wherein an intermediate layer and a gas intercepting resin layer are formed between the oriented resin layer and the heat sealant layer.

9. The laminated structure according to claim 3, wherein the intermediate layer is laminated to the oriented resin layer with an adhesive layer.

10. The laminated structure according to claim 3, wherein the intermediate layer is formed of at least three kinds of resins among an ethylene-α•olefin copolymer and a styrene-butadiene block copolymer wherein the ethylene-α•olefin copolymer has a density in the range of 0.915 to 0.940 g/cm$^3$, a styrene-butadiene block copolymer of 50 to 90% by weight of styrene and 50 to 10% by weight of butadiene, a hydrogenated substance obtained by hydrogenating a styrene-butadiene block copolymer of 10 to 50% by weight of styrene and 90 to 50% by weight of butadiene, and a high-impact polystyrene.

11. The laminated structure according to claim 10, wherein the intermediate layer. is a single-layer structure of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 30 parts by weight of a hydrogenated styrene-butadiene block copolymer of 10 to 50% by weight styrene and 90 to 50% by weight of butadiene, and 0 to 50 parts by weight of a high impact polystyrene resin.

12. The laminated structure according to claim 10, wherein the intermediate layer is a single-layer structure of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 30 parts by weight of hydrogenated styrene-butadiene block copolymer of 10 to 50% by weight of styrene and 90 to 50% by weight of butadiene.

13. The laminated structure according to claim 10, wherein the intermediate layer is a single-layer structure of a resin composition containing 100 by parts of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 5 to 50 parts by weight of a high impact polystyrene.

14. The laminated structure according to claim 10, wherein the intermediate layer is a two-layer structure having a first resin layer on the side of the oriented resin layer, and a second resin layer on the side of the heat sealant layer, the first resin layer is formed of an ethylene-α•olefin copolymer of a density in the range of 0.915 to 0.940 g/cm$^3$, and the second layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 30 parts by weight of hydrogenated styrene-butadiene block copolymer of 10 to 50% by weight of styrene and 90 to 50% by weight of butadiene.

15. The laminated structure according to claim 10, wherein the intermediate layer is a two-layer structure having a first resin layer on the side of the oriented resin layer, and a second resin layer on the side of the heat sealant layer, the first resin layer is formed of an ethylene-α•olefin copolymer of a density in the range of 0.915 to 0.940 g/cm$^3$, and the second layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 50 parts by weight of a high impact polystyrene.

16. The laminated structure according to claim 10, wherein the intermediate layer is a two-layer structure having a first resin layer on the side of the oriented resin layer, and a second resin layer on the side of the heat sealant layer, the first resin layer is formed of an ethylene-α•olefin copolymer of a density in the range of 0.915 to 0.940 g/cm$^3$, and the second layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, 0 to 30 parts by weight of a hydrogenated styrene-butadiene block copolymer of 10 to 50% by weight of styrene and 90 to 50% by weight of butadiene, and 0 to 50 parts by weight of a high impact polystyrene.

17. The laminated structure according to claim 10, wherein the intermediate layer is a three-layer structure having a first resin layer on the side of the oriented resin layer, a second resin layer and a third resin layer on the side of the heat sealant layer, the first resin layer is formed of an ethylene-α•olefin copolymer of a density in the range of 0.915 to 0.940 g/cm$^3$, the second layer is formed of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and the third resin layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 30 parts by weight of hydrogenated styrene-butadiene block copolymer of 10 to 50% by weight of styrene and 90 to 50% by weight of butadiene.

18. The laminated structure according to claim 10, wherein the intermediate layer is a three-layer structure having a first resin layer on the side of the oriented resin layer, a second resin layer and a third resin layer on the side of the heat sealant layer, the first resin layer is formed of an ethylene-α•olefin copolymer of a density in the range of 0.915 to 0.940 g/cm$^3$, the second layer is formed of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and the third resin layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and 0 to 50 parts by weight of high impact polystyrene.

19. The laminated structure according to claim 10, wherein the intermediate layer is a three-layer structure having a first resin layer on the side of the oriented resin layer, a second resin layer and a third resin layer on the side of the heat sealant layer, the first resin layer is formed of an ethylene-α•olefin copolymer of a density in the range of 0.915 to 0.940 g/cm$^3$, the second layer is formed of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and the third resin layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, 0 to 30 parts by weight of hydrogenated styrene-butadiene copolymer of 10 to 50% by weight of styrene and 90 to 50% by weight of butadiene, and 0 to 50 parts by weight of high impact polystyrene.

20. The laminated structure according to claim 3, wherein intermediate layer is formed of a resin composition containing 10 to 90 parts by weight of the ethylene-α•olefin copolymer of a density in the range of 0.915 to 0.940 g/cm$^3$, and 90 to 10 parts by weight of styrene-butadiene copolymer of 50 to 90% by weight of styrene and 50 to 10% by weight of butadiene.

21. The laminated structure according to claim 3, wherein the intermediate layer is formed of a resin composition containing 10 to 90 parts by weight of the ethylene-α•olefin copolymer of a density in the range of 0.915 to 0.940 g/cm$^3$, and 90 to 10 parts by weight of hydrogenated styrene-butadiene copolymer of 10 to 50% by weight of styrene and 90 to 50% by weight of butadiene.

22. The laminated structure according to claim 3, wherein the intermediate layer is formed of a linear saturated polyester resin having a glass transition point of 50° C. or above.

23. The laminated structure according to claim 1, wherein the heat sealant layer is formed of a material containing at least a polyester resin, a polyurethane resin, a vinyl chloride-vinyl acetate copolymer, an acrylic resin or an ethylene-vinyl acetate copolymer.

24. The laminated structure according to claim 1, wherein the heat sealant layer is formed of a material containing 100 parts by weight of a resin and 1 to 200 parts by weight of particles of an inorganic substance.

25. The laminated structure according to claim 24, wherein the inorganic substance is at least a member selected from the group consisting of $SiO_2$, $Al_2O_3$, $TiO_2$, $Fe_2O_3$, AnO, $SnO_2$, $CeO_2$, NiO, PbO, $S_2Cl_2$, $SnCl_2$, $ZnCl_2$, $FeCl_2$, $CaCO_3$, $MgCO_3$, $B_2O_3$, hydrate aluminum silicate, aluminum silicate, magnesium silicate, calcium silicate, barium sulfate, lead sulfate, strontium sulfate and aluminum hydroxide.

26. The laminated structure according to claim 1, wherein the heat sealant layer is formed of a material containing 100 parts by weight of a resin and 1 to 200 parts by weight of particles or spherical beads of at least one of acrylic resins, polyolefin resins, polyethylene resins and polyester resins.

27. The laminated structure according to claim 1, wherein the antistatic layer has a surface resistivity in the range of $10^5$ to $10^{12}$ Ω/□ and a 99% static decay time of 2 sec or below.

28. The laminated structure according to claim 2, wherein the oriented resin layer is coated with an antireflection film.

29. The laminated structure according to claim 28, wherein an antistatic layer is sandwiched between the oriented resin layer and the antireflection film.

30. The laminated structure according to claim 2, wherein the oriented resin layer is coated with an antistatic film.

31. The laminated structure according to claim 30, wherein an antireflection layer is sandwiched between the oriented resin layer and the antistatic film.

32. A laminated structure comprising: a heat-resistant base layer, an adhesive layer, an intermediate layer and a heat sealant layer, said heat-resistant base layer, adhesive layer, intermediate layer and heat sealant layer being superposed in that order wherein said laminated structure has an initial impact strength P in the range of 5 to 20 g as measured by a loop stiffness test, and a stiffness f not higher than the initial impact strength P and meeting an expression: f=−at+b, where a and b are constants, t is time elapsed after the start of stiffness measurement (t≧3 min) and 0≦a≦0.1.

33. The laminated structure according to claim 32, wherein the adhesive layer is formed of a two-part adhesive having a principal component and a hardening agent, and the mixing ratio between the principal component and the hardening agent is in the range of 100:10 to 100:70.

34. The laminated structure according to claim 33, wherein the principal component is at least one of polyester resins, polyether resins, urethane resins, urethane denatured polyester resins, urethane polyether resins, modified ether polyester resins, vinyl copolymers, vinyl acetate resins, acrylic copolymers and epoxy resins, and the hardening agent is at least one of isocyanates, amines and polythiols.

35. The laminated structure according to claim 32, wherein the thickness of the adhesive layer is in the range of 5 to 80 µm.

36. The laminated structure according to claim 32, wherein the heat-resistant layer is a multilayer structure consisting of at least two layers.

37. The laminated structure according to claim 32, wherein the thickness of the heat-resistant layer is in the range of 12 to 50 µm.

38. The laminated structure according to claim 32, wherein a surface of the heat sealant layer opposite a surface of the same coated with the intermediate layer is coated with an antistatic layer.

39. The laminated structure according to claim 32, wherein the intermediate layer is a three-layer structure having a first resin layer on the side of the heat-resistant base layer, a second resin layer and a third resin layer on the side of the heat sealant layer, the first resin layer is formed of an ethylene-α•olefin copolymer of a density in the range of 0.915 to 0.940 g/cm$^3$, the second layer is formed of a resin composition containing 10 to 90% by weight of an ethylene-α•olefin copolymer of a density in the range of 0.915 to 0.940 g/cm$^3$ and 90 to 10% by weight of a styrene-butadiene block copolymer of 50 to 90% by weight of styrene and 50 to 10% by weight of butadiene, and the third resin layer is formed of a resin composition containing 100 parts by weight of a resin composition containing 10 to 90% by weight of an ethylene-α•olefin copolymer of a density in the range of 0.915 to 0.940 g/cm$^3$ and 90 to 10% by weight of a styrene-butadiene block copolymer of 10 to 50% by weight of styrene and 90 to 50% by weight of butadiene, and 0 to 30 parts by weight of hydrogenated styrene-butadiene block copolymer of 10 to 50% by weight of styrene and 90 to 50% by weight of butadiene.

40. The laminated structure according to claim 32, wherein at least one of the heat-resistant base layer, the adhesive layer, the intermediate layer, and the heat sealant layer of the laminated structure is formed of a material containing 100 parts by weight of a resin and 1 to 300 parts by weight of particles of an inorganic substance.

41. The laminated structure according to claim 40, wherein, the inorganic substance is at least $SiO_2$, $Al_2O_3$, $TiO_2$, $Fe_2O_3$, AnO, $SnO_2$, $CeO_2$, NiO, PbO, $S_2Cl_2$, $SnCl_2$, $ZnCl_2$, $FeCl_2$, $CaCO_3$, $MgCo_3$, $B_2O_3$, hydrate aluminum silicate, aluminum silicate, magnesium silicate, calcium silicate, barium sulfate, lead sulfate, strontium sulfate or aluminum hydroxide.

42. The laminated structure according to claim 32, wherein at least one of the component layers of the laminated structure is formed of a material containing 100 parts by weight of a resin and 1 to 300 parts by weight of particles or spherical beads of an organic substance.

43. A covering structure formed by sequentially superposing and uniting together a composite base sheet formed by superposing at least two oriented films and uniting the superposed oriented films with an additional adhesive layer, an intermediate layer, a heat sealant layer, and an antistatic layer formed of a material containing, as a principal component, a bisammonium organic sulfur semiconductor, the composite base sheet, the intermediate layer, the heat sealant layer and the antistatic layer being superposed in that order.

44. The covering structure according to claim 43, wherein the additional adhesive layer bonding together the oriented films is a polyester, a polyether, a urethane resin, an ethylene-vinyl acetate resin, an acrylic resin, an epoxy resin or a substance obtained by denaturing any one of the polyester, the polyether, the urethane resin, the ethylene-vinyl acetate resin, the acrylic resin and the epoxy resin.

45. The covering structure according to claim 43, wherein the antistatic layer has a surface resistivity in the range of $10^5$ to $10^{12}$ Ω/□ and a 99% static decay time of 2 sec or below.

46. The covering structure according to claim 43, wherein the covering structure has a light transmissivity of 75% or above and a haziness of 50% or below.

47. A covering structure capable of being heat-sealed to a carrier tape, comprising: a biaxially oriented film, an adhesive layer, an intermediate layer, a heat sealant layer, and an antistatic layer of a bisammonium organic sulfur semiconductor; wherein the biaxially oriented film, the adhesive layer, the intermediate layer, the heat sealant layer, and the antistatic layer are superposed in that order.

48. The covering structure according to claim 47, wherein the adhesive layer sandwiched between the biaxially oriented film and the intermediate layer is a two-part adhesive containing, as a principal component, at least one of polyester resins, polyether resins, urethane resins, ethylene-vinyl acetate resins, acrylic resins, epoxy resin urethane polyether resins, and substances obtained by modifying the polyester resins, the polyether resins, the urethane resins, the ethylene-vinyl acetate resins, the acrylic resins and the epoxy resin, and, as a hardening agent, one of isocyanates and amines, the mixing ratio between the principal component and the hardening agent of the two-part adhesive is in the range of 100:10 to 100:70, an thickness of the adhesive layer is in the range of 5 to 80 μm.

49. The covering structure according to claim 47, the thickness of the biaxially oriented film is in the range of 12 to 50 μm, and the thickness of the intermediate layer is in the range of 10 to 100 μm.

50. The covering structure according to claim 47, wherein the covering structure has an initial impact strength in the range of 4 to 50 g as measured by a loop stiffness test method, and a stiffness f not higher than the initial impact strength P and meeting an expression: f=−at+b, where a and b are constants, t is time (variable), $0 \leq a \leq 0.5$, and $4 \leq b \leq 50$.

51. The covering structure according to claim 47, wherein the difference between a maximum peel strength and a minimum peel strength of the covering structure heat-sealed to a carrier tape is 30 g or below.

52. The covering structure according to claim 47, wherein the antistatic layer has a surface resistivity in the range of $10^5$ to $10^{12}$ Ω/□ and a 99% static decay time of 2 sec or below.

53. The covering structure according to claim 47, wherein the covering structure has a light transmissivity of 75% or above and a haziness of 50% or below.

* * * * *